US011197112B2

(12) United States Patent
Downing et al.

(10) Patent No.: US 11,197,112 B2
(45) Date of Patent: Dec. 7, 2021

(54) VALIDATION OF AUDIO CALIBRATION USING MULTI-DIMENSIONAL MOTION CHECK

(71) Applicant: Sonos, Inc., Santa Barbara, CA (US)

(72) Inventors: Jonathan Downing, North Hampton, MA (US); Timothy Sheen, Brighton, MA (US); Daniel Valente, Santa Barbara, CA (US)

(73) Assignee: Sonos, Inc., Santa Barbara, CA (US)

( * ) Notice: Subject to any disclaimer, the term of this patent is extended or adjusted under 35 U.S.C. 154(b) by 242 days.

(21) Appl. No.: 16/570,679

(22) Filed: Sep. 13, 2019

(65) Prior Publication Data

US 2020/0008000 A1 Jan. 2, 2020

Related U.S. Application Data

(63) Continuation of application No. 15/480,265, filed on Apr. 5, 2017, now Pat. No. 9,992,597, which is a
(Continued)

(51) Int. Cl.
*H04R 29/00* (2006.01)
*H04R 3/04* (2006.01)
(Continued)

(52) U.S. Cl.
CPC .......... *H04R 29/007* (2013.01); *G06F 3/165* (2013.01); *G10L 25/06* (2013.01); *H03G 5/16* (2013.01);
(Continued)

(58) Field of Classification Search
CPC ...... H04R 29/007; H04R 1/32; H04R 29/008; H04R 27/00; H04R 29/001;
(Continued)

(56) References Cited

U.S. PATENT DOCUMENTS 4,306,113 A 12/1981 Morton
4,342,104 A 7/1982 Jack
(Continued)

FOREIGN PATENT DOCUMENTS

CN 1369188 A 9/2002
CN 1447624 A 10/2003
(Continued)

OTHER PUBLICATIONS

Notice of Allowance dated Feb. 21, 2018, issued in connection with U.S. Appl. No. 15/005,853, filed Jan. 25, 2016, 5 pages.
(Continued)

*Primary Examiner* — Disler Paul
(74) *Attorney, Agent, or Firm* — Akerman LLP

(57) ABSTRACT

Examples described herein involve validating motion of a microphone during calibration of a playback device. An example implementation involves a mobile device detecting, via one or more microphones, audio signals emitted from one or more playback devices as part of a calibration process. After the one or more playback devices emit the audio signals, the mobile device determines whether the detected audio signals indicate that sufficient horizontal translation of the mobile device occurred during the calibration process. When the detected audio signals indicate that insufficient horizontal translation occurred, the mobile device displays a prompt to move the mobile device more while the one or more playback devices emit one or more additional audio signals as part of the calibration process. When the detected audio signals indicate that sufficient horizontal translation occurred, the mobile device calibrates the one or more playback devices with a calibration based on the detected audio signals.

20 Claims, 11 Drawing Sheets

Related U.S. Application Data continuation of application No. 15/480,265, filed on Apr. 5, 2017, now Pat. No. 9,992,597, which is a continuation of application No. 14/864,506, filed on Sep. 24, 2015, now Pat. No. 9,693,165.

(60) Provisional application No. 62/220,176, filed on Sep. 17, 2015.

(51) Int. Cl.
| | |
|---|---|
| *G06F 3/16* | (2006.01) |
| *G10L 25/06* | (2013.01) |
| *H04R 1/32* | (2006.01) |
| *H03G 5/16* | (2006.01) |
| *H04S 7/00* | (2006.01) |
| *H04R 27/00* | (2006.01) |

(52) U.S. Cl.
CPC ............... *H04R 1/32* (2013.01); *H04R 3/04* (2013.01); *H04R 29/008* (2013.01); *H04S 7/303* (2013.01); *H03G 5/165* (2013.01); *H04R 27/00* (2013.01); *H04R 29/001* (2013.01); *H04R 2227/003* (2013.01); *H04R 2227/005* (2013.01); *H04R 2460/07* (2013.01); *H04S 7/301* (2013.01)

(58) Field of Classification Search
CPC ........ H04R 2227/003; H04R 2227/005; H04R 2460/07; H04S 7/301; H04S 3/002; H04S 2400/13
USPC ...................................... 381/56–59, 103–109
See application file for complete search history.

(56) References Cited

U.S. PATENT DOCUMENTS

| | | |
|---|---|---|
| 4,504,704 A | 3/1985 | Ohyaba et al. |
| 4,592,088 A | 5/1986 | Shimada |
| 4,628,530 A | 12/1986 | Op et al. |
| 4,631,749 A | 12/1986 | Rapaich |
| 4,694,484 A | 9/1987 | Atkinson et al. |
| 4,773,094 A | 9/1988 | Dolby |
| 4,995,778 A | 2/1991 | Bruessel |
| 5,218,710 A | 6/1993 | Yamaki et al. |
| 5,255,326 A | 10/1993 | Stevenson |
| 5,323,257 A | 6/1994 | Abe et al. |
| 5,386,478 A | 1/1995 | Plunkett |
| 5,440,644 A | 8/1995 | Farinelli et al. |
| 5,553,147 A | 9/1996 | Pineau |
| 5,581,621 A | 12/1996 | Koyama et al. |
| 5,754,774 A | 5/1998 | Bittinger et al. |
| 5,757,927 A | 5/1998 | Gerzon et al. |
| 5,761,320 A | 6/1998 | Farinelli et al. |
| 5,910,991 A | 6/1999 | Farrar |
| 5,923,902 A | 7/1999 | Inagaki |
| 5,939,656 A | 8/1999 | Suda |
| 6,018,376 A | 1/2000 | Nakatani |
| 6,032,202 A | 2/2000 | Lea et al. |
| 6,072,879 A | 6/2000 | Ouchi et al. |
| 6,111,957 A | 8/2000 | Thomasson |
| 6,256,554 B1 | 7/2001 | DiLorenzo |
| 6,363,155 B1 | 3/2002 | Horbach |
| 6,404,811 B1 | 6/2002 | Cvetko et al. |
| 6,469,633 B1 | 10/2002 | Wachter et al. |
| 6,522,886 B1 | 2/2003 | Youngs et al. |
| 6,573,067 B1 | 6/2003 | Dib-Hajj et al. |
| 6,611,537 B1 | 8/2003 | Edens et al. |
| 6,631,410 B1 | 10/2003 | Kowalski et al. |
| 6,639,989 B1 | 10/2003 | Zacharov et al. |
| 6,643,744 B1 | 11/2003 | Cheng |
| 6,704,421 B1 | 3/2004 | Kitamura |
| 6,721,428 B1 | 4/2004 | Allred et al. |
| 6,731,760 B2 | 5/2004 | Pedersen |
| 6,757,517 B2 | 6/2004 | Chang et al. |
| 6,760,451 B1 | 7/2004 | Craven et al. |
| 6,766,025 B1 | 7/2004 | Levy et al. |
| 6,778,869 B2 | 8/2004 | Champion |
| 6,798,889 B1 | 9/2004 | Dicker et al. |
| 6,862,440 B2 | 3/2005 | Sampath |
| 6,916,980 B2 | 7/2005 | Ishida et al. |
| 6,931,134 B1 | 8/2005 | Waller, Jr. et al. |
| 6,985,694 B1 | 1/2006 | De Bonet et al. |
| 6,990,211 B2 | 1/2006 | Parker |
| 7,031,476 B1 | 4/2006 | Chrisop et al. |
| 7,039,212 B2 | 5/2006 | Poling et al. |
| 7,058,186 B2 | 6/2006 | Tanaka |
| 7,072,477 B1 | 7/2006 | Kincaid |
| 7,092,537 B1 | 8/2006 | Allred et al. |
| 7,103,187 B1 | 9/2006 | Neuman |
| 7,130,608 B2 | 10/2006 | Hollstrom et al. |
| 7,130,616 B2 | 10/2006 | Janik |
| 7,143,939 B2 | 12/2006 | Henzerling |
| 7,187,947 B1 | 3/2007 | White et al. |
| 7,236,773 B2 | 6/2007 | Thomas |
| 7,289,637 B2 | 10/2007 | Montag et al. |
| 7,295,548 B2 | 11/2007 | Blank et al. |
| 7,312,785 B2 | 12/2007 | Tsuk et al. |
| 7,391,791 B2 | 6/2008 | Balassanian et al. |
| 7,477,751 B2 | 1/2009 | Lyon et al. |
| 7,483,538 B2 | 1/2009 | McCarty et al. |
| 7,483,540 B2 | 1/2009 | Rabinowitz et al. |
| 7,489,784 B2 | 2/2009 | Yoshino |
| 7,490,044 B2 | 2/2009 | Kulkarni |
| 7,492,909 B2 | 2/2009 | Carter et al. |
| 7,519,188 B2 | 4/2009 | Berardi et al. |
| 7,529,377 B2 | 5/2009 | Nackvi et al. |
| 7,571,014 B1 | 8/2009 | Lambourne et al. |
| 7,590,772 B2 | 9/2009 | Marriott et al. |
| 7,630,500 B1 | 12/2009 | Beckman et al. |
| 7,630,501 B2 | 12/2009 | Blank et al. |
| 7,643,894 B2 | 1/2010 | Braithwaite et al. |
| 7,657,910 B1 | 2/2010 | McAulay et al. |
| 7,664,276 B2 | 2/2010 | McKee Cooper |
| 7,676,044 B2 | 3/2010 | Sasaki et al. |
| 7,689,305 B2 | 3/2010 | Kreifeldt et al. |
| 7,720,237 B2 | 5/2010 | Bharitkar et al. |
| 7,742,740 B2 | 6/2010 | Goldberg et al. |
| 7,769,183 B2 | 8/2010 | Bharitkar et al. |
| 7,796,068 B2 | 9/2010 | Raz et al. |
| 7,835,689 B2 | 11/2010 | Goldberg et al. |
| 7,853,341 B2 | 12/2010 | McCarty et al. |
| 7,876,903 B2 | 1/2011 | Sauk |
| 7,925,203 B2 | 4/2011 | Lane et al. |
| 7,949,140 B2 | 5/2011 | Kino |
| 7,949,707 B2 | 5/2011 | McDowall et al. |
| 7,961,893 B2 | 6/2011 | Kino |
| 7,970,922 B2 | 6/2011 | Svendsen |
| 7,987,294 B2 | 7/2011 | Bryce et al. |
| 8,005,228 B2 | 8/2011 | Bharitkar et al. |
| 8,014,423 B2 | 9/2011 | Thaler et al. |
| 8,045,721 B2 | 10/2011 | Burgan et al. |
| 8,045,952 B2 | 10/2011 | Qureshey et al. |
| 8,050,652 B2 | 11/2011 | Qureshey et al. |
| 8,063,698 B2 | 11/2011 | Howard |
| 8,074,253 B1 | 12/2011 | Nathan |
| 8,103,009 B2 | 1/2012 | McCarty et al. |
| 8,116,476 B2 | 2/2012 | Inohara |
| 8,126,156 B2 | 2/2012 | Corbett et al. |
| 8,126,172 B2 | 2/2012 | Horbach et al. |
| 8,131,390 B2 | 3/2012 | Braithwaite et al. |
| 8,139,774 B2 | 3/2012 | Berardi et al. |
| 8,144,883 B2 | 3/2012 | Pdersen et al. |
| 8,160,276 B2 | 4/2012 | Liao et al. |
| 8,160,281 B2 | 4/2012 | Kim et al. |
| 8,170,260 B2 | 5/2012 | Reining et al. |
| 8,175,292 B2 | 5/2012 | Aylward et al. |
| 8,175,297 B1 | 5/2012 | Ho et al. |
| 8,194,874 B2 | 6/2012 | Starobin et al. |
| 8,229,125 B2 | 7/2012 | Short |
| 8,233,632 B1 | 7/2012 | MacDonald et al. |
| 8,234,395 B2 | 7/2012 | Millington |
| 8,238,547 B2 | 8/2012 | Ohki et al. |

(56) References Cited

U.S. PATENT DOCUMENTS

| | | |
|---|---|---|
| 8,238,578 B2 | 8/2012 | Aylward |
| 8,243,961 B1 | 8/2012 | Morrill |
| 8,264,408 B2 | 9/2012 | Kainulainen et al. |
| 8,265,310 B2 | 9/2012 | Berardi et al. |
| 8,270,620 B2 | 9/2012 | Christensen et al. |
| 8,279,709 B2 | 10/2012 | Choisel et al. |
| 8,281,001 B2 | 10/2012 | Busam et al. |
| 8,290,185 B2 | 10/2012 | Kim |
| 8,291,349 B1 | 10/2012 | Park et al. |
| 8,300,845 B2 | 10/2012 | Zurek et al. |
| 8,306,235 B2 | 11/2012 | Mahowald |
| 8,325,931 B2 | 12/2012 | Howard et al. |
| 8,325,935 B2 | 12/2012 | Rutschman |
| 8,325,944 B1 | 12/2012 | Duwenhorst et al. |
| 8,331,585 B2 | 12/2012 | Hagen et al. |
| 8,332,414 B2 | 12/2012 | Nguyen et al. |
| 8,379,876 B2 | 2/2013 | Zhang |
| 8,391,501 B2 | 3/2013 | Khawand et al. |
| 8,392,505 B2 | 3/2013 | Haughay et al. |
| 8,401,202 B2 | 3/2013 | Brooking |
| 8,433,076 B2 | 4/2013 | Zurek et al. |
| 8,452,020 B2 | 5/2013 | Gregg et al. |
| 8,463,184 B2 | 6/2013 | Dua |
| 8,483,853 B1 | 7/2013 | Lambourne |
| 8,488,799 B2 | 7/2013 | Goldstein et al. |
| 8,503,669 B2 | 8/2013 | Mao |
| 8,527,876 B2 | 9/2013 | Wood et al. |
| 8,577,045 B2 | 11/2013 | Gibbs |
| 8,577,048 B2* | 11/2013 | Chaikin ............... H04R 29/001 381/59 |
| 8,600,075 B2 | 12/2013 | Lim |
| 8,620,006 B2 | 12/2013 | Berardi et al. |
| 8,682,002 B2 | 3/2014 | Wihardja et al. |
| 8,731,206 B1 | 5/2014 | Park |
| 8,755,538 B2 | 6/2014 | Kwon |
| 8,798,280 B2 | 8/2014 | Goldberg et al. |
| 8,819,554 B2 | 8/2014 | Basso et al. |
| 8,831,244 B2 | 9/2014 | Apfel |
| 8,855,319 B2 | 10/2014 | Liu et al. |
| 8,862,273 B2 | 10/2014 | Karr |
| 8,879,761 B2 | 11/2014 | Johnson et al. |
| 8,903,526 B2 | 12/2014 | Beckhardt et al. |
| 8,914,559 B2 | 12/2014 | Kalayjian et al. |
| 8,930,005 B2 | 1/2015 | Reimann et al. |
| 8,934,647 B2 | 1/2015 | Joyce et al. |
| 8,934,655 B2 | 1/2015 | Breen et al. |
| 8,942,252 B2 | 1/2015 | Balassanian et al. |
| 8,965,033 B2 | 2/2015 | Wiggins |
| 8,965,546 B2 | 2/2015 | Visser et al. |
| 8,977,974 B2 | 3/2015 | Kraut |
| 8,984,442 B2 | 3/2015 | Pirnack et al. |
| 8,989,406 B2 | 3/2015 | Wong et al. |
| 8,995,687 B2 | 3/2015 | Marino, Jr. et al. |
| 8,995,688 B1 | 3/2015 | Chemtob et al. |
| 8,996,370 B2 | 3/2015 | Ansell |
| 9,020,153 B2 | 4/2015 | Britt, Jr. |
| 9,021,153 B2 | 4/2015 | Lu |
| 9,065,929 B2 | 6/2015 | Chen et al. |
| 9,084,058 B2 | 7/2015 | Reilly et al. |
| 9,100,766 B2 | 8/2015 | Soulodre et al. |
| 9,106,192 B2 | 8/2015 | Sheen et al. |
| 9,179,233 B2 | 11/2015 | Kang |
| 9,215,545 B2 | 12/2015 | Dublin et al. |
| 9,219,460 B2 | 12/2015 | Bush |
| 9,231,545 B2 | 1/2016 | Agustin et al. |
| 9,264,839 B2 | 2/2016 | Oishi et al. |
| 9,286,384 B2 | 3/2016 | Kuper et al. |
| 9,288,597 B2 | 3/2016 | Carlsson et al. |
| 9,300,266 B2 | 3/2016 | Grokop |
| 9,307,340 B2 | 4/2016 | Seefeldt |
| 9,319,816 B1 | 4/2016 | Narayanan |
| 9,398,392 B2 | 7/2016 | Ridihalgh et al. |
| 9,451,377 B2 | 9/2016 | Massey et al. |
| 9,462,399 B2 | 10/2016 | Bharitkar et al. |
| 9,467,779 B2 | 10/2016 | Iyengar et al. |
| 9,472,201 B1 | 10/2016 | Sleator |
| 9,473,207 B2 | 10/2016 | Mccormack et al. |
| 9,489,948 B1 | 11/2016 | Chu et al. |
| 9,524,098 B2 | 12/2016 | Griffiths et al. |
| 9,538,305 B2 | 1/2017 | Lehnert et al. |
| 9,538,308 B2 | 1/2017 | Isaac et al. |
| 9,544,701 B1 | 1/2017 | Rappoport |
| 9,560,449 B2 | 1/2017 | Carlsson et al. |
| 9,560,460 B2 | 1/2017 | Chaikin et al. |
| 9,584,915 B2 | 2/2017 | Fullam et al. |
| 9,609,383 B1 | 3/2017 | Hirst |
| 9,615,171 B1 | 4/2017 | O'Neill et al. |
| 9,648,422 B2 | 5/2017 | Sheen et al. |
| 9,674,625 B2 | 6/2017 | Joel et al. |
| 9,678,708 B2 | 6/2017 | Bierbower et al. |
| 9,686,625 B2 | 6/2017 | Patel |
| 9,689,960 B1 | 6/2017 | Barton et al. |
| 9,690,271 B2 | 6/2017 | Sheen et al. |
| 9,690,539 B2 | 6/2017 | Sheen et al. |
| 9,699,582 B2 | 7/2017 | Sheerin et al. |
| 9,706,323 B2 | 7/2017 | Sheen et al. |
| 9,715,365 B2 | 7/2017 | Kusano et al. |
| 9,723,420 B2 | 8/2017 | Family et al. |
| 9,729,984 B2 | 8/2017 | Tan et al. |
| 9,736,584 B2 | 8/2017 | Sheen et al. |
| 9,743,207 B1 | 8/2017 | Hartung |
| 9,743,208 B2 | 8/2017 | Oishi et al. |
| 9,749,763 B2 | 8/2017 | Sheen |
| 9,763,018 B1 | 9/2017 | McPherson et al. |
| 9,781,532 B2 | 10/2017 | Sheen |
| 9,788,113 B2 | 10/2017 | Wilberding et al. |
| 9,794,722 B2 | 10/2017 | Petrov |
| 9,807,536 B2 | 10/2017 | Liu et al. |
| 9,860,662 B2 | 1/2018 | Jarvis et al. |
| 9,864,574 B2 | 1/2018 | Hartung et al. |
| 9,910,634 B2 | 3/2018 | Sheen |
| 9,913,056 B2 | 3/2018 | Master et al. |
| 9,916,126 B2 | 3/2018 | Lang |
| 9,952,825 B2 | 4/2018 | Sheen |
| 9,984,703 B2 | 5/2018 | Ur et al. |
| 10,045,142 B2 | 8/2018 | McPherson et al. |
| 10,125,006 B2 | 11/2018 | Jacobsen et al. |
| 10,127,006 B2 | 11/2018 | Sheen |
| 10,154,359 B2 | 12/2018 | Sheen |
| 10,206,052 B2 | 2/2019 | Perianu |
| 10,299,061 B1 | 5/2019 | Sheen |
| 10,402,154 B2 | 9/2019 | Hartung et al. |
| 2001/0038702 A1 | 11/2001 | Lavoie et al. |
| 2001/0042107 A1 | 11/2001 | Palm |
| 2001/0043592 A1 | 11/2001 | Jimenez et al. |
| 2001/0053228 A1 | 12/2001 | Jones |
| 2002/0022453 A1 | 2/2002 | Balog et al. |
| 2002/0026442 A1 | 2/2002 | Lipscomb et al. |
| 2002/0078161 A1 | 6/2002 | Cheng |
| 2002/0089529 A1 | 7/2002 | Robbin |
| 2002/0124097 A1 | 9/2002 | Isely et al. |
| 2002/0126852 A1 | 9/2002 | Kashani et al. |
| 2002/0136414 A1 | 9/2002 | Jordan et al. |
| 2002/0146136 A1 | 10/2002 | Carter et al. |
| 2003/0002689 A1 | 1/2003 | Folio |
| 2003/0031334 A1 | 2/2003 | Layton et al. |
| 2003/0081115 A1 | 5/2003 | Curry et al. |
| 2003/0157951 A1 | 8/2003 | Hasty |
| 2003/0159569 A1 | 8/2003 | Ohta |
| 2003/0161479 A1 | 8/2003 | Yang et al. |
| 2003/0161492 A1 | 8/2003 | Miller et al. |
| 2003/0179891 A1* | 9/2003 | Rabinowitz ............... H04R 3/12 381/103 |
| 2003/0235311 A1 | 12/2003 | Grancea et al. |
| 2004/0024478 A1 | 2/2004 | Hans et al. |
| 2004/0114771 A1 | 6/2004 | Vaughan et al. |
| 2004/0131338 A1 | 7/2004 | Asada et al. |
| 2004/0237750 A1 | 12/2004 | Smith et al. |
| 2005/0031143 A1 | 2/2005 | Devantier et al. |
| 2005/0063554 A1 | 3/2005 | Devantier et al. |
| 2005/0147261 A1 | 7/2005 | Yeh |
| 2005/0157885 A1 | 7/2005 | Olney et al. |
| 2005/0276425 A1 | 12/2005 | Forrester et al. |
| 2006/0008256 A1 | 1/2006 | Khedouri et al. |

(56) References Cited

U.S. PATENT DOCUMENTS

| | | |
|---|---|---|
| 2006/0026521 A1 | 2/2006 | Hotelling et al. |
| 2006/0032357 A1 | 2/2006 | Roovers et al. |
| 2006/0153391 A1 | 7/2006 | Hooley et al. |
| 2006/0195480 A1 | 8/2006 | Spiegelman et al. |
| 2006/0225097 A1 | 10/2006 | Lawrence-Apfelbaum |
| 2007/0003067 A1 | 1/2007 | Gierl et al. |
| 2007/0025559 A1 | 2/2007 | Mihelich et al. |
| 2007/0032895 A1 | 2/2007 | Nackvi et al. |
| 2007/0038999 A1 | 2/2007 | Millington |
| 2007/0086597 A1 | 4/2007 | Kino |
| 2007/0116254 A1 | 5/2007 | Looney et al. |
| 2007/0121955 A1 | 5/2007 | Johnston et al. |
| 2007/0142944 A1 | 6/2007 | Goldberg et al. |
| 2008/0002839 A1 | 1/2008 | Eng |
| 2008/0014989 A1 | 1/2008 | Sandegard et al. |
| 2008/0065247 A1 | 3/2008 | Igoe |
| 2008/0069378 A1 | 3/2008 | Rabinowitz et al. |
| 2008/0077261 A1 | 3/2008 | Baudino et al. |
| 2008/0098027 A1 | 4/2008 | Aarts |
| 2008/0136623 A1 | 6/2008 | Calvarese |
| 2008/0144864 A1 | 6/2008 | Huon et al. |
| 2008/0175411 A1 | 7/2008 | Greve |
| 2008/0214160 A1 | 9/2008 | Jonsson |
| 2008/0232603 A1 | 9/2008 | Soulodre et al. |
| 2008/0266385 A1 | 10/2008 | Smith et al. |
| 2008/0281523 A1 | 11/2008 | Dahl et al. |
| 2009/0003613 A1 | 1/2009 | Christensen et al. |
| 2009/0024662 A1 | 1/2009 | Park et al. |
| 2009/0047993 A1 | 2/2009 | Vasa |
| 2009/0063274 A1 | 3/2009 | Dublin, III et al. |
| 2009/0110218 A1 | 4/2009 | Swain |
| 2009/0138507 A1 | 5/2009 | Burckart et al. |
| 2009/0147134 A1 | 6/2009 | Iwamatsu |
| 2009/0175476 A1 | 7/2009 | Bottum |
| 2009/0180632 A1 | 7/2009 | Goldberg et al. |
| 2009/0196428 A1 | 8/2009 | Kim |
| 2009/0202082 A1 | 8/2009 | Bharitkar et al. |
| 2009/0252481 A1 | 10/2009 | Ekstrand |
| 2009/0285404 A1 | 11/2009 | Hsu et al. |
| 2009/0304194 A1 | 12/2009 | Eggleston et al. |
| 2009/0304205 A1 | 12/2009 | Hardacker et al. |
| 2009/0316923 A1 | 12/2009 | Tashev et al. |
| 2010/0013550 A1 | 1/2010 | Tanaka |
| 2010/0095332 A1 | 4/2010 | Gran et al. |
| 2010/0104114 A1 | 4/2010 | Chapman |
| 2010/0128902 A1 | 5/2010 | Liu et al. |
| 2010/0135501 A1 | 6/2010 | Corbett et al. |
| 2010/0142735 A1 | 6/2010 | Yoon et al. |
| 2010/0146445 A1 | 6/2010 | Kraut |
| 2010/0162117 A1 | 6/2010 | Basso et al. |
| 2010/0189203 A1 | 7/2010 | Wilhelmsson et al. |
| 2010/0195846 A1 | 8/2010 | Yokoyama |
| 2010/0272270 A1 | 10/2010 | Chaikin et al. |
| 2010/0296659 A1 | 11/2010 | Tanaka |
| 2010/0303248 A1 | 12/2010 | Tawada |
| 2010/0303250 A1 | 12/2010 | Goldberg et al. |
| 2010/0323793 A1 | 12/2010 | Andall |
| 2011/0007904 A1 | 1/2011 | Tomoda et al. |
| 2011/0007905 A1 | 1/2011 | Sato et al. |
| 2011/0029111 A1 | 2/2011 | Sabin et al. |
| 2011/0087842 A1 | 4/2011 | Lu et al. |
| 2011/0091055 A1 | 4/2011 | Leblanc |
| 2011/0135103 A1 | 6/2011 | Sun et al. |
| 2011/0150228 A1 | 6/2011 | Yoon et al. |
| 2011/0150230 A1 | 6/2011 | Tanaka |
| 2011/0150247 A1 | 6/2011 | Oliveras |
| 2011/0170710 A1 | 7/2011 | Son |
| 2011/0234480 A1 | 9/2011 | Fino et al. |
| 2011/0235808 A1 | 9/2011 | Kon |
| 2011/0268281 A1 | 11/2011 | Florencio et al. |
| 2011/0293123 A1 | 12/2011 | Neumeyer et al. |
| 2012/0032928 A1 | 2/2012 | Alberth et al. |
| 2012/0051558 A1 | 3/2012 | Kim et al. |
| 2012/0057724 A1 | 3/2012 | Rabinowitz et al. |
| 2012/0063615 A1 | 3/2012 | Crockett et al. |
| 2012/0093320 A1 | 4/2012 | Flaks et al. |
| 2012/0127831 A1 | 5/2012 | Gicklhorn et al. |
| 2012/0140936 A1 | 6/2012 | Bonnick et al. |
| 2012/0148075 A1 | 6/2012 | Goh et al. |
| 2012/0183156 A1 | 7/2012 | Schlessinger et al. |
| 2012/0184335 A1 | 7/2012 | Kim et al. |
| 2012/0213391 A1 | 8/2012 | Usami et al. |
| 2012/0215530 A1 | 8/2012 | Harsch et al. |
| 2012/0237037 A1 | 9/2012 | Ninan |
| 2012/0243697 A1 | 9/2012 | Frye et al. |
| 2012/0263325 A1 | 10/2012 | Freeman et al. |
| 2012/0268145 A1 | 10/2012 | Chandra et al. |
| 2012/0269356 A1 | 10/2012 | Sheerin et al. |
| 2012/0275613 A1 | 11/2012 | Soulodre et al. |
| 2012/0283593 A1 | 11/2012 | Searchfield et al. |
| 2012/0288124 A1 | 11/2012 | Fejzo et al. |
| 2013/0003981 A1 | 1/2013 | Lane |
| 2013/0010970 A1 | 1/2013 | Hegarty et al. |
| 2013/0019193 A1 | 1/2013 | Rhee et al. |
| 2013/0028443 A1 | 1/2013 | Pance et al. |
| 2013/0051572 A1 | 2/2013 | Goh et al. |
| 2013/0066453 A1 | 3/2013 | Seefeldt |
| 2013/0108055 A1 | 5/2013 | Hanna et al. |
| 2013/0129102 A1 | 5/2013 | Li et al. |
| 2013/0129122 A1 | 5/2013 | Johnson et al. |
| 2013/0166227 A1 | 6/2013 | Hermann et al. |
| 2013/0170647 A1 | 7/2013 | Reilly et al. |
| 2013/0179535 A1 | 7/2013 | Baalu et al. |
| 2013/0202131 A1 | 8/2013 | Kemmochi et al. |
| 2013/0211843 A1 | 8/2013 | Clarkson |
| 2013/0216071 A1 | 8/2013 | Maher et al. |
| 2013/0223642 A1 | 8/2013 | Warren et al. |
| 2013/0230175 A1 | 9/2013 | Bech et al. |
| 2013/0259254 A1 | 10/2013 | Xiang et al. |
| 2013/0279706 A1 | 10/2013 | Marti et al. |
| 2013/0305152 A1 | 11/2013 | Griffiths et al. |
| 2013/0315405 A1 | 11/2013 | Kanishima et al. |
| 2013/0329896 A1 | 12/2013 | Krishnaswamy et al. |
| 2013/0331970 A1 | 12/2013 | Beckhardt et al. |
| 2013/0346559 A1 | 12/2013 | Van Erven et al. |
| 2014/0003611 A1 | 1/2014 | Mohammad et al. |
| 2014/0003622 A1 | 1/2014 | Ikizyan et al. |
| 2014/0003623 A1 | 1/2014 | Lang |
| 2014/0003625 A1 | 1/2014 | Sheen et al. |
| 2014/0003626 A1 | 1/2014 | Holman et al. |
| 2014/0003635 A1 | 1/2014 | Mohammad et al. |
| 2014/0006587 A1 | 1/2014 | Kusano |
| 2014/0016784 A1 | 1/2014 | Sen et al. |
| 2014/0016786 A1 | 1/2014 | Sen |
| 2014/0016802 A1 | 1/2014 | Sen |
| 2014/0023196 A1 | 1/2014 | Kiang et al. |
| 2014/0029201 A1 | 1/2014 | Yang et al. |
| 2014/0032709 A1 | 1/2014 | Saussy et al. |
| 2014/0037097 A1 | 2/2014 | Labosco |
| 2014/0037107 A1 | 2/2014 | Marino, Jr. et al. |
| 2014/0052770 A1 | 2/2014 | Gran et al. |
| 2014/0064501 A1 | 3/2014 | Olsen et al. |
| 2014/0079242 A1 | 3/2014 | Nguyen et al. |
| 2014/0084014 A1 | 3/2014 | Sim et al. |
| 2014/0086423 A1 | 3/2014 | Domingo Yaguez et al. |
| 2014/0112481 A1 | 4/2014 | Li et al. |
| 2014/0119551 A1 | 5/2014 | Bharitkar et al. |
| 2014/0126730 A1 | 5/2014 | Crawley et al. |
| 2014/0161265 A1 | 6/2014 | Chaikin et al. |
| 2014/0169569 A1 | 6/2014 | Toivanen et al. |
| 2014/0180684 A1 | 6/2014 | Strub |
| 2014/0192986 A1 | 7/2014 | Lee et al. |
| 2014/0219456 A1 | 8/2014 | Morrell et al. |
| 2014/0219483 A1 | 8/2014 | Hong |
| 2014/0226823 A1 | 8/2014 | Sen et al. |
| 2014/0242913 A1 | 8/2014 | Pang |
| 2014/0267148 A1 | 9/2014 | Luna et al. |
| 2014/0270202 A1 | 9/2014 | Ivanov et al. |
| 2014/0270282 A1 | 9/2014 | Tammi et al. |
| 2014/0273859 A1 | 9/2014 | Luna et al. |
| 2014/0274212 A1 | 9/2014 | Zurek et al. |
| 2014/0279889 A1 | 9/2014 | Luna et al. |
| 2014/0285313 A1 | 9/2014 | Luna et al. |
| 2014/0286496 A1 | 9/2014 | Luna et al. |

(56) References Cited

U.S. PATENT DOCUMENTS

| | | |
|---|---|---|
| 2014/0294200 A1 | 10/2014 | Baumgarte et al. |
| 2014/0294201 A1 | 10/2014 | Johnson et al. |
| 2014/0310269 A1 | 10/2014 | Zhang et al. |
| 2014/0321670 A1 | 10/2014 | Nystrom et al. |
| 2014/0323036 A1 | 10/2014 | Daley et al. |
| 2014/0334644 A1 | 11/2014 | Selig et al. |
| 2014/0341399 A1 | 11/2014 | Dusse |
| 2014/0344689 A1 | 11/2014 | Scott et al. |
| 2014/0355768 A1 | 12/2014 | Sen et al. |
| 2014/0355794 A1 | 12/2014 | Morrell et al. |
| 2014/0364056 A1 | 12/2014 | Belk et al. |
| 2015/0011195 A1 | 1/2015 | Li |
| 2015/0016642 A1 | 1/2015 | Walsh et al. |
| 2015/0023509 A1 | 1/2015 | Devantier et al. |
| 2015/0031287 A1 | 1/2015 | Pang et al. |
| 2015/0032844 A1 | 1/2015 | Tarr et al. |
| 2015/0036847 A1 | 2/2015 | Donaldson |
| 2015/0036848 A1 | 2/2015 | Donaldson |
| 2015/0043736 A1 | 2/2015 | Olsen et al. |
| 2015/0063610 A1 | 3/2015 | Mossner |
| 2015/0078586 A1 | 3/2015 | Ang et al. |
| 2015/0078596 A1 | 3/2015 | Sprogis et al. |
| 2015/0100991 A1 | 4/2015 | Risberg et al. |
| 2015/0146886 A1 | 5/2015 | Baumgarte |
| 2015/0149943 A1 | 5/2015 | Nguyen et al. |
| 2015/0161360 A1 | 6/2015 | Paruchuri et al. |
| 2015/0195666 A1 | 7/2015 | Massey et al. |
| 2015/0201274 A1 | 7/2015 | Ellner et al. |
| 2015/0208184 A1 | 7/2015 | Tan et al. |
| 2015/0220558 A1 | 8/2015 | Snibbe et al. |
| 2015/0223002 A1 | 8/2015 | Mehta et al. |
| 2015/0229699 A1 | 8/2015 | Liu |
| 2015/0260754 A1 | 9/2015 | Perotti et al. |
| 2015/0264023 A1 | 9/2015 | Reno |
| 2015/0271616 A1 | 9/2015 | Kechichian et al. |
| 2015/0271620 A1 | 9/2015 | Lando et al. |
| 2015/0281866 A1 | 10/2015 | Williams et al. |
| 2015/0286360 A1 | 10/2015 | Wachter |
| 2015/0289064 A1 | 10/2015 | Jensen et al. |
| 2015/0358756 A1 | 12/2015 | Harma et al. |
| 2015/0382128 A1 | 12/2015 | Ridihalgh et al. |
| 2016/0007116 A1 | 1/2016 | Holman |
| 2016/0011846 A1 | 1/2016 | Sheen |
| 2016/0011850 A1 | 1/2016 | Sheen et al. |
| 2016/0014509 A1 | 1/2016 | Hansson et al. |
| 2016/0014510 A1 | 1/2016 | Sheen |
| 2016/0014511 A1 | 1/2016 | Sheen et al. |
| 2016/0014534 A1 | 1/2016 | Sheen |
| 2016/0014536 A1 | 1/2016 | Sheen |
| 2016/0021458 A1 | 1/2016 | Johnson et al. |
| 2016/0021473 A1 * | 1/2016 | Riggi ............... H04R 3/00 381/59 |
| 2016/0021481 A1 | 1/2016 | Johnson et al. |
| 2016/0027467 A1 | 1/2016 | Proud |
| 2016/0029142 A1 | 1/2016 | Isaac et al. |
| 2016/0035337 A1 | 2/2016 | Aggarwal et al. |
| 2016/0036881 A1 | 2/2016 | Tembey et al. |
| 2016/0037277 A1 | 2/2016 | Matsumoto et al. |
| 2016/0061597 A1 | 3/2016 | De et al. |
| 2016/0073210 A1 | 3/2016 | Sheen |
| 2016/0088438 A1 | 3/2016 | O'Keeffe |
| 2016/0119730 A1 | 4/2016 | Virtanen |
| 2016/0140969 A1 | 5/2016 | Srinivasan et al. |
| 2016/0165297 A1 | 6/2016 | Shaheer et al. |
| 2016/0192098 A1 | 6/2016 | Oishi et al. |
| 2016/0192099 A1 | 6/2016 | Oishi et al. |
| 2016/0212535 A1 | 7/2016 | Le et al. |
| 2016/0239255 A1 | 8/2016 | Chavez et al. |
| 2016/0254696 A1 | 9/2016 | Plumb et al. |
| 2016/0260140 A1 | 9/2016 | Shirley et al. |
| 2016/0309276 A1 | 10/2016 | Ridihalgh et al. |
| 2016/0330562 A1 * | 11/2016 | Crockett ............... G06F 3/162 |
| 2016/0353018 A1 | 12/2016 | Anderson et al. |
| 2016/0366517 A1 | 12/2016 | Chandran et al. |
| 2017/0026769 A1 | 1/2017 | Patel |
| 2017/0041724 A1 | 2/2017 | Master et al. |
| 2017/0069338 A1 | 3/2017 | Elliot et al. |
| 2017/0083279 A1 | 3/2017 | Sheen et al. |
| 2017/0086003 A1 | 3/2017 | Rabinowitz et al. |
| 2017/0105084 A1 | 4/2017 | Holman |
| 2017/0142532 A1 | 5/2017 | Pan |
| 2017/0207762 A1 | 7/2017 | Porter et al. |
| 2017/0223447 A1 | 8/2017 | Johnson et al. |
| 2017/0230772 A1 | 8/2017 | Johnson et al. |
| 2017/0257722 A1 | 9/2017 | Kerdranvat et al. |
| 2017/0280265 A1 | 9/2017 | Po |
| 2017/0303039 A1 | 10/2017 | Iyer et al. |
| 2017/0311108 A1 | 10/2017 | Patel et al. |
| 2017/0374482 A1 | 12/2017 | McPherson et al. |
| 2018/0122378 A1 | 5/2018 | Mixter et al. |
| 2018/0376268 A1 | 12/2018 | Kerdranvat et al. |
| 2019/0037328 A1 | 1/2019 | McPherson et al. |

FOREIGN PATENT DOCUMENTS

| | | |
|---|---|---|
| CN | 1622694 A | 6/2005 |
| CN | 1984507 A | 6/2007 |
| CN | 101032187 A | 9/2007 |
| CN | 101047777 A | 10/2007 |
| CN | 101366177 A | 2/2009 |
| CN | 101491116 A | 7/2009 |
| CN | 101681219 A | 3/2010 |
| CN | 101754087 A | 6/2010 |
| CN | 101800051 A | 8/2010 |
| CN | 102004823 A | 4/2011 |
| CN | 102318325 A | 1/2012 |
| CN | 102823277 A | 12/2012 |
| CN | 102893633 A | 1/2013 |
| CN | 103491397 A | 1/2014 |
| CN | 103811010 A | 5/2014 |
| CN | 103988523 A | 8/2014 |
| CN | 104219604 A | 12/2014 |
| CN | 104247461 A | 12/2014 |
| CN | 104284291 A | 1/2015 |
| CN | 104584061 A | 4/2015 |
| CN | 105163221 A | 12/2015 |
| EP | 0505949 A1 | 9/1992 |
| EP | 0772374 A2 | 5/1997 |
| EP | 1133896 B1 | 8/2002 |
| EP | 1349427 A2 | 10/2003 |
| EP | 1389853 A1 | 2/2004 |
| EP | 2043381 A2 | 4/2009 |
| EP | 1349427 B1 | 12/2009 |
| EP | 2161950 A2 | 3/2010 |
| EP | 2194471 A1 | 6/2010 |
| EP | 2197220 A2 | 6/2010 |
| EP | 2288178 A1 | 2/2011 |
| EP | 2429155 A1 | 3/2012 |
| EP | 1825713 B1 | 10/2012 |
| EP | 2613573 A1 | 7/2013 |
| EP | 2591617 B1 | 6/2014 |
| EP | 2747081 A1 | 6/2014 |
| EP | 2835989 A2 | 2/2015 |
| EP | 2860992 A1 | 4/2015 |
| EP | 2874413 A1 | 5/2015 |
| EP | 3128767 A2 | 2/2017 |
| EP | 2974382 B1 | 4/2017 |
| EP | 2986034 B1 | 5/2017 |
| EP | 3285502 A1 | 2/2018 |
| JP | H02280199 A | 11/1990 |
| JP | H05199593 A | 8/1993 |
| JP | H05211700 A | 8/1993 |
| JP | H06327089 A | 11/1994 |
| JP | H0723490 A | 1/1995 |
| JP | H1069280 A | 3/1998 |
| JP | H10307592 A | 11/1998 |
| JP | 2002502193 A | 1/2002 |
| JP | 2003143252 A | 5/2003 |
| JP | 2003304590 A | 10/2003 |
| JP | 2005086686 A | 3/2005 |
| JP | 2005538633 A | 12/2005 |
| JP | 2006017893 A | 1/2006 |
| JP | 2006180039 A | 7/2006 |
| JP | 2006340285 A | 12/2006 |

(56) References Cited

FOREIGN PATENT DOCUMENTS

| | | | |
|---|---|---|---|
| JP | 2007068125 | A | 3/2007 |
| JP | 2007271802 | A | 10/2007 |
| JP | 2008228133 | A | 9/2008 |
| JP | 2009188474 | A | 8/2009 |
| JP | 2010081124 | A | 4/2010 |
| JP | 2010141892 | A | 6/2010 |
| JP | 2011123376 | A | 6/2011 |
| JP | 2011130212 | A | 6/2011 |
| JP | 2011164166 | A | 8/2011 |
| JP | 2011217068 | A | 10/2011 |
| JP | 2013247456 | A | 12/2013 |
| JP | 2013253884 | A | 12/2013 |
| JP | 6356331 | B2 | 7/2018 |
| JP | 6567735 | B2 | 8/2019 |
| KR | 1020060116383 | | 11/2006 |
| KR | 1020080011831 | | 2/2008 |
| WO | 200153994 | | 7/2001 |
| WO | 0182650 | A2 | 11/2001 |
| WO | 200182650 | | 11/2001 |
| WO | 2003093950 | A2 | 11/2003 |
| WO | 2004066673 | A1 | 8/2004 |
| WO | 2007016465 | A2 | 2/2007 |
| WO | 2011139502 | A1 | 11/2011 |
| WO | 2013016500 | A1 | 1/2013 |
| WO | 2013126603 | A1 | 8/2013 |
| WO | 2014032709 | | 3/2014 |
| WO | 2014032709 | A1 | 3/2014 |
| WO | 2014036121 | A1 | 3/2014 |
| WO | 2015024881 | A1 | 2/2015 |
| WO | 2015108794 | A1 | 7/2015 |
| WO | 2015178950 | A1 | 11/2015 |
| WO | 2016040324 | A1 | 3/2016 |
| WO | 2017049169 | A1 | 3/2017 |

OTHER PUBLICATIONS

Notice of Allowance dated Jul. 21, 2017, issued in connection with U.S. Appl. No. 15/211,835, filed Jul. 15, 2016, 10 pages.
Notice of Allowance dated Jun. 21, 2019, issued in connection with U.S. Appl. No. 15/235,598, filed Aug. 12, 2016, 11 pages.
Notice of Allowance dated Oct. 21, 2019, issued in connection with U.S. Appl. No. 16/182,886, filed Nov. 7, 2018, 10 pages.
Notice of Allowance dated Jun. 22, 2017, issued in connection with U.S. Appl. No. 14/644,136, filed Mar. 10, 2015, 12 pages.
Notice of Allowance dated Aug. 23, 2018, issued in connection with U.S. Appl. No. 15/909,529, filed Mar. 1, 2018, 8 pages.
Notice of Allowance dated Jun. 23, 2016, issued in connection with U.S. Appl. No. 14/921,781, filed Oct. 23, 2015, 8 pages.
Notice of Allowance dated May 23, 2018, issued in connection with U.S. Appl. No. 15/698,283, filed Sep. 7, 2017, 8 pages.
Notice of Allowance dated Oct. 23, 2017, issued in connection with U.S. Appl. No. 14/481,522, filed Sep. 9, 2014, 16 pages.
Notice of Allowance dated Sep. 23, 2016, issued in connection with U.S. Appl. No. 15/070,160, filed Mar. 15, 2016, 7 pages.
Notice of Allowance dated Jul. 24, 2019, issued in connection with U.S. Appl. No. 15/229,693, filed Aug. 5, 2016, 13 pages.
Notice of Allowance dated May 24, 2017, issued in connection with U.S. Appl. No. 14/997,868, filed Jan. 18, 2016, 5 pages.
Notice of Allowance dated Nov. 24, 2017, issued in connection with U.S. Appl. No. 15/681,640, filed Aug. 21, 2017, 8 pages.
Notice of Allowance dated Apr. 25, 2017, issued in connection with U.S. Appl. No. 14/696,014, filed Apr. 24, 2015, 7 pages.
Notice of Allowance dated Apr. 25, 2017, issued in connection with U.S. Appl. No. 15/207,682, filed Jul. 12, 2016, 7 pages.
Notice of Allowance dated Apr. 25, 2019, issued in connection with U.S. Appl. No. 15/806,126, filed Nov. 7, 2017, 8 pages.
Notice of Allowance dated Oct. 25, 2016, issued in connection with U.S. Appl. No. 14/826,873, filed Aug. 14, 2015, 5 pages.
Notice of Allowance dated Feb. 26, 2016, issued in connection with U.S. Appl. No. 14/921,762, filed Oct. 23, 2015, 7 pages.
Notice of Allowance dated Jul. 26, 2016, issued in connection with U.S. Appl. No. 14/481,511, filed Sep. 9, 2014, 12 pages.
Notice of Allowance dated Oct. 26, 2016, issued in connection with U.S. Appl. No. 14/811,587, filed Jul. 28, 2015, 11 pages.
Notice of Allowance dated Feb. 27, 2017, issued in connection with U.S. Appl. No. 14/805,340, filed Jul. 21, 2015, 9 pages.
Notice of Allowance dated Jul. 27, 2017, issued in connection with U.S. Appl. No. 15/005,853, filed Jan. 25, 2016, 5 pages.
Notice of Allowance dated Jun. 27, 2017, issued in connection with U.S. Appl. No. 15/344,069, filed Nov. 4, 2016, 8 pages.
Notice of Allowance dated Aug. 28, 2017, issued in connection with U.S. Appl. No. 15/089,004, filed Apr. 1, 2016, 5 pages.
Notice of Allowance dated Jul. 28, 2017, issued in connection with U.S. Appl. No. 14/678,263, filed Apr. 3, 2015, 10 pages.
Notice of Allowance dated Jul. 28, 2017, issued in connection with U.S. Appl. No. 15/211,822, filed Jul. 15, 2016, 9 pages.
Notice of Allowance dated Mar. 28, 2018, issued in connection with U.S. Appl. No. 15/673,170, filed Aug. 9, 2017, 5 pages.
Notice of Allowance dated Aug. 29, 2018, issued in connection with U.S. Appl. No. 15/357,520, filed Nov. 21, 2016, 11 pages.
Notice of Allowance dated Aug. 29, 2018, issued in connection with U.S. Appl. No. 15/718,556, filed Sep. 28, 2017, 8 pages.
Notice of Allowance dated Aug. 29, 2019, issued in connection with U.S. Appl. No. 16/185,906, filed Nov. 9, 2018, 8 pages.
Notice of Allowance dated Dec. 29, 2017, issued in connection with U.S. Appl. No. 14/793,205, filed Jul. 7, 2015, 5 pages.
Notice of Allowance dated Jul. 29, 2016, issued in connection with U.S. Appl. No. 14/481,522, filed Sep. 9, 2014, 11 pages.
Notice of Allowance dated Oct. 29, 2015, issued in connection with U.S. Appl. No. 14/216,306, filed Mar. 17, 2014, 9 pages.
Notice of Allowance dated May 3, 2019, issued in connection with U.S. Appl. No. 15/217,399, filed Jul. 22, 2016, 7 pages.
Notice of Allowance dated May 3, 2019, issued in connection with U.S. Appl. No. 16/181,583, filed Nov. 6, 2018, 7 pages.
Notice of Allowance dated Aug. 30, 2017, issued in connection with U.S. Appl. No. 15/088,994, filed Apr. 1, 2016, 10 pages.
Notice of Allowance dated Dec. 30, 2016, issued in connection with U.S. Appl. No. 14/696,014, filed Apr. 24, 2015, 13 pages.
Notice of Allowance dated Jan. 30, 2017, issued in connection with U.S. Appl. No. 15/339,260, filed Oct. 31, 2016, 8 pages.
Notice of Allowance dated Aug. 31, 2018, issued in connection with U.S. Appl. No. 15/872,979, filed Jan. 16, 2018, 7 pages.
Notice of Allowance dated Aug. 31, 2018, issued in connection with U.S. Appl. No. 16/055,884, filed Aug. 6, 2018, 8 pages.
Notice of Allowance dated Apr. 4, 2017, issued in connection with U.S. Appl. No. 14/682,182, filed Apr. 9, 2015, 8 pages.
Notice of Allowance dated Feb. 4, 2019, issued in connection with U.S. Appl. No. 15/166,241, filed Aug. 26, 2016, 8 pages.
Notice of Allowance dated Feb. 4, 2019, issued in connection with U.S. Appl. No. 16/181,583, filed Nov. 6, 2018, 9 pages.
Notice of Allowance dated Oct. 4, 2018, issued in connection with U.S. Appl. No. 15/166,241, filed May 26, 2016, 7 pages.
Notice of Allowance dated Apr. 5, 2018, issued in connection with U.S. Appl. No. 15/681,640, filed Aug. 21, 2017, 8 pages.
Notice of Allowance dated Jun. 5, 2019, issued in connection with U.S. Appl. No. 15/859,311, filed Dec. 29, 2017, 8 pages.
Notice of Allowance dated Jun. 5, 2019, issued in connection with U.S. Appl. No. 15/865,221, filed Jan. 3, 2018, 8 pages.
Notice of Allowance dated Mar. 5, 2019, issued in connection with U.S. Appl. No. 16/102,499, filed Aug. 13, 2018, 8 pages.
Notice of Allowance dated May 5, 2017, issued in connection with U.S. Appl. No. 14/826,873, filed Aug. 14, 2015, 5 pages.
Notice of Allowance dated Oct. 5, 2018, issued in connection with U.S. Appl. No. 16/115,524, filed Aug. 28, 2018, 10 pages.
Advisory Action dated Dec. 11, 2020, issued in connection with U.S. Appl. No. 15/005,496, filed Jan. 25, 2016, 3 pages.
Advisory Action dated Jun. 3, 2020, issued in connection with U.S. Appl. No. 16/115,525, filed Aug. 28, 2018, 3 pages.
BeoLab5 User Manual. Bang & Olufsen. Version 1.0, 20 pages [produced by Google in WDTX Case No. 6:20-cv-00881 Answer on Jan. 8, 2021].
Chen, Trista P. et al. VRAPS: Visual Rhythm-Based Audio Playback System. IEEE, Gracenote, Inc., 2010, pp. 721-722.

(56) References Cited

OTHER PUBLICATIONS

Chinese Patent Office, First Office Action and Translation dated Feb. 22, 2021, issued in connection with Chinese Application No. 202010187024 8, 11 pages.
Chinese Patent Office, First Office Action and Translation dated Jun. 29, 2020, issued in connection with Chinese Application No. 201780057093.3, 11 pages.
Chinese Patent Office, First Office Action and Translation dated Feb. 3, 2021, issued in connection with Chinese Application No. 202010095178.4, 15 pages.
Chinese Patent Office, First Office Action and Translation dated Aug. 4, 2020, issued in connection with Chinese Application No. 201910395715.4, 22 pages.
Chinese Patent Office, First Office Action dated Jan. 28, 2021, issued in connection with Chinese Application No. 201680054164 X, 9 pages.
Chinese Patent Office, Office Action dated Nov. 14, 2019, issued in connection with Chinese Application No. 201680040086.8, 9 pages.
Chinese Patent Office, Office Action datedn Dec. 24, 2020, issued in connection with Chinese Application No. 201910978233.1, 8 pages.
Chinese Patent Office, Second Office Action dated May 6, 2020, issued in connection with Chinese Application No. 201680040086 8, 3 pages.
European Patent Office, European Extended Search Report dated Dec. 11, 2020, issued in connection with European Application No. 20196286 7, 6 pages.
European Patent Office, European Extended Search Report dated Mar. 16, 2020, issued in connection with European Application No. 192095511, 7 pages.
European Patent Office, European Extended Search Report dated Mar. 25, 2020, issued in connection with European Application No. 19215348.4, 10 pages.
European Patent Office, European Office Action dated Nov. 10, 2020, issued in connection with European Application No. 19168800.1, 5 pages.
European Patent Office, European Office Action dated Sep. 16, 2020, issued in connection with European Application No. 15778787.0, 7 pages.
European Patent Office, European Office Action dated Aug. 19, 2020, issued in connection with European Application No. 17754501.9, 6 pages.
European Patent Office, European Office Action dated Jan. 3, 2020, issued in connection with European Application No. 17703876.7, 8 pages.
European Patent Office, European Office Action dated Sep. 7, 2020, issued in connection with European Application No. 19161826.3, 6 pages.
European Patent Office, European Office Action dated Jul. 9, 2020, issued in connection with European Application No. 19167365.6, 4 pages.
Ex Parte Quayle Office Action mailed on Dec. 26, 2019, issued in connection with U.S. Appl. No. 16/542,418, filed Aug. 16, 2019, 7 pages.
Excerpts from Andrew Tanenbaum, Computer Networks. 4th Edition. Copyright 2003, 87 pages [produced by Google in IPR of U.S. Pat. No. 9,219,460, IPR2021-00475 on Feb. 5, 2021].
Excerpts from Morfey, Christopher L., Dictionary of Acoustics. Copyright 2001, 4 pages [produced by Google in IPR of U.S. Pat. No. 9,219,460, IPR2021-00475 on Feb. 5, 2021].
Final Office Action dated Dec. 14, 2020, issued in connection with U.S. Appl. No. 16/812,618, filed Mar. 9, 2020, 17 pages.
Final Office Action mailed on Sep. 22, 2020, issued in connection with U.S. Appl. No. 15/005,496, filed Jan. 25, 2016,17 pages.
Final Office Action dated Mar. 3, 2020, issued in connection with U.S. Appl. No. 16/115,525, filed Aug. 28, 2018, 13 pages.
*Google LLC* v. *Sonos, Inc.*, Declaration of Jeffery S. Vipperman, PHD. In Support of Petition for Inter Partes Review of U.S. Pat. No. 9,219,460, IPR2021-00475, Feb. 2, 2021, 92 pages.

*Google LLC* v. *Sonos, Inc.*, Petition for IPR of U.S. Pat. No. 9,219,460, IPR2021-00475, Feb. 5, 2021, 88 pages.
International Bureau, International Search Report and Written Opinion dated Dec. 15, 2020, issued in connection with International Application No. PCT/US2020/045746, filed on Aug. 11, 2020, 23 pages.
Japanese Patent Office, Non-Final Office Action and Translation dated Dec. 10, 2019, issued in connection with Japanese Patent Application No. 2018-213477, 8 pages.
Japanese Patent Office, Office Action and Translation dated Jun. 12, 2020, issued in connection with Japanese Patent Application No. 2019-056360, 6 pages.
Japanese Patent Office, Office Action and Translation dated Nov. 4, 2020, issued in connection with Japanese Patent Application No. 2019-141349, 6 pages.
Japanese Patent Office, Office Action dated Feb. 4, 2020, issued in connection with Japanese Patent Application No. 2018-500529, 6 pages.
Lei et al. An Audio Frequency Acquision and Release System Based on TMS320VC5509, Instrumentation Technology Editorial Department Email, Issue 02, 2007, 4 pages.
Non-Final Office Action dated Dec. 11, 2019, issued in connection with U.S. Appl. No. 16/556,297, filed Aug. 30, 2019, 9 pages.
Non-Final Office Action dated Dec. 11, 2019, issued in connection with U.S. Appl. No. 16/658,896, filed Oct. 21, 2019, 14 pages.
Non-Final Office Action dated Feb. 11, 2021, issued in connection with U.S. Appl. No. 17/104,466, filed Nov. 25, 2020, 39 pages.
Non-Final Office Action dated Mar. 12, 2020, issued in connection with U.S. Appl. No. 16/796,496, filed Feb. 20, 2020, 13 pages.
Non-Final Office Action dated Mar. 13, 2020, issued in connection with U.S. Appl. No. 15/005,496, filed Jan. 25, 2016, 20 pages.
Non-Final Office Action dated Sep. 16, 2020, issued in connection with U.S. Appl. No. 16/115,525, filed Aug. 28, 2018, 11 pages.
Non-Final Office Action dated Aug. 18, 2020, issued in connection with U.S. Appl. No. 16/827,143, filed Mar. 23, 2020, 8 pages.
Non-Final Office Action dated Feb. 19, 2020, issued in connection with U.S. Appl. No. 16/665,415, filed Oct. 28, 2019, 53 pages.
Non-Final Office Action dated Jun. 19, 2020, issued in connection with U.S. Appl. No. 16/403,077, filed May 3, 2019, 6 pages.
Non-Final Office Action dated Jun. 22, 2020, issued in connection with U.S. Appl. No. 16/555,832, filed Aug. 29, 2019, 15 pages.
Non-Final Office Action dated Mar. 4, 2020, issued in connection with U.S. Appl. No. 15/966,534, filed Apr. 30, 2018, 11 pages.
Non-Final Office Action dated Jan. 5, 2021, issued in connection with U.S. Appl. No. 17/078,382, filed Oct. 23, 2020, 11 pages.
Non-Final Office Action dated Jul. 6, 2020, issued in connection with U.S. Appl. No. 16/812,618, filed Mar. 9, 2020, 15 pages.
Notice of Allowance dated Jun. 10, 2020, issued in connection with U.S. Appl. No. 16/713,858, filed Dec. 13, 2019, 8 pages.
Notice of Allowance dated Apr. 13, 2020, issued in connection with U.S. Appl. No. 16/181,865, filed Nov. 3, 2018, 10 pages.
Non-Final Office Action dated Feb. 7, 2019, issued in connection with U.S. Appl. No. 15/865,221, filed Jan. 8, 2018, 10 pages.
Non-Final Office Action dated Jan. 9, 2018, issued in connection with U.S. Appl. No. 15/698,283, filed Sep. 7, 2017, 18 pages.
Non-Final Office Action dated Jan. 9, 2018, issued in connection with U.S. Appl. No. 15/727,913, filed Oct. 9, 2017, 8 pages.
Notice of Allowance dated May 1, 2017, issued in connection with U.S. Appl. No. 14/805,140, filed Jul. 21, 2015, 13 pages.
Notice of Allowance dated Nov. 2, 2016, issued in connection with U.S. Appl. No. 14/884,001, filed Oct. 15, 2015, 8 pages.
Notice of Allowance dated Jun. 3, 2016, issued in connection with U.S. Appl. No. 14/921,799, filed Oct. 23, 2015, 8 pages.
Notice of Allowance dated Nov. 4, 2016, issued in connection with U.S. Appl. No. 14/481,514, filed Sep. 9, 2014, 10 pages.
Notice of Allowance dated Jun. 6, 2018, issued in connection with U.S. Appl. No. 15/727,913, filed Oct. 9, 2017, 5 pages.
Notice of Allowance dated Dec. 7, 2015, issued in connection with U.S. Appl. No. 14/216,325, filed Mar. 17, 2014, 7 pages.
Notice of Allowance dated Nov. 9, 2016, issued in connection with U.S. Appl. No. 14/805,340, filed Jul. 21, 2015, 13 pages.
Notice of Allowance dated Feb. 1, 2018, issued in connection with U.S. Appl. No. 15/480,265, filed Apr. 5, 2017, 8 pages.

(56) References Cited

OTHER PUBLICATIONS

Notice of Allowance mailed on Apr. 10, 2015, issued in connection with U.S. Appl. No. 13/536,493, filed Jun. 28, 2012, 8 pages.
Notice of Allowance mailed on Aug. 10, 2018, issued in connection with U.S. Appl. No. 15/785,088, filed an Oct. 16, 2017, 6 pages.
Notice of Allowance mailed on Jul. 10, 2018, issued in connection with U.S. Appl. No. 15/673,170, filed Aug. 9, 2017, 2 pages.
Notice of Allowance mailed on Dec. 11, 2018, issued in connection with U.S. Appl. No. 15/909,327, filed Mar. 1, 2018, 10 pages.
Notice of Allowance mailed on Feb. 11, 2019, issued in connection with U.S. Appl. No. 15/588,186, filed May 5, 2017, 5 pages.
Notice of Allowance mailed on Jul. 11, 2017, issued in connection with U.S. Appl. No. 14/678,248, filed Apr. 3, 2015, 11 pages.
Notice of Allowance mailed on Mar. 11, 2015, issued in connection with U.S. Appl. No. 13/340,126, filed an Dec. 29, 2011, 7 pages.
Notice of Allowance mailed on Apr. 12, 2016, issued in connection with U.S. Appl. No. 14/681,465, filed Apr. 2, 38015, 13 pages.
Notice of Allowance mailed on Aug. 12, 2019, issued in connection with U.S. Appl. No. 16/416,648, filed an May 20, 2019, 7 pages.
Notice of Allowance mailed on Dec. 12, 2016, issued in connection with U.S. Appl. No. 14/805,140, filed Jul. 21, 2015, 24 pages.
Notice of Allowance mailed on Dec. 12, 2017, issued in connection with U.S. Appl. No. 14/481,505, filed Sep. 9, 2014, 9 pages.
Notice of Allowance dated Nov. 12, 2019, issued in connection with U.S. Appl. No. 15/955,545, filed Apr. 17, 2018, 9 pages.
Notice of Allowance dated Sep. 12, 2016, issued in connection with U.S. Appl. No. 15/066,072, filed Mar. 10, 2016, 7 pages.
Notice of Allowance dated Sep. 12, 2017, issued in connection with U.S. Appl. No. 15/207,682, filed Jul. 12, 2016, 8 pages.
Notice of Allowance dated Feb. 13, 2017, issued in connection with U.S. Appl. No. 14/864,506, filed Sep. 24, 2015, 8 pages.
Notice of Allowance dated Nov. 13, 2017, issued in connection with U.S. Appl. No. 14/726,921, filed Jun. 1, 2015, 8 pages.
Notice of Allowance dated Mar. 14, 2019, issued in connection with U.S. Appl. No. 15/343,996, filed Nov. 4, 2016, 8 pages.
Notice of Allowance dated Jan. 15, 2019, issued in connection with U.S. Appl. No. 16/115,524, filed Aug. 28, 2018, 8 pages.
Notice of Allowance dated Jun. 15, 2017, issued in connection with U.S. Appl. No. 15/096,827, filed Apr. 12, 2016, 5 pages.
Notice of Allowance dated Mar. 15, 2017, issued in connection with U.S. Appl. No. 14/826,856, filed Aug. 14, 2015, 7 pages.
Notice of Allowance dated May 15, 2019, issued in connection with U.S. Appl. No. 16/113,032, filed Aug. 27, 2018, 9 pages.
Notice of Allowance dated Oct. 15, 2018, issued in connection with U.S. Appl. No. 15/716,313, filed Sep. 26, 2017, 10 pages.
Notice of Allowance dated Jun. 16, 2017, issued in connection with U.S. Appl. No. 14/884,001, filed Oct. 15, 2015, 8 pages.
Notice of Allowance dated May 16, 2019, issued in connection with U.S. Appl. No. 16/181,213, filed Nov. 5, 2018, 10 pages.
Notice of Allowance dated Oct. 16, 2017, issued in connection with U.S. Appl. No. 15/478,770, filed Apr. 4, 2017, 10 pages.
Notice of Allowance dated Oct. 16, 2019, issued in connection with U.S. Appl. No. 16/401,981, filed May 2, 2019, 8 pages.
Notice of Allowance dated Sep. 16, 2016, issued in connection with U.S. Appl. No. 15/066,049, filed Mar. 10, 2016, 7 pages.
Notice of Allowance dated Dec. 17, 2018, issued in connection with U.S. Appl. No. 16/055,884, filed Aug. 6, 2018, 5 pages.
Notice of Allowance dated May 17, 2017, issued in connection with U.S. Appl. No. 15/339,260, filed Oct. 31, 2016, 7 pages.
Notice of Allowance dated Oct. 17, 2019, issued in connection with U.S. Appl. No. 16/542,433, filed Aug. 16, 2019, 9 pages.
Notice of Allowance dated Mar. 18, 2019, issued in connection with U.S. Appl. No. 16/056,862, filed Aug. 7, 2018, 12 pages.
Notice of Allowance dated Aug. 19, 2016, issued in connection with U.S. Appl. No. 14/644,136, filed Mar. 10, 2015, 12 pages.
Notice of Allowance dated Jun. 19, 2017, issued in connection with U.S. Appl. No. 14/793,190, filed Jul. 7, 2015, 5 pages.
Notice of Allowance dated Sep. 19, 2017, issued in connection with U.S. Appl. No. 14/793,205, filed Jul. 7, 2015, 16 pages.
Notice of Allowance dated Sep. 19, 2018, issued in connection with U.S. Appl. No. 14/864,393, filed Sep. 24, 2015, 10 pages.
Notice of Allowance dated Apr. 20, 2017, issued in connection with U.S. Appl. No. 14/940,779, filed Nov. 13, 2015, 11 pages.
Notice of Allowance dated Nov. 20, 2017, issued in connection with U.S. Appl. No. 15/298,115, filed Oct. 19, 2016, 10 pages.
Notice of Allowance dated Sep. 20, 2017, issued in connection with U.S. Appl. No. 14/481,514, filed Sep. 9, 2014, 10 pages.
Notice of Allowance dated Dec. 21, 2016, issued in connection with U.S. Appl. No. 14/682,182, filed Apr. 9, 2015, 8 pages.
Notice of Allowance dated Feb. 6, 2019, issued in connection with U.S. Appl. No. 15/996,878, filed Jun. 4, 2018, 8 pages.
Notice of Allowance dated Apr. 8, 2019, issued in connection with U.S. Appl. No. 16/011,402, filed Jun. 18, 2018, 8 pages.
Notice of Allowance dated Jul. 8, 2019, issued in connection with U.S. Appl. No. 15/856,791, filed Dec. 28, 2017, 5 pages.
Notice of Allowance dated May 8, 2018, issued in connection with U.S. Appl. No. 15/650,386, filed Jul. 14, 2017, 13 pages.
Notice of Allowance dated May 9, 2019, issued in connection with U.S. Appl. No. 15/996,878, filed Jun. 4, 2018, 7 pages.
Notice of Allowance dated Apr. 19, 2017, issued in connection with U.S. Appl. No. 14/481,511, filed Sep. 9, 2014, 10 pages.
Palm, Inc., "Handbook for the Palm VII Handheld," May 2000, 311 pages.
Papp Istvan et al. "Adaptive Microphone Array for Unknown Desired Speaker's Transfer Function", The Journal of the Acoustical Society of America, American Institute of Physics for the Acoustical Society of America, New York, NY vol. 122, No. 2, Jul. 19, 2007, pp. 44-49.
Pre-Brief Appeal Conference Decision dated Mar. 19, 2019, issued in connection with U.S. Appl. No. 15/806,126, filed Nov. 7, 2017, 2 pages.
Preinterview First Office Action dated Oct. 6, 2016, issued in connection with U.S. Appl. No. 14/726,921, filed Jun. 1, 2015, 6 pages.
Preinterview First Office Action dated Jul. 12, 2017, issued in connection with U.S. Appl. No. 14/793,205, filed Jul. 7, 2015, 5 pages.
Preinterview First Office Action dated May 17, 2016, issued in connection with U.S. Appl. No. 14/481,505, filed Sep. 9, 2014, 7 pages.
Preinterview First Office Action dated May 25, 2016, issued in connection with U.S. Appl. No. 14/481,514, filed Sep. 9, 2014, 7 pages.
Presentations at WinHEC 2000, May 2000, 138 pages.
PRISMIQ, Inc., "PRISMIQ Media Player User Guide," 2003, 44 pages.
Ross, Alex, "Wizards of Sound: Retouching acoustics, from the restaurant to the concert hall," The New Yorker, Feb. 23, 2015. Web. Feb. 26, 2015, 9 pages.
Supplemental Notice of Allowability dated Oct. 27, 2016, issued in connection with U.S. Appl. No. 14/481,511, filed Sep. 9, 2014, 6 pages.
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Wikipedia, Server(Computing) https://web.archive.org/web/20160703173710/https://en.wikipedia.org/wiki/Server_ (computing), published Jul. 3, 2016, 7 pages.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
International Searching Authority, International Search Report and Written Opinion dated Nov. 23, 2015, issued in connection with International Application No. PCT/US2015/048942, filed on Sep. 8, 2015, 14 pages.

(56) References Cited

OTHER PUBLICATIONS

International Searching Authority, International Search Report and Written Opinion dated Nov. 23, 2015, issued in connection with International Application No. PCT/US2015/048944, filed on Sep. 8, 2015, 12 pages.
International Searching Authority, International Search Report and Written Opinion dated Nov. 23, 2016, issued in connection with International Patent Application No. PCT/US2016/052266, filed on Sep. 16, 2016, 11 pages.
International Searching Authority, International Search Report and Written Opinion mailed on Jan. 24, 2017, issued in connection with International Application No. PCT/US2016/052264, filed on Sep. 16, 2016, 17 pages.
International Searching Authority, International Search Report and Written Opinion dated Oct. 25, 2016, issued in connection with International Application No. PCT/US2016/043109, filed on Jul. 20, 2016, 12 pages.
International Searching Authority, International Search Report and Written Opinion dated Sep. 25, 2017, issued in connection with International Application No. PCT/US2017/042191, filed on Jul. 14, 2017, 16 pages.
International Searching Authority, International Search Report and Written Opinion dated Aug. 3, 2017, in connection with International Application No. PCT/US2017014596, 20 pages.
Japanese Patent Office, English Translation of Office Action dated May 8, 2018, issued in connection with Japanese Application No. 2017-513241, 4 pages.
Japanese Patent Office, Japanese Office Action dated Oct. 3, 2017, issued in connection with Japanese Application No. 2017-501082, 7 pages.
Japanese Patent Office, Non-Final Office Action with Translation dated Apr. 25, 2017, issued in connection with Japanese Patent Application No. 2016-568888, 7 pages.
Japanese Patent Office, Non-Final Office Action with Translation dated Oct. 3, 2017, issued in connection with Japanese Patent Application No. 2017-501082, 3 pages.
Japanese Patent Office, Office Action dated Jun. 12, 2018, issued in connection with Japanese Application No. 2018-502729, 4 pages.
Japanese Patent Office, Office Action dated May 14, 2019, issued in connection with Japanese Patent Application No. 2018-500529, 8 pages.
Japanese Patent Office, Office Action dated Aug. 21, 2018, issued in connection with Japanese Application No. 2018 514418, 7 pages.
Japanese Patent Office, Office Action dated Jul. 24, 2018, issued in connection with Japanese Application No. 2018-514419, 5 pages.
Japanese Patent Office, Office Action dated Jun. 4, 2019, issued in connection with Japanese Patent Application No. 2018-112810, 4 pages.
Japanese Patent Office, Office Action dated May 8, 2018, issued in connection with Japanese Application No. 2017-513241, 8 pages.
Japanese Patent Office, Office Action with English Summary dated Jul. 18, 2017, issued in connection with Japanese Patent Application No. 2017-513171, 4 pages.
Japanese Patent Office, Translation of Office Action dated May 14, 2019, issued in connection with Japanese Patent Application No. 2018-500529, 5 pages.
Jo et al., "Synchronized One-to-many Media Streaming with Adaptive Playout Control," Proceedings of SPIE, 2002, pp. 71-82, vol. 4861.
John Mark and Paul Hufnagel "What is 1451.4, what are its uses and how does it work?" IEEE Standards Association, The IEEE 1451.4 Standard for Smart Transducers, 14pages.
Jones, Stephen, "Dell Digital Audio Receiver: Digital upgrade for your analog stereo," Analog Stereo, Jun. 24, 2000 retrieved Jun. 18, 2014, 2 pages.
"AuEQforthe iPhone," Mar. 25, 2015, retrieved from the internet: URL:https://web.archive.org/web20150325152629/http://www.hotto.de/mobileapps/iphoneaueq.html [retrieved on Jun. 24, 2016], 6 pages.
Louderback, Jim, "Affordable Audio Receiver Furnishes Homes With MP3," TechTV Vault. Jun. 28, 2000 retrieved Jul. 10, 2014, 2 pages.
Microsoft Corporation, "Using Microsoft Outlook 2003," Cambridge College, 2003.
Motorola, "Simplefi, Wireless Digital Audio Receiver, Installation and User Guide," Dec. 31, 2001, 111 pages.
Mulcahy, John, "Room EQ Wizard: Room Acoustics Software," REW, 2014, retrieved Oct. 10, 2014, 4 pages.
Non-Final Action dated Jan. 29, 2016, issued in connection with U.S. Appl. No. 14/481,511, filed Sep. 9, 2014, 10 pages.
Non-Final Office Action dated Mar. 1, 2017, issued in connection with U.S. Appl. No. 15/344,069, filed Nov. 4, 2016, 20 pages.
Non-Final Office Action dated Nov. 1, 2017, issued in connection with U.S. Appl. No. 15/235,598, filed Aug. 12, 2016, 15 pages.
Non-Final Office Action dated Jun. 2, 2014, issued in connection with U.S. Appl. No. 13/340,126, filed Dec. 29, 2011, 14 pages.
Non-Final Office Action dated Jun. 2, 2017, issued in connection with U.S. Appl. No. 15/229,693, filed Aug. 5, 2016, 18 pages.
Non-Final Office Action dated Nov. 2, 2017, issued in connection with U.S. Appl. No. 15/166,241, filed May 26, 2016, 12 pages.
Non-Final Office Action dated Oct. 2, 2017, issued in connection with U.S. Appl. No. 15/005,853, filed Jan. 25, 2016, 8 pages.
Non-Final Office Action dated Feb. 3, 2016, issued in connection with U.S. Appl. No. 14/481,522, filed Sep. 9, 2014, 12 pages.
Non-Final Office Action dated Jul. 3, 2018, issued in connection with U.S. Appl. No. 15/909,327, filed Mar. 1, 2018, 30 pages.
Non-Final Office Action dated Jan. 4, 2017, issued in connection with U.S. Appl. No. 15/207,682, filed Jul. 12, 2016, 6 pages.
Non-Final Office Action dated Nov. 4, 2016, issued in connection with U.S. Appl. No. 14/826,856, filed Aug. 14, 2015, 10 pages.
Non-Final Office Action dated Sep. 4, 2019, issued in connection with U.S. Appl. No. 16/213,552, filed Dec. 7, 2018, 16 pages.
Non-Final Office Action dated Jul. 5, 2017, issued in connection with U.S. Appl. No. 14/481,522, filed Sep. 9, 2014, 8 pages.
Non-Final Office Action dated Jul. 6, 2016, issued in connection with U.S. Appl. No. 15/070,160, filed Mar. 15, 2016, 6 pages.
Non-Final Office Action dated Oct. 6, 2016, issued in connection with U.S. Appl. No. 14/678,263, filed Apr. 3, 2015, 30 pages.
Non-Final Office Action dated Jun. 6, 2018, issued in connection with U.S. Appl. No. 15/005,496, filed Jan. 25, 2016, 16 pages.
Non-Final Office Action dated Dec. 7, 2015, issued in connection with U.S. Appl. No. 14/921,762, filed Oct. 23, 2015, 5 pages.
Non-Final Office Action dated Jul. 7, 2016, issued in connection with U.S. Appl. No. 15/066,049, filed Mar. 10, 2016, 6 pages.
Non-Final Office Action dated Mar. 7, 2017, issued in connection with U.S. Appl. No. 14/481,514, filed Sep. 9, 2014, 24 pages.
Non-Final Office Action dated Sep. 7, 2016, issued in connection with U.S. Appl. No. 14/826,873, filed Aug. 14, 2015, 12 pages.
Non-Final Office Action dated Jul. 8, 2016, issued in connection with U.S. Appl. No. 15/066,072, filed Mar. 10, 2016, 6 pages.
Non-Final Office Action dated Dec. 9, 2016, issued in connection with U.S. Appl. No. 14/678,248, filed Apr. 3, 2015, 22 pages.
Non-Final Office Action dated Apr. 10, 2018, issued in connection with U.S. Appl. No. 15/909,529, filed Mar. 1, 2018, 8 pages.
Advisory Action dated Jul. 1, 2019, issued in connection with U.S. Appl. No. 15/229,693, filed Aug. 5, 2016, 2 pages.
Advisory Action dated Jul. 10, 2018, issued in connection with U.S. Appl. No. 15/056,553, filed Feb. 29, 2016, 3 pages.
Advisory Action dated Jul. 12, 2018, issued in connection with U.S. Appl. No. 15/166,241, filed May 26, 2016, 3 pages.
Advisory Action dated Jul. 12, 2018, issued in connection with U.S. Appl. No. 15/235,598, filed Aug. 12, 2016, 3 pages.
Advisory Action dated Aug. 16, 2017, issued in connection with U.S. Appl. No. 14/481,505, filed Sep. 2, 39014, 3 pages.
Advisory Action dated Jun. 19, 2018, issued in connection with U.S. Appl. No. 15/229,693, filed Aug. 5, 2016, 3 pages.
Advisory Action dated Sep. 19, 2017, issued in connection with U.S. Appl. No. 14/726,921, filed Jun. 1, 2015, 3 pages.
Advisory Action dated Apr. 30, 2019, issued in connection with U.S. Appl. No. 15/005,496, filed Jan. 25, 2016, 3 pages.
Advisory Action dated Feb. 7, 2019, issued in connection with U.S. Appl. No. 15/806,126, filed Nov. 7, 2017, 3 pages.

(56) References Cited

OTHER PUBLICATIONS

An Overview of IEEE 1451.4 Transducer Electronic Data Sheets (TEDS) National Instruments, 19 pages.
AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Burger, Dennis, "Automated Room Correction Explained," hometheaterreview.com, Nov. 18, 2013, Retrieved Oct. 10, 2014, 3 pages.
Chinese Patent Office, First Office Action and Translation dated Jun. 19, 2019, issued in connection with Chinese Application No. 201680054189.X, 11 pages.
Chinese Patent Office, First Office Action dated Aug. 11, 2017, issued in connection with Chinese Patent Application No. 201580013837 2, 8 pages.
Chinese Patent Office, First Office Action dated Nov. 20, 2018, issued in connection with Chinese Application No. 201580047998 3, 21 pages.
Chinese Patent Office, First Office Action dated Sep. 25, 2017, issued in connection with Chinese Patent Application No. 201580013894.0, 9 pages.
Chinese Patent Office, First Office Action dated Nov. 5, 2018, issued in connection with Chinese Application No. 201680044080.8, 5 pages.
Chinese Patent Office, Second Office Action and Translation dated Aug. 26, 2019, issued in connection with Chinese Application No. 201580047998 3, 25 pages.
Chinese Patent Office, Second Office Action dated Jan. 11, 2019, issued in connection with Chinese Application No. 201680044080. 8, 4 pages.
Chinese Patent Office, Second Office Action dated Feb. 3, 2019, issued in connection with Chinese Application No. 201580048594 6, 11 pages.
Chinese Patent Office, Second Office Action with Translation dated Jan. 9, 2018, issued in connection with Chinese Patent Application No. 201580013837.2, 10 pages.
Chinese Patent Office, Third Office Action dated Apr. 11, 2019, issued in connection with Chinese Application No. 201580048594 6, 4 pages.
"Constellation Acoustic System: a revolutionary breakthrough in acoustical design," Meyer Sound Laboratories, Inc. 2012, 32 pages.
"Constellation Microphones," Meyer Sound Laboratories, Inc. 2013, 2 pages.
Corrected Notice of Allowability dated Jan. 19, 2017, issued in connection with U.S. Appl. No. 14/826,873, filed Aug. 14, 2015, 11 pages.
Daddy, B., "Calibrating Your Audio with a Sound Pressure Level (SPL) Meter," Blue-ray.com, Feb. 22, 2008 Retrieved Oct. 10, 2014, 15 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
European Patent Office, European Examination Report dated May 11, 2018, issued in connection with European Application No. 16748186.0, 6 pages.
European Patent Office, European Extended Search Report dated Oct. 16, 2018, issued in connection with European Application No. 17185193.4, 6 pages.
European Patent Office, European Extended Search Report dated Jul. 17, 2019, issued in connection with European Application No. 19167365.6, 7 pages.
European Patent Office, European Extended Search Report dated Jun. 26, 2018, issued in connection with European Application No. 18171206.8, 9 pages.
European Patent Office, European Extended Search Report dated Sep. 8, 2017, issued in connection with European Application No. 17000460.0, 8 pages.
European Patent Office, European Office Action dated Dec. 11, 2018, issued in connection with European Application No. 15778787. 0, 6 pages.
European Patent Office, European Office Action dated Jul. 11, 2019, issued in connection with European Application No. 15778787.0, 10 pages.
European Patent Office, European Office Action dated Nov. 2, 2018, issued in connection with European Application No. 18171206.8, 6 pages.
European Patent Office, European Office Action dated Feb. 4, 2019, issued in connection with European Application No. 17703876.7, 9 pages.
European Patent Office, European Office Action dated May 9, 2019, issued in connection with European Appllication No. 18171206.8, 7 pages.
European Patent Office, European Partial Search Report dated Jun. 7, 2019, issued in connection with European Application No. 19161826.3, 17 pages.
European Patent Office, European Search Report dated Jun. 13, 2019, issued in connection with European Application No. 18204450. 3, 11 pages.
European Patent Office, European Search Report dated Sep. 13, 2019, issued in connection with European Application No. 19161826. 3, 13 pages.
European Patent Office, European Search Report dated Jan. 18, 2018, issued in connection with European Patent Application No. 17185193.4, 9 pages.
European Patent Office, European Search Report dated Jul. 9, 2019, issued in connection with European Application No. 19168800.1, 12 pages.
European Patent Office, Extended European Search Report dated Jan. 5, 2017, issued in connection with European Patent Application No. 15765555.6, 8 pages.
European Patent Office, Extended Search Report dated Jan. 25, 2017, issued in connection with European Application No. 15765548. 1, 7 pages.
Notice of Allowance dated Jul. 14, 2020, issued in connection with U.S. Appl. No. 16/556,297, filed Aug. 30, 2019, 11 pages.
Notice of Allowance dated Jul. 16, 2020, issued in connection with U.S. Appl. No. 16/530,324, filed Aug. 2, 2019, 9 pages.
Notice of Allowance dated Mar. 2, 2020, issued in connection with U.S. Appl. No. 16/213,552, filed Dec. 7, 2018, 9 pages.
Notice of Allowance dated Feb. 22, 2021, issued in connection with U.S. Appl. No. 16/944,884, filed Jul. 31, 2020, 9 pages.
Notice of Allowance dated Feb. 23, 2021, issued in connection with U.S. Appl. No. 16/115,525, filed Aug. 28, 2018, 8 pages.
Notice of Allowance dated Mar. 23, 2020, issued in connection with U.S. Appl. No. 16/542,418, filed Aug. 16, 2019, 5 pages.
Notice of Allowance dated Nov. 23, 2020, issued in connection with U.S. Appl. No. 16/403,077, filed May 3, 2019, 6 pages.
Notice of Allowance dated Oct. 23, 2020, issued in connection with U.S. Appl. No. 16/555,846, filed Aug. 29, 2019, 5 pages.
Notice of Allowance dated Jul. 24, 2020, issued in connection with U.S. Appl. No. 16/665,415, filed Oct. 28, 2019, 12 pages.
Notice of Allowance dated Jan. 25, 2021, issued in connection with U.S. Appl. No. 17/129,670, filed Dec. 21, 2020, 10 pages.
Notice of Allowance dated Oct. 27, 2020, issued in connection with U.S. Appl. No. 16/555,832, filed Aug. 29, 2019, 5 pages.
Notice of Allowance dated Mar. 3, 2021, issued in connection with U.S. Appl. No. 16/403,077, filed May 3, 2019, 6 pages.
Notice of Allowance dated Mar. 3, 2021, issued in connection with U.S. Appl. No. 17/078,382, filed Oct. 23, 2020, 9 pages.
Notice of Allowance dated Mar. 31, 2020, issued in connection with U.S. Appl. No. 16/538,629, filed Aug. 12, 2019, 9 pages.
Notice of Allowance dated Feb. 4, 2020, issued in connection with U.S. Appl. No. 16/416,619, filed May 20, 2019, 7 pages.
Notice of Allowance dated Feb. 5, 2021, issued in connection with U.S. Appl. No. 16/827,143, filed Mar. 23, 2020, 9 pages.
Notice of Allowance dated Aug. 6, 2020, issued in connection with U.S. Appl. No. 16/564,684, filed Sep. 9, 2019, 8 pages.

(56) References Cited

OTHER PUBLICATIONS

Notice of Allowance dated Jun. 8, 2020, issued in connection with U.S. Appl. No. 16/658,896, filed Oct. 21, 2019, 8 pages.
Notice of Allowance dated Apr. 9, 2020, issued in connection with U.S. Appl. No. 16/416,593, filed May 20, 2019, 9 pages.
Notice of Allowance dated Jun. 9, 2020, issued in connection with U.S. Appl. No. 15/966,534, filed Apr. 30, 2018, 16 pages.
*Sonos, Inc.* v. *Google LLC,* WDTX Case No. 6:20-cv-00881, Google's Answer and Counterclaims; dated Jan. 8, 2021, 39 pages.
Yamaha DME Designer 3.0 Owner's Manual; Copyright 2008, 501 pages.
Non-Final Office Action dated Mar. 10, 2017, issued in connection with U.S. Appl. No. 14/997,868, filed Jan. 18, 2016, 10 pages.
Non-Final Office Action dated Sep. 10, 2018, issued in connection with U.S. Appl. No. 15/056,553, filed Feb. 29, 2016, 8 pages.
Non-Final Office Action dated Apr. 11, 2017, issued in connection with U.S. Appl. No. 15/088,994, filed Apr. 1, 2016, 13 pages.
Non-Final Office Action dated Apr. 11, 2017, issued in connection with U.S. Appl. No. 15/089,004, filed Apr. 1, 2016, 9 pages.
Non-Final Office Action dated Oct. 11, 2017, issued in connection with U.S. Appl. No. 15/480,265, filed Apr. 5, 2017, 8 pages.
Non-Final Office Action dated Oct. 11, 2018, issued in connection with U.S. Appl. No. 15/856,791, filed Dec. 28, 2017, 13 pages.
Non-Final Office Action dated Sep. 12, 2016, issued in connection with U.S. Appl. No. 14/811,587, filed Jul. 28, 2015, 24 pages.
Non-Final Office Action dated Jul. 13, 2016, issued in connection with U.S. Appl. No. 14/940,779, filed Nov. 13, 2015, 16 pages.
Non-Final Office Action dated Dec. 14, 2016, issued in connection with U.S. Appl. No. 14/481,505, filed Sep. 9, 2014, 19 pages.
Non-Final Office Action dated Mar. 14, 2017, issued in connection with U.S. Appl. No. 15/096,827, filed Apr. 12, 2016, 12 pages.
Non-Final Office Action dated May 14, 2019, issued in connection with U.S. Appl. No. 15/955,545, filed Apr. 17, 2018, 15 pages.
Non-Final Office Action dated Oct. 14, 2015, issued in connection with U.S. Appl. No. 14/216,325, filed Mar. 17, 2014, 7 pages.
Non-Final Office Action dated May 15, 2018, issued in connection with U.S. Appl. No. 15/806,126, filed Nov. 7, 2017, 17 pages.
Non-Final Office Action dated Jun. 16, 2017, issued in connection with U.S. Appl. No. 15/005,496, filed Jan. 25, 2016, 15 pages.
Non-Final Office Action dated Nov. 16, 2018, issued in connection with U.S. Appl. No. 15/996,878, filed Jun. 4, 2018, 8 pages.
Non-Final Office Action dated Dec. 18, 2018, issued in connection with U.S. Appl. No. 16/011,402, filed Jun. 18, 2018, 10 pages.
Non-Final Office Action dated Feb. 18, 2016, issued in connection with U.S. Appl. No. 14/644,136, filed Mar. 10, 2015, 10 pages.
Non-Final Office Action dated Jun. 18, 2019, issued in connection with U.S. Appl. No. 15/005,496, filed Jan. 25, 2016, 15 pages.
Non-Final Office Action dated Sep. 19, 2017, issued in connection with U.S. Appl. No. 15/056,553, filed Feb. 29, 2016, 7 pages.
Non-Final Office Action dated Apr. 2, 2018, issued in connection with U.S. Appl. No. 15/872,979, filed Jan. 16, 2018, 6 pages.
Non-Final Office Action dated Aug. 2, 2017, issued in connection with U.S. Appl. No. 15/298,115, filed Oct. 19, 2016, 22 pages.
Non-Final Office Action dated Apr. 20, 2017, issued in connection with U.S. Appl. No. 15/005,853, filed Jan. 25, 2016, 8 pages.
Non-Final Office Action dated Jul. 20, 2016, issued in connection with U.S. Appl. No. 14/682,182, filed Apr. 9, 2015, 13 pages.
Non-Final Office Action dated Jun. 20, 2017, issued in connection with U.S. Appl. No. 15/207,682, filed Jul. 12, 2016, 17 pages.
Non-Final Office Action dated Dec. 21, 2018, issued in connection with U.S. Appl. No. 16/181,213, filed Nov. 5, 2018, 13 pages.
Non-Final Office Action dated Jun. 21, 2016, issued in connection with U.S. Appl. No. 14/678,248, filed Apr. 3, 2015, 10 pages.
Non-Final Office Action dated Jun. 21, 2019, issued in connection with U.S. Appl. No. 16/181,865, filed Nov. 6, 2018, 12 pages.
Non-Final Office Action dated Nov. 21, 2014, issued in connection with U.S. Appl. No. 13/536,493, filed Jun. 28, 2012, 20 pages.
Non-Final Office Action dated Jun. 22, 2018, issued in connection with U.S. Appl. No. 15/217,399, filed Jul. 22, 2016, 33 pages.
Non-Final Office Action dated Oct. 22, 2019, issued in connection with U.S. Appl. No. 16/416,619, filed May 20, 2019, 12 pages.
Non-Final Office Action dated Jan. 23, 2019, issued in connection with U.S. Appl. No. 16/113,032, filed Aug. 27, 2018, 8 pages.
Non-Final Office Action dated May 24, 2019, issued in connection with U.S. Appl. No. 16/401,981, filed May 2, 2019, 14 pages.
Non-Final Office Action dated Oct. 25, 2016, issued in connection with U.S. Appl. No. 14/864,506, filed Sep. 24, 2015, 9 pages.
Non-Final Office Action dated Sep. 26, 2018, issued in connection with U.S. Appl. No. 15/229,693, filed Aug. 5, 2016, 25 pages.
Non-Final Office Action dated Dec. 27, 2017, issued in connection with U.S. Appl. No. 15/357,520, filed Nov. 21, 2016, 28 pages.
Non-Final Office Action dated Feb. 27, 2018, issued in connection with U.S. Appl. No. 14/864,393, filed Sep. 24, 2015, 19 pages.
Non-Final Office Action dated Feb. 27, 2018, issued in connection with U.S. Appl. No. 15/718,556, filed Sep. 28, 2017, 19 pages.
Non-Final Office Action dated Jul. 27, 2016, issued in connection with U.S. Appl. No. 14/696,014, filed Apr. 24, 2015, 11 pages.
Non-Final Office Action dated Mar. 27, 2017, issued in connection with U.S. Appl. No. 15/211,835, filed Jul. 15, 2016, 30 pages.
Non-Final Office Action dated Mar. 27, 2018, issued in connection with U.S. Appl. No. 15/785,088, filed Oct. 16, 2017, 11 pages.
Non-Final Office Action dated Jul. 28, 2016, issued in connection with U.S. Appl. No. 14/884,001, filed Oct. 15, 2015, 8 pages.
Non-Final Office Action dated Nov. 28, 2017, issued in connection with U.S. Appl. No. 15/673,170, filed Aug. 9, 2017, 7 pages.
Non-Final Office Action dated Sep. 28, 2018, issued in connection with U.S. Appl. No. 15/588,186, filed May 5, 2017, 12 pages.
Non-Final Office Action dated Sep. 28, 2018, issued in connection with U.S. Appl. No. 15/595,519, filed May 15, 2017, 12 pages.
Non-Final Office Action dated Mar. 29, 2018, issued in connection with U.S. Appl. No. 15/716,313, filed Sep. 26, 2017, 16 pages.
Non-Final Office Action dated Aug. 30, 2019, issued in connection with U.S. Appl. No. 16/115,525, filed Aug. 28, 2018, 13 pages.
Non-Final Office Action dated May 30, 2017, issued in connection with U.S. Appl. No. 15/478,770, filed Apr. 4, 2017, 9 pages.
Non-Final Office Action dated May 31, 2019, issued in connection with U.S. Appl. No. 16/185,906, filed Nov. 9, 2018, 7 pages.
Non-Final Office Action dated Nov. 6, 2018, issued in connection with U.S. Appl. No. 15/235,598, filed Aug. 12, 2016, 13 pages.
Non-Final Office Action dated Feb. 7, 2019, issued in connection with U.S. Appl. No. 15/859,311, filed Dec. 29, 2017, 9 pages.
European Patent Office, Extended Search Report dated Apr. 26, 2017, issued in connection with European Application No. 15765548.1, 10 pages.
European Patent Office, Office Action dated Nov. 12, 2018, issued in connection with European Application No. 17000460.0, 6 pages.
European Patent Office, Office Action dated Jun. 13, 2017, issued in connection with European patent application No. 17000484.0, 10 pages.
European Patent Office, Office Action dated Dec. 15, 2016, issued in connection with European Application No. 15766998.7, 7 pages.
European Patent Office, Summons to Attend Oral Proceedings mailed on Nov. 15, 2018, issued in connection with European Application No. 16748186.0, 57 pages.
European Patent Office, Summons to Attend Oral Proceedings mailed on Sep. 24, 2019, issued in connection with European Application No. 17000460.0, 5 pages.
Ex Parte Quayle Office Action mailed on Apr. 15, 2019, issued in connection with U.S. Appl. No. 15/235,598, filed Aug. 12, 2016, 7 pages.
Final Office Action dated Dec. 2, 2019, issued in connection with U.S. Appl. No. 15/005,496, filed Jan. 25, 2016, 19 pages.
Final Office Action dated Apr. 3, 2017, issued in connection with U.S. Appl. No. 14/678,248, filed Apr. 3, 2015, 22 pages.
Final Office Action dated Jul. 13, 2017, issued in connection with U.S. Appl. No. 14/726,921, filed Jun. 1, 2015, 10 pages.
Final Office Action dated Jun. 13, 2017, issued in connection with U.S. Appl. No. 14/481,505, filed Sep. 9, 2014, 22 pages.
Final Office Action dated Feb. 14, 2019, issued in connection with U.S. Appl. No. 15/005,496, filed Jan. 25, 2016, 16 pages.
Final Office Action dated Feb. 14, 2019, issued in connection with U.S. Appl. No. 15/217,399, filed Jul. 22, 2016, 37 pages.

(56) References Cited

OTHER PUBLICATIONS

Final Office Action dated Oct. 14, 2016, issued in connection with U.S. Appl. No. 14/682,182, filed Apr. 9, 2015, 16 pages.
Final Office Action dated Oct. 17, 2016, issued in connection with U.S. Appl. No. 14/678,248, filed Apr. 3, 2015, 22 pages.
Final Office Action dated Apr. 18, 2017, issued in connection with U.S. Appl. No. 14/678,263, filed Apr. 3, 2015, 16 pages.
Final Office Action dated Apr. 18, 2018, issued in connection with U.S. Appl. No. 15/056,553, filed Feb. 29, 2016, 8 pages.
Final Office Action dated Dec. 18, 2014, issued in connection with U.S. Appl. No. 13/340,126, filed Dec. 29, 2011, 12 pages.
Final Office Action dated Jan. 19, 2017, issued in connection with U.S. Appl. No. 14/940,779, filed Nov. 13, 2015, 15 pages.
Final Office Action dated Apr. 2, 2018, issued in connection with U.S. Appl. No. 15/166,241, filed May 26, 2016, 14 pages.
Final Office Action dated Oct. 21, 2016, issued in connection with U.S. Appl. No. 14/696,014, filed Apr. 24, 2015, 13 pages.
Final Office Action dated Jan. 25, 2018, issued in connection with U.S. Appl. No. 15/005,496, filed Jan. 25, 2016, 17 pages.
Final Office Action dated Mar. 25, 2019, issued in connection with U.S. Appl. No. 15/856,791, filed Dec. 28, 2017, 11 pages.
Final Office Action dated Oct. 28, 2019, issued in connection with U.S. Appl. No. 16/181,865, filed Nov. 6, 2018, 17 pages.
Final Office Action dated Apr. 3, 2018, issued in connection with U.S. Appl. No. 15/235,598, filed Aug. 12, 2016, 12 pages.
Final Office Action dated Feb. 5, 2018, issued in connection with U.S. Appl. No. 15/229,693, filed Aug. 5, 2016, 21 pages.
Final Office Action dated Mar. 5, 2019, issued in connection with U.S. Appl. No. 15/056,553, filed Feb. 29, 2016, 9 pages.
Final Office Action dated Dec. 6, 2018, issued in connection with U.S. Appl. No. 15/806,126, filed Nov. 7, 2017, 18 pages.
Final Office Action dated Apr. 9, 2019, issued in connection with U.S. Appl. No. 15/229,693, filed Aug. 5, 2016, 33 pages.
First Action Interview Office Action dated Mar. 3, 2017, issued in connection with U.S. Appl. No. 14/726,921, filed Jun. 1, 2015, 9 pages.
First Action Interview Office Action dated Jul. 12, 2016, issued in connection with U.S. Appl. No. 14/481,514, filed Sep. 9, 2014, 10 pages.
First Action Interview Office Action dated Jun. 30, 2016, issued in connection with U.S. Appl. No. 14/481,505, filed Sep. 9, 2014, 9 pages.
First Action Interview Pilot Program Pre-Interview Communication dated Apr. 5, 2017, issued in connection with U.S. Appl. No. 14/793,190, filed Jul. 7, 2015, 4 pages.
First Action Interview Pilot Program Pre-Interview Communication dated Oct. 7, 2015, issued in connection with U.S. Appl. No. 14/216,306, filed Mar. 17, 2014, 5 pages.
First Action Interview Pilot Program Pre-Interview Communication dated Feb. 16, 2016, issued in connection with U.S. Appl. No. 14/681,465, filed Apr. 8, 2015, 5 pages.
Gonzalez et al., "Simultaneous Measurement of Multichannel Acoustic Systems," J. Audio Eng. Soc., 2004, pp. 26-42, vol. 52, No. 1/2.
International Bureau, International Preliminary Report on Patentability, dated Sep. 24, 2015, issued n connection with International Application No. PCT/US2014/030560, filed on Mar. 17, 2014, 7 pages.
International Bureau, International Preliminary Report on Patentability dated Sep. 29, 2016, issued in connection with International Application No. PCT/US2015/020993, filed on Mar. 17, 2015, 8 pages.
International Bureau, International Preliminary Report on Patentability dated Sep. 29, 2016, issued in connection with International Application No. PCT/US2015/021000, filed on Mar. 17, 2015, 9 pages.
International Bureau, International Preliminary Report on Patentability, dated Aug. 9, 2018, issued in connection with International Application No. PCT/US2017/014596, filed on Jan. 23, 2017, 11 pages.
International Searching Authority, International Preliminary Report on Patentability dated Mar. 23, 2017, issued in connection with International Patent Application No. PCT/US2015/048944, filed on Sep. 8, 2015, 8 pages.
International Searching Authority, International Preliminary Report on Patentability dated Oct. 24, 2017, issued in connection with International Application No. PCT/US2016/028994 filed on Apr. 22, 2016, 7 pages.
International Searching Authority, International Search Report and Written Opinion dated Jul. 4, 2016, issued in connection with International Application No. PCT/US2016/028994, filed on Apr. 22, 2016, 12 pages.
International Searching Authority, International Search Report and Written Opinion dated Jul. 5, 2016, issued in connection with International Application No. PCT/US2016/028997, filed on Apr. 22, 2016, 13 pages.
International Searching Authority, International Search Report and Written Opinion dated Jun. 5, 2015, issued in connection with International Application No. PCT/US2015/021000, filed on Mar. 17, 2015, 12 pages.
International Searching Authority, International Search Report and Written Opinion dated Oct. 12, 2016, issued in connection with International Application No. PCT/US2016/041179 filed on Jul. 6, 2016, 9 pages.
International Searching Authority, International Search Report and Written Opinion dated Jun. 16, 2015, issued in connection with International Application No. PCT/US2015/020993, filed on Mar. 17, 2015, 11 pages.
International Searching Authority, International Search Report and Written Opinion dated Nov. 18, 2015, issued in connection with International Application No. PCT/US2015/048954, filed on Sep. 8, 2015, 11 pages.
International Searching Authority, International Search Report and Written Opinion dated Oct. 18, 2016, issued in connection with International Application No. PCT/US2016/043116, filed on Jul. 20, 2016, 14 pages.
International Searching Authority, International Search Report and Written Opinion dated Oct. 18, 2016, issued in connection with International Application No. PCT/US2016/043840, filed on Jul. 25, 2016, 14 pages.

* cited by examiner

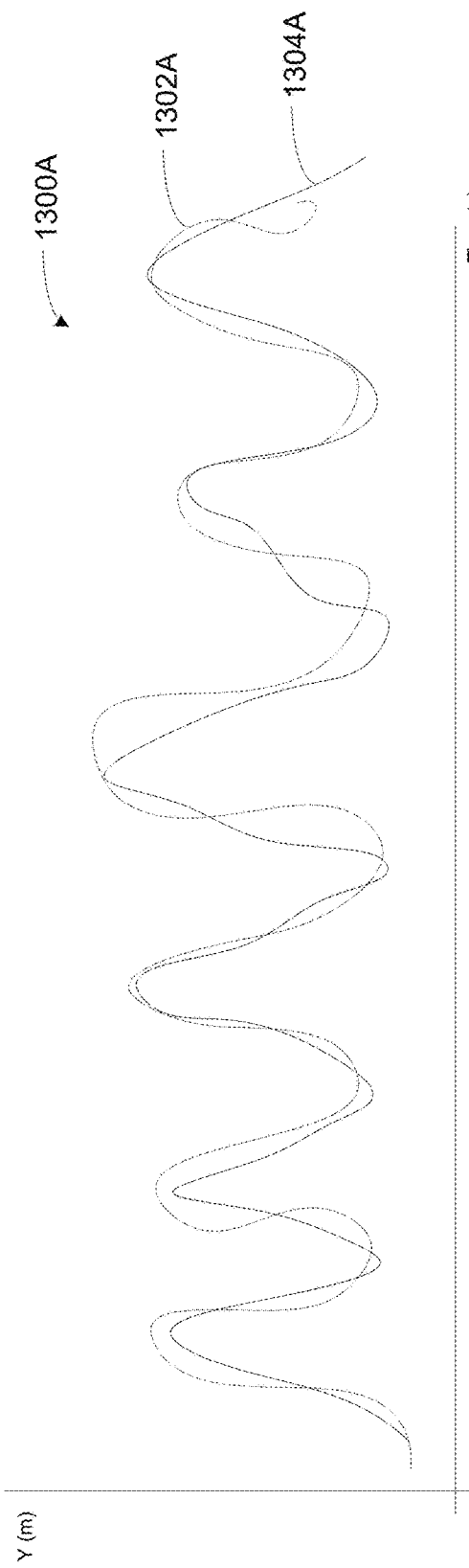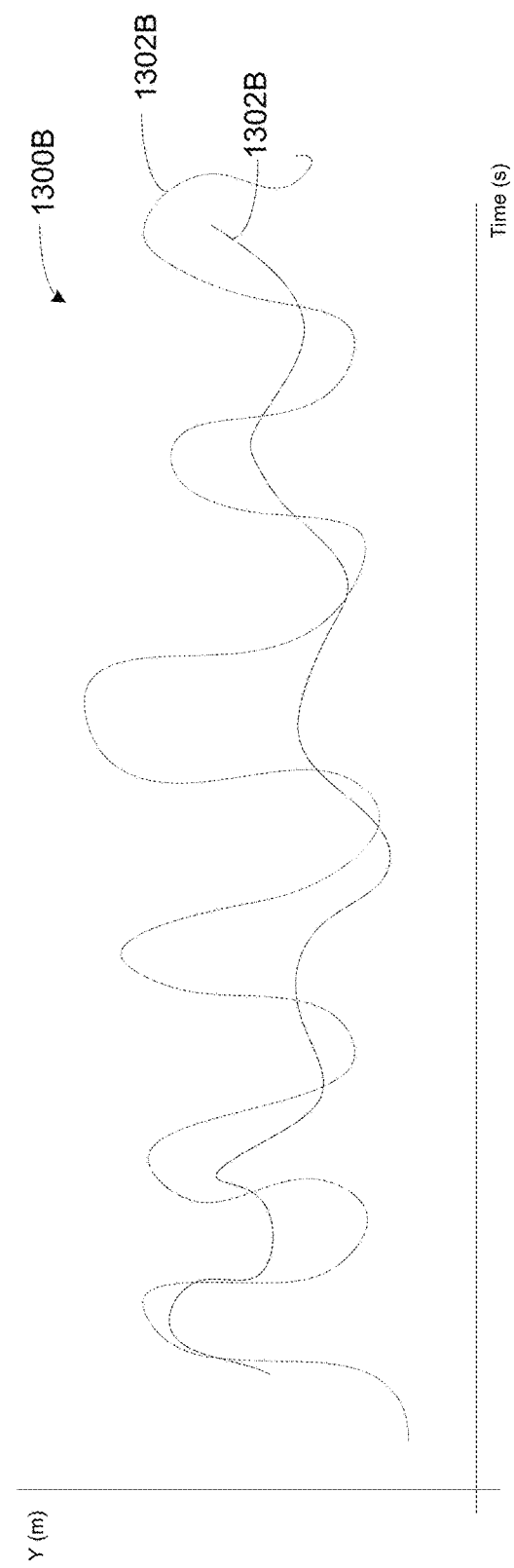
FIGURE 13A
FIGURE 13B

VALIDATION OF AUDIO CALIBRATION USING MULTI-DIMENSIONAL MOTION CHECK

CROSS REFERENCE TO RELATED APPLICATIONS

This application claims priority under 35 U.S.C. § 120 to, and is a continuation of, U.S. non-provisional patent application Ser. No. 15/996,878, filed on Jun. 4, 2018, entitled "Validation of Audio Calibration Using Multi-Dimensional Motion Check," which is incorporated herein by reference in its entirety.

U.S. non-provisional patent application Ser. No. 15/996,878 claims priority under 35 U.S.C. § 120 to, and is a continuation of, U.S. non-provisional patent application Ser. No. 15/480,265, filed on Apr. 5, 2017, entitled "Validation of Audio Calibration Using Multi-Dimensional Motion Check" and issued as U.S. Pat. No. 9,992,597 on Jun. 5, 2018, which is incorporated herein by reference in its entirety.

U.S. non-provisional patent application Ser. No. 15/480,265 claims priority under 35 U.S.C. § 120 to, and is a continuation of, U.S. non-provisional patent application Ser. No. 14/864,506, filed on Sep. 24, 2015, entitled "Validation of Audio Calibration Using Multi-Dimensional Motion Check" and issued as U.S. Pat. No. 9,693,165 on Jun. 27, 2017, which is incorporated herein by reference in its entirety.

U.S. non-provisional patent application Ser. No. 14/864,506 claims priority to U.S. provisional Patent Application No. 62/220,176, filed on Sep. 17, 2015, entitled "Validation of Audio Calibration Using Multi-Dimensional Motion Check," which is also incorporated herein by reference in its entirety.

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from a plethora of sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

FIG. 13A illustrates relatively closely correlated motion data in two directions;

FIG. 13B illustrates relatively loosely correlated motion data in two directions;

Figure 1:
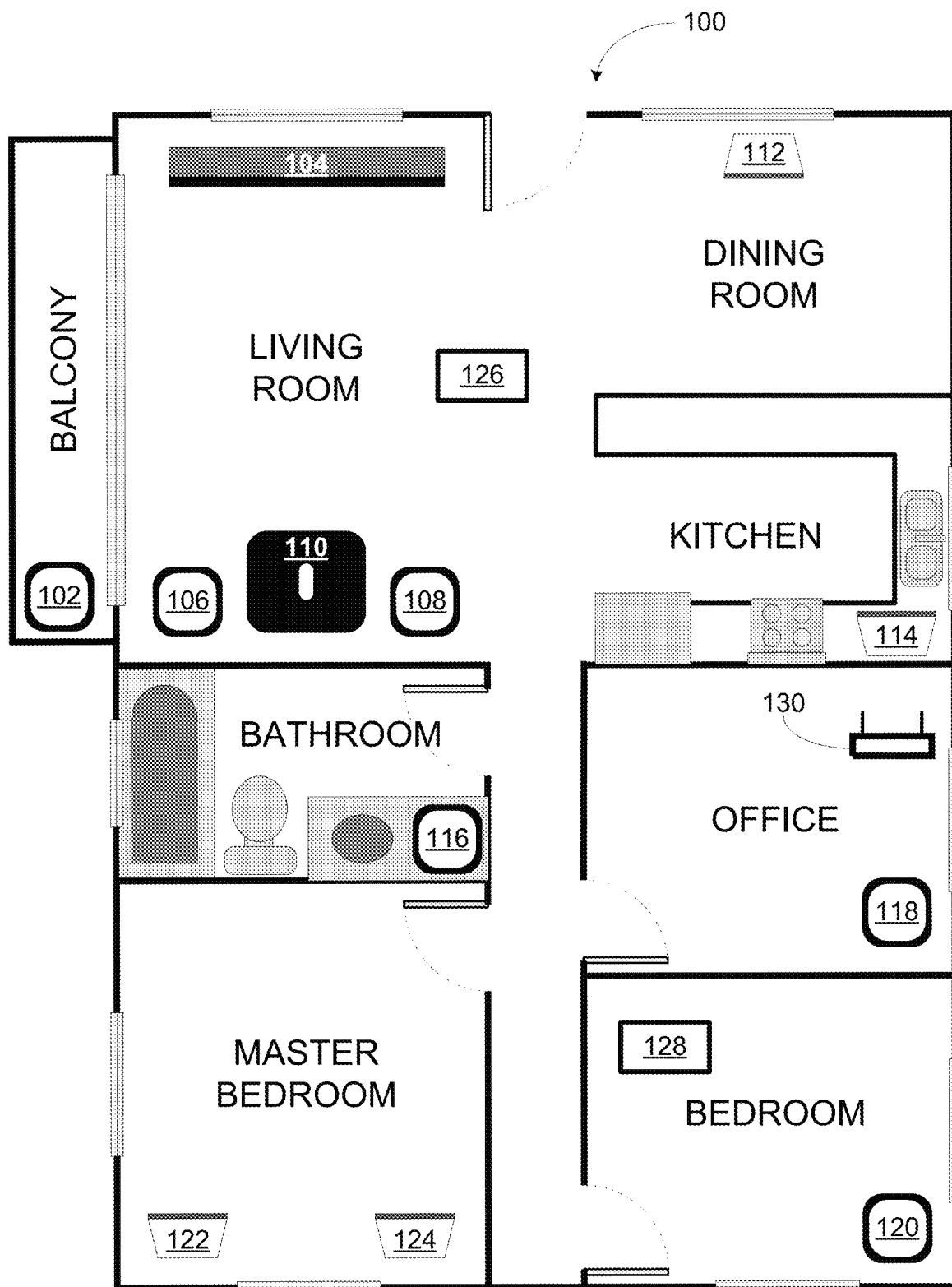
FIG. 1 shows an example media playback system configuration in which certain embodiments may be practiced.

The drawings are for the purpose of illustrating example embodiments, but it is understood that the inventions are not limited to the arrangements and instrumentality shown in the drawings.

DETAILED DESCRIPTION

I. Overview

Embodiments described herein may involve, inter alia, detecting one or more error conditions that might occur when calibrating one or more playback devices of a media playback system. Calibration of playback devices may improve performance of those playback devices in a given environment, as the calibration may address acoustical characteristics of the environment. Acoustics can vary by environment—some environments may negatively affect sound transmission by boosting or cutting certain frequencies across the frequency response of the playback device. For instance, while a symphony hall may have near-perfect acoustics so as to not substantially affect sound as it propagates; many homes or offices do not provide such ideal conditions for sound transmission.

Some calibration procedures contemplated herein involve a recording device detecting and analyzing sound waves (e.g., one or more calibration sounds) emitted by one or more playback devices in a given listening environment. By analyzing sound waves that have propagated through the listening environment, a media playback system may determine how the listening environment is affecting sound emitted by the playback device and perhaps also how to offset the effect of the listening environment on the playback device. For example, the media playback system may determine a calibration profile that adjusts the frequency response of a playback device to offset the acoustics of the environment.

Possible error conditions that might occur during calibration include insufficient motion of the recording device through the listening environment while the one or more playback devices emit the calibration sound. Since acoustics can vary from physical location to physical location within the listening environment, example calibration procedures contemplated herein may suggest moving the recording device through the listening environment while the one or more playback devices emit the calibration sound. In some examples, the calibration sound may include periodic repetitions of a calibration tone, which may produce "samples" representing the acoustics of the environment at respective locations. Such data produced by a moving microphone may provide a more complete representation of an environment's acoustics than would a stationary microphone. Other example error conditions include a background noise level, a quality of the audio signal detected by the microphone, distance between the one or more playback devices and the recording device, or speed of the recording device, among other possibilities.

During calibration, the recording device may determine whether sufficient translation occurred in one or more dimensions (e.g., vertical, horizontal, and/or radial (relative to the playback device(s)). A calibration in which the recording device was sufficiently translated in such dimensions may be considered valid (perhaps given that other error conditions were not present). Conversely, a lack of sufficient translation in one or more of these dimensions may be considered invalid. In circumstances in which one or more error conditions are detected, the media playback system may prompt to repeat the calibration, or may attempt to remedy the calibration, depending on the type of error condition.

Data indicating motion of the recording device (or of the microphone itself, in embodiments where the microphone is separate from the recording device) may be generated from different sources. In some embodiments, sensors on the recording device (or on the microphone and coupled to the recording device) may generate data indicating acceleration of the recording device. Cameras or other types of vision-based systems on the recording device or playback device may produce video data indicating movement of the recording device through the environment. As another example, acoustic data may indicate radial distance from the recording device to the playback device (e.g., by indicating propagation delay of audio from the playback device to the recording device, or vice versa).

In some cases, motion data indicating movement of the recording device in two dimensions can be used to determine motion of the recording device in a third dimension. For instance, a sensor may generate motion data indicating movement of the recording device in a vertical direction (perhaps from an accelerometer that generates data relative to gravity) and acoustic data may indicate movement of the recording device in a radial direction from the playback device. By cross-correlating such data, a media playback system may determine a horizontal motion parameter representing motion of the recording device in a third dimension (i.e., horizontal motion). Where that horizontal motion parameter exceeds a correlation threshold (indicating that the motion in the first two dimensions are not well-correlated), the media playback system can infer that sufficient horizontal translation across the environment occurred during the calibration period.

Upon identifying an error condition, the calibration process may be suspended, and the media playback system may display a message indicating that the calibration process has been suspended. In some cases, the media playback system may indicate the identified error condition that triggered the suspension of the calibration process. The media playback system may further indicate suggestions on how to remedy the identified error condition. For instance, the message may indicate that insufficient vertical translation occurred, and that this error condition can be avoided by moving the recording device by a greater amount or during a longer portion of the calibration period. The media playback system may further display selectable options to restart the calibration process or to cancel the calibration process. Other examples are also possible.

As indicated above, the present discussions involve identifying one or more error conditions during calibration of one or more playback devices. In one aspect, a recording device is provided. The recording device includes a microphone, one or more processors, and a tangible data storage having stored therein instructions executable by the one or more processors to cause the recording device to perform operations. The operations include receiving an indication that a playback device is emitting a calibration sound in a given environment during a calibration period. The operations also include recording, via the microphone, sound data that includes the emitted calibration sound and receiving motion data indicating movement of the recording device during emission of the calibration sound. The operations further include determining that sufficient vertical translation of the recording device occurred during the calibration period. The operations include determining that sufficient horizontal translation of the recording device occurred during the calibration period and based on determining that sufficient translation of the recording device occurred during the calibration period in vertical and horizontal directions, applying a calibration based on the detected calibration sound to an audio stage of the playback device.

In another aspect, a method is provided. The method involves receiving an indication that one or more playback devices are emitting a calibration sound in a given environment during a calibration period. The method also involves recording the emitted calibration sound and receiving motion data indicating movement of the control device during emission of the calibration sound. The method further involves identifying a first component of the motion data that indicates movement of the control device in a vertical direction and one or more second components of the motion data that indicates movement of the control device in respective radial directions from the one or more playback devices. The method also involves determining one or more horizontal-motion parameters representing motion of the control device in a horizontal direction through the environment by cross-correlating the first component of the motion data indicating movement of the control device in a vertical direction with the one or more second components of the motion data indicating movement of the control device in respective radial directions from the one or more playback devices. The method involves determining that sufficient horizontal translation of the control device occurred during the calibration period by determining that at least one of the horizontal motion parameters representing motion in the horizontal direction through the environment exceeds a correlation threshold. The method also involves sending a message indicating that sufficient translation of the control device occurred during the calibration period.

In another aspect, a non-transitory computer-readable medium is provided. The non-transitory computer-readable medium has stored thereon instructions executable by a computing device to perform operations. The operations include receiving an indication that a playback device is emitting a calibration sound in a given environment during a calibration period. The operations also include recording, via the microphone, sound data that includes the emitted calibration sound and receiving motion data indicating movement of the recording device during emission of the calibration sound. The operations further include determining that sufficient vertical translation of the recording device occurred during the calibration period. The operations include determining that sufficient horizontal translation of the recording device occurred during the calibration period and based on determining that sufficient translation of the recording device occurred during the calibration period in vertical and horizontal directions, applying a calibration based on the detected calibration sound to an audio stage of the playback device.

In yet another aspect, a control device is provided. The control device includes one or more processors, and a tangible data storage having stored therein instructions executable by the one or more processors to cause the recording device to perform operations. The operations include receiving motion data indicating movement of a recording device while the recording device was recording a calibration sound emitted by one or more playback devices in a given environment during a calibration period. The operations also include determining that sufficient vertical translation of the recording device occurred during the calibration period and that sufficient horizontal translation of the recording device occurred during the calibration period. The operations further include sending a message indicating that sufficient translation of the recording device occurred during the calibration period in vertical and horizontal directions.

In an aspect, a method is provided. The method involves receiving motion data indicating movement of a recording device while the recording device was recording a calibration sound emitted by one or more playback devices in a given environment during a calibration period. The method also involves determining that sufficient vertical translation of the recording device occurred during the calibration period and that sufficient horizontal translation of the recording device occurred during the calibration period. The method further involves sending a message indicating that sufficient translation of the recording device occurred during the calibration period in vertical and horizontal directions.

In another aspect, a non-transitory computer-readable medium is provided. The non-transitory computer-readable medium has stored thereon instructions executable by a computing device to perform operations. The operations include receiving motion data indicating movement of a recording device while the recording device was recording a calibration sound emitted by one or more playback devices in a given environment during a calibration period. The operations also include determining that sufficient vertical translation of the recording device occurred during the calibration period and that sufficient horizontal translation of the recording device occurred during the calibration period. The operations further include sending a message indicating that sufficient translation of the recording device occurred during the calibration period in vertical and horizontal directions.

While some examples described herein may refer to functions performed by given actors such as "users" and/or other entities, it should be understood that this is for purposes of explanation only. The claims should not be interpreted to require action by any such example actor unless explicitly required by the language of the claims themselves.

It will be understood by one of ordinary skill in the art that this disclosure includes numerous other embodiments.

II. Example Operating Environment

FIG. 1 shows an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102-124, control devices 126 and 128, and a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
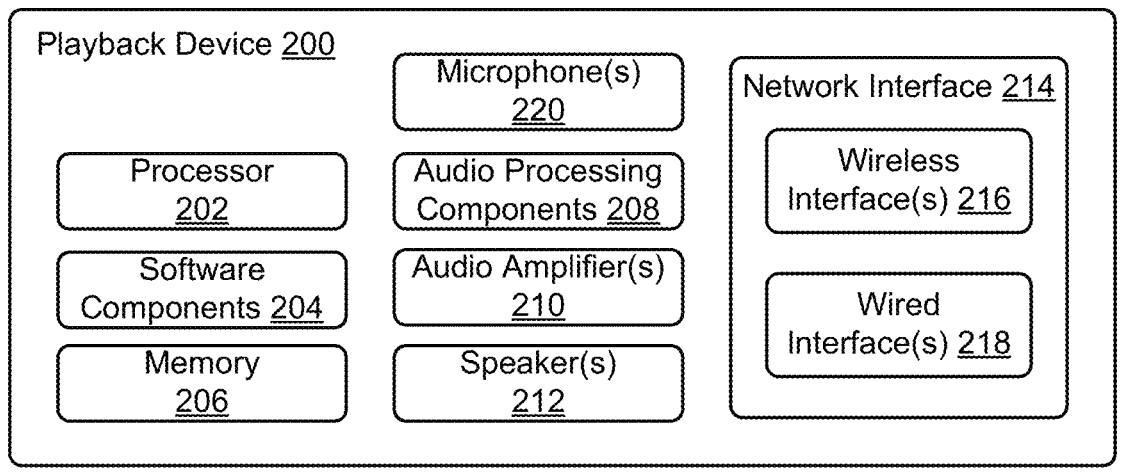
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, microphone(s) 220, and a network interface 214 including wireless interface(s) 216 and wired interface(s) 218. In one case, the playback device 200 may not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more of digital-to-analog converters (DAC), analog-to-digital converters (ADC), audio preprocessing components, audio enhancement components, and a digital signal processor (DSP), among others. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The microphone(s) 220 may include an audio sensor configured to convert detected sounds into electrical signals. The electrical signal may be processed by the audio processing components 208 and/or the processor 202. The microphone(s) 220 may be positioned in one or more orientations at one or more locations on the playback device 200. The microphone(s) 220 may be configured to detect sound within one or more frequency ranges. In one case, one or more of the microphone(s) 220 may be configured to detect sound within a frequency range of audio that the playback device 200 is capable or rendering. In another case, one or more of the microphone(s) 220 may be configured to detect sound within a frequency range audible to humans. Other examples are also possible.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being playing by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
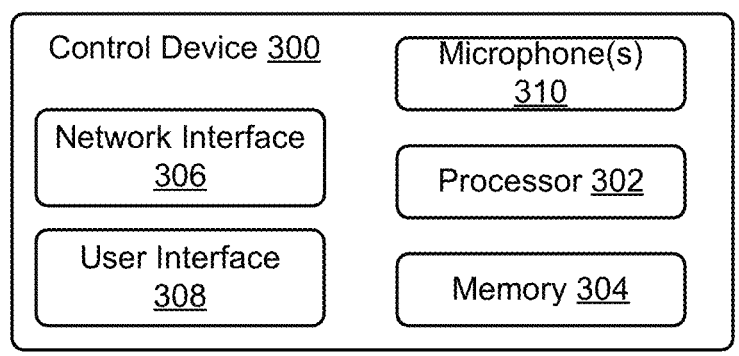
FIG. 3 shows a functional block diagram of an example control device.

FIG. 3 shows a functional block diagram of an example control device 300 that may be configured to be one or both of the control devices 126 and 128 of the media playback system 100. As shown, the control device 300 may include a processor 302, memory 304, a network interface 306, a user interface 308, and microphone(s) 310. In one example, the control device 300 may be a dedicated controller for the media playback system 100. In another example, the control device 300 may be a network device on which media playback system controller application software may be installed, such as for example, an iPhone™, iPad™ or any other smart phone, tablet or network device (e.g., a networked computer such as a PC or Mac™).

The processor 302 may be configured to perform functions relevant to facilitating user access, control, and configuration of the media playback system 100. The memory 304 may be configured to store instructions executable by the processor 302 to perform those functions. The memory 304 may also be configured to store the media playback system controller application software and other data associated with the media playback system 100 and the user.

The microphone(s) 310 may include an audio sensor configured to convert detected sounds into electrical signals. The electrical signal may be processed by the processor 302. In one case, if the control device 300 is a device that may also be used as a means for voice communication or voice recording, one or more of the microphone(s) 310 may be a microphone for facilitating those functions. For instance, the one or more of the microphone(s) 310 may be configured to detect sound within a frequency range that a human is capable of producing and/or a frequency range audible to humans. Other examples are also possible.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Figure 4:
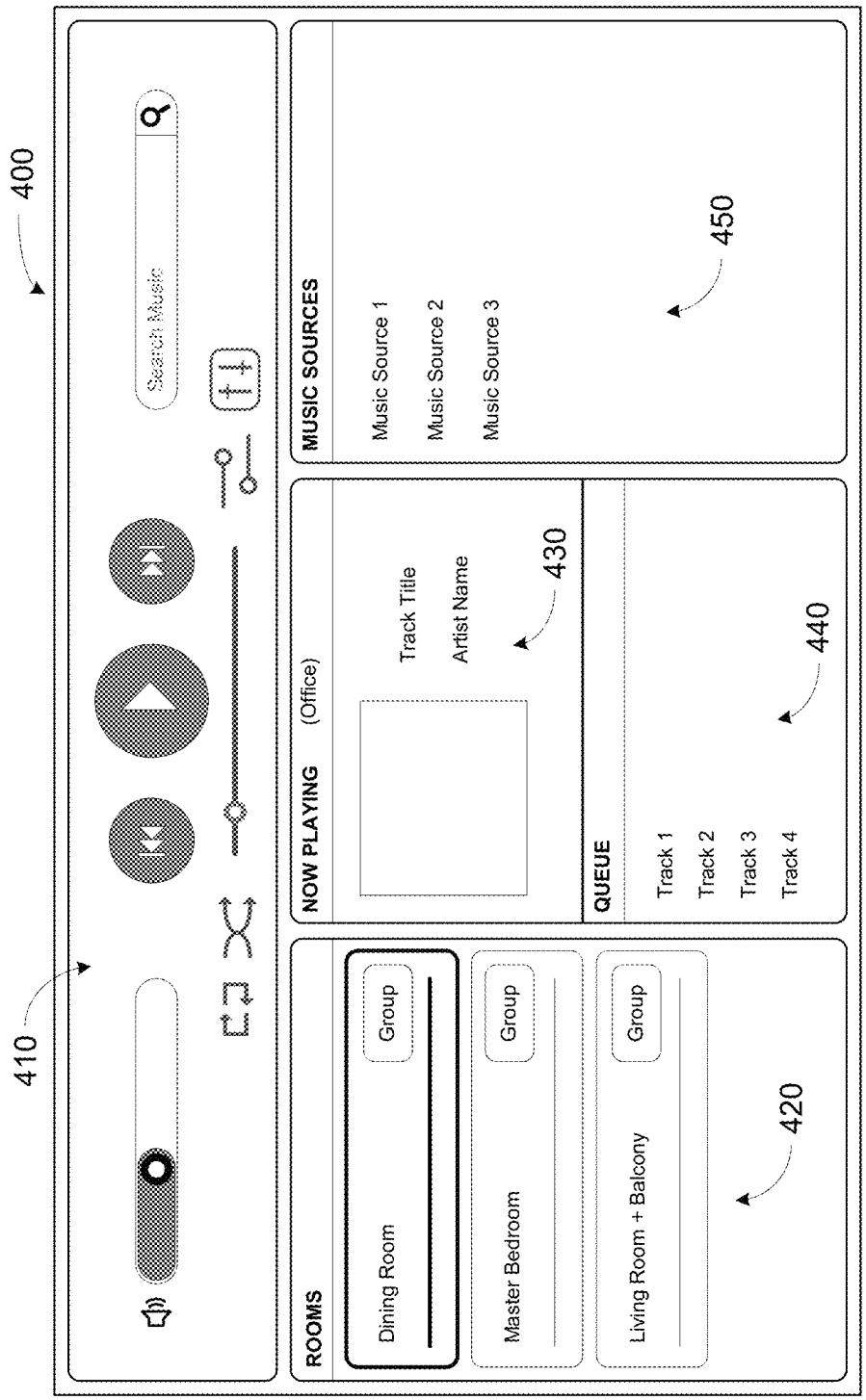
FIG. 4 shows an example controller interface.

The user interface 308 of the control device 300 may be configured to facilitate user access and control of the media playback system 100, by providing a controller interface such as the controller interface 400 shown in FIG. 4. The controller interface 400 includes a playback control region 410, a playback zone region 420, a playback status region 430, a playback queue region 440, and an audio content sources region 450. The user interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the user interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the effected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g. according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

The above discussions relating to playback devices, control devices, playback zone configurations, and media item sources provide only some examples of operating environments within which functions and methods described below may be implemented. Other operating environments and configurations of media playback systems, playback devices, and network devices not explicitly described herein may also be applicable and suitable for implementation of the functions and methods.

III. Example Playback Device Calibration

As previously discussed, one or more playback devices, such as one or more of the playback devices 102-124 of FIG. 1, may be configured to provide a particular audio experience, and may be calibrated to provide that audio experience regardless of position(s) of the one or more playback devices within the playback environment. As noted above, example calibration procedures contemplated herein may involve a microphone of a recording device detecting and analyzing sound waves (e.g., one or more calibration sounds) emitted by the playback device(s) under calibration.

A calibration interface may be provided on a network device to guide a user through the calibration process. Example interfaces are described in U.S. non-provisional patent application Ser. No. 14/696,014, filed on Apr. 24, 2015, entitled "Speaker Calibration," which is incorporated herein in its entirety. Further example interfaces are described in U.S. non-provisional patent application Ser. No. 14/826,873, filed on Aug. 14, 2015, entitled "Speaker Calibration User Interface," which is also incorporated herein in its entirety. Alternatively, calibration may be performed automatically between the network device and the playback device(s), and may be conducted with or without interaction by a user of the network device. The network device may be a device the user can use to control the one or more playback devices. For instance, the network device may be similar to the control devices 126 and 128 of FIG. 1, and 300 of FIG. 3. The calibration interface may be a component of a controller interface, such as the controller interface 400 of FIG. 4 that is provided on the network device for controlling the one or more playback devices.

Once the one or more playback devices have been positioned within the playback environment, the calibration interface may cause the one or more playback devices to play a calibration tone. Particular calibration tones may facilitate example calibration procedures contemplated here. Example calibration tones are described in U.S. non-provisional patent application Ser. No. 14/805,140, filed on Jul. 21, 2015, entitled "Hybrid Test Tone for Space-Averaged Room Audio Calibration Using A Moving Microphone," which is incorporated herein in its entirety.

The network device may be positioned so as to receive the audio data related to the playback of the calibration tone by the one or more playback devices. In one example, the interface may prompt the user to move the network device within the playback environment while the calibration tone is playing. For example, in one more specific case, the interface may instruct the user to traverse areas within the playback environment where enjoyment of audio playback by the one or more playback devices may typically occurs. In another example, the interface may instruct the user to move the network device as close as possible to opposing border regions of the playback environment, such as walls in a room. In one case, the calibration interface may provide a video demonstrating how a user may traverse a playback environment. The video may be shown to the user via the interface before the calibration tone is played or while the calibration tone is playing. Examples of a moving microphone during calibration are described in U.S. non-provisional patent application Ser. No. 14/481,511, filed on Sep.

9, 2014, entitled "Playback Device Calibration," which is incorporated herein in its entirety.

In some examples, multiple playback devices may be calibrated concurrently. Further, some playback devices may include multiple playback channels (e.g., a tweeter and a woofer, or multiple speakers configured to act as a channel), which may be calibrated concurrently. Example techniques to facilitate calibration of multiple playback channels are described in U.S. non-provisional patent application Ser. No. 14/805,340, filed on Jul. 21, 2015, entitled "Concurrent Multi-Loudspeaker Calibration with a Single Measurement," which is incorporated herein in its entirety.

In one example, the calibration tone may be played for a predetermined duration of time, and the user may be allocated the predetermined duration of time to traverse the areas in the playback environment. In another example, the amount of time that the calibration tone is played back may be modified based on information sensed by the network device regarding the motion or path of the network device. For instance, if the network device determines that that the network device has started to backtrack across a previously traversed path, the network device may determine that no additional measurement of the calibration tone is necessary and may cause playback of the calibration tone by the one or more playback devices to be terminated.

In a further example, the amount of time that the calibration tone is played back may be modified based on the detected audio signal. For instance, if the network device determines that additional samples of the audio signal detected in the playback environment will not improve the determination of the characterization of the playback environment, the network device may determine that no additional measurement of calibration tone is necessary and may cause playback of the calibration tone by the one or more playback devices to be terminated. Other examples are also possible.

The predetermined duration of time may vary depending on a type and/or size of the playback environment. For instance, prior to causing the one or more playback device to play the calibration tone, the calibration interface may prompt the user to indicate a type and/or a size of the playback environment. Based on the user's input, the interface may identify an appropriate predetermined duration of time to play the calibration tone based on the indicated type and/or size of the playback environment. In one case, the provided demonstration video may also vary based on the indicated type and/or size of the playback environment. In another example, the user may be instructed to move between opposing border areas of the playback environment. The approximate size of the playback environment may be determined based on a detected motion and/or path of the network device, so that the playback time of the calibration tone may be adjusted (extended or shortened) based on the detected motion and/or detected path of motion of the user. For example, if it is detected that the user is still moving the network device, the calibration tone playback may be extended. In another example, if it is detected that the user is moving the device in a direction that indicates that the playback environment is larger than previously assumed and that the user needs more time to properly move the device to cover the entire or a substantial portion of the playback environment, the playback time may be extended.

While the one or more playback devices is playing the calibration tone, a microphone of the network device, such as microphone 310 of the control device 300, may detect an audio signal. A processor of the network device, such as the processor 302 of the control device 300, may receive a stream of audio data from the microphone as the audio signal is detected. The processor may then process the received audio data to determine audio characteristics of the playback environment. For instance, a linear frequency response associated with the playback environment may be determined based on the audio data.

A signal processing algorithm may then be determined based on the audio characteristics. For instance, equalization parameters may be determined such that when the equalization parameters are applied by the one or more playback device when playing audio content, a particular audio experience may be created. In other words, a calibration profile may be applied to a playback device to offset acoustic characteristics of the environment.

IV. Example Techniques for Identifying Playback Device-Calibration Error Conditions As indicated previously, one or more error conditions may negatively effect the effectiveness of the calibration of the one or more playback devices. In one example, the one or more error conditions may be identified during playback of the calibration tone by the one or more playback device and detecting of the audio signal by the microphone of the network device. In one case, calibration of the one or more playback devices may be suspended and/or terminated as soon as an error condition is identified, rather than after completing playback of the calibration tone and detecting of the audio signal for the entire predetermined duration of time.

Figure 5:
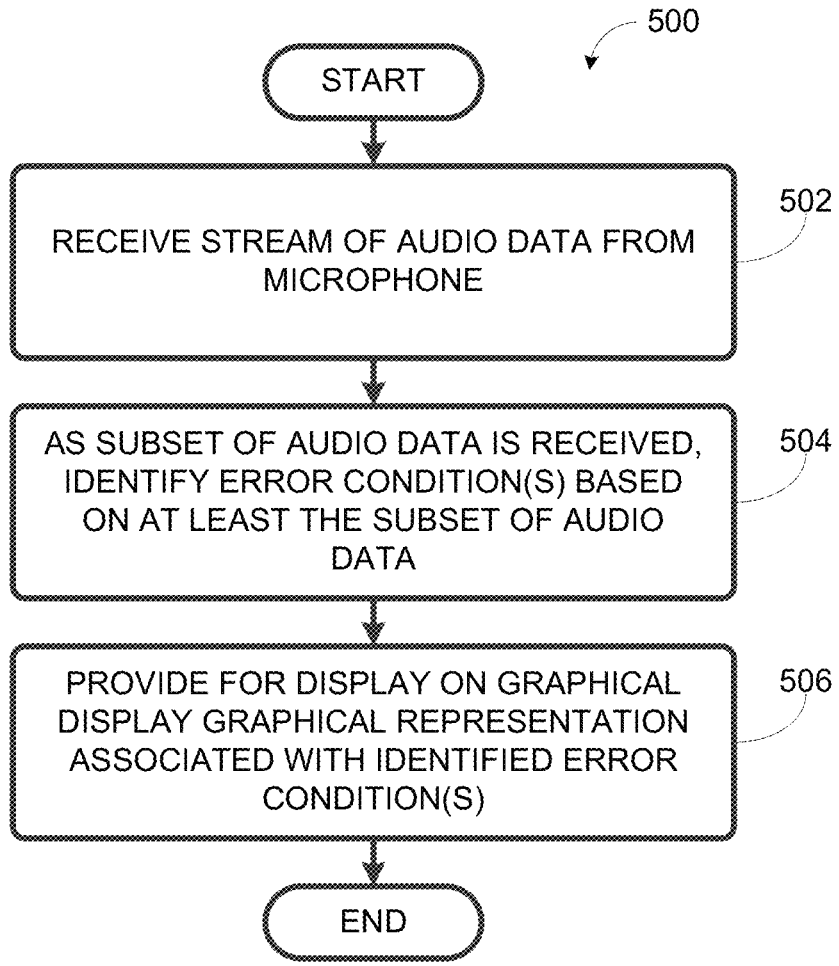
FIG. 5 shows a flow diagram of an example method for identifying error conditions.

FIG. 5 shows a flow diagram of example implementation 500 for identifying playback device-calibration error conditions. Implementation 500 presents example techniques that can be implemented within an operating environment involving, for example, the media playback system 100 of FIG. 1, one or more of the playback device 200 of FIG. 2, and one or more of the control device 300. In one example, the implementation 500 may be performed in whole or in part by a computing device in communication with a media playback system. For instance, the implementation 500 may be performed by one or more of the control devices 126 and 128 of FIG. 1. In such cases, one or more of the control devices 126 and 128 may have installed thereon a software application that includes instructions executable by a processor of a respective control device to cause the respective control device to perform the functions of implementation 500.

Implementation 500 may include one or more operations, functions, or actions as illustrated by one or more of blocks 502-506. Although the respective blocks are illustrated in sequential order, these blocks may also be performed in parallel, and/or in a different order than those described herein. Also, the various blocks may be combined into fewer blocks, divided into additional blocks, and/or removed based upon the desired implementation. In addition, for the implementation 500 and other processes and methods disclosed herein, the flowcharts show functionality and operation of only a few possible implementations of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive.

The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the implementation 500 and other processes and methods disclosed herein, each block may represent circuitry that is wired to perform the specific logical functions in the process.

As shown in FIG. 5, the implementation 500 involves at block 502, receiving a stream of audio data from a microphone; at block 504, as a subset of the audio data is received, identifying based on at least the subset of audio data, an error condition; and at block 506, providing for display on a graphical display, a graphical representation associated with the identified error condition.

a. Receive a Stream of Audio Data from a Microphone

As indicated above, block 502 involves receiving a stream of audio data from a microphone. In one example, the microphone may be a part of a network device providing a calibration interface to guide a user through the process of calibrating one or more playback devices. In another example, the microphone may be a microphone external to the network device and communicatively coupled to the network device. In discussions herein, physical movement of the network device may involve concurrent physical movement of the microphone.

In one example, the network device, prior to the microphone receiving the stream of audio data, may send to at least one of the one or more playback devices, a message to cause the at least one playback device to play a calibration tone. In one case, the calibration interface may prompt the user to indicate when the user is ready to begin movement of the network device within the playback environment. For instance, the calibration interface may provide on a graphical display of the network device, a selectable icon (i.e. a "start calibration" icon) that the user can select to indicate that the user is ready.

The network device, in response to receiving an input indicating that the user is ready to begin movement of the network device within the playback environment, may accordingly send the message to the at least one of the one or more playback device. In one case, the at least one of the one or more playback device may then coordinate playback of the calibration tone by each of the one or more playback devices.

As the calibration tone is being played by the one or more playback devices, the microphone may detect an audio signal including at least a portion of the calibration tone being played and any ambient noise present in the playback environment. The microphone may then, as the audio signal is detected, sample the detected audio signal and stream the resulting audio data to a processor of the network device.

As such, the stream of audio data may be received while a calibration tone is being played by the one or more playback devices and as the microphone detects and samples the audio signal. The audio data may accordingly include (i) an audio signal component corresponding to the at least a portion of the calibration tone being played, and (ii) a background noise component corresponding to audio elements other than the calibration tone.

Figure 6:
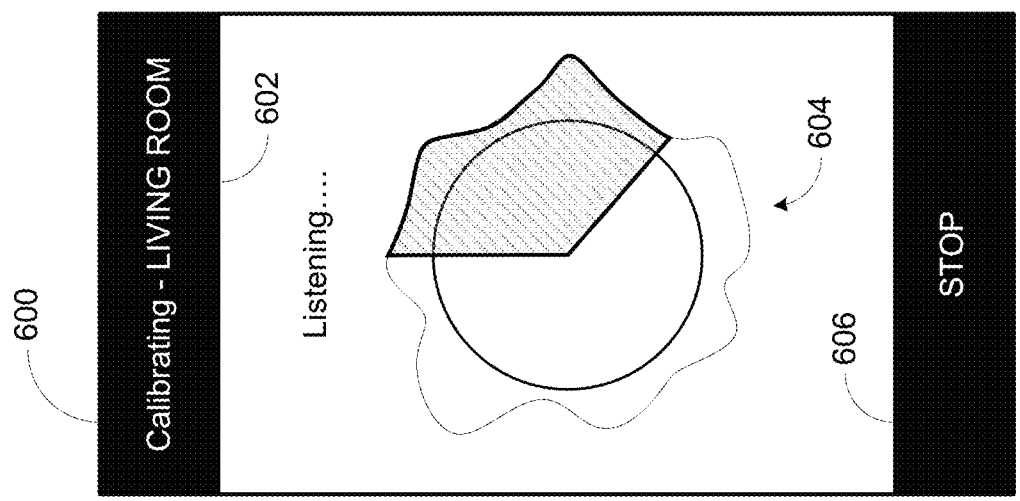
FIG. 6 shows an illustrative playback device calibration user interface.

FIG. 6 shows an illustrative playback device calibration user interface 600. As shown, the user interface 600 includes a graphical representation 602 indicating that one or more playback devices in a "LIVING ROOM" zone is being calibrated. Referring to FIG. 1, playback devices, 104, 106, 108, and 110 may be the one or more playback devices that are being calibrated. The user interface 600 further includes a graphical representation 604 that may indicate that detecting of an audio signal for calibration purposes is taking place. The graphical representation 604 may also show a status of the audio signal recording process, such as an amount of the predetermined duration of time for detecting of the calibration tone that has elapsed and/or that is remaining. The graphical representation 604 may also show a representation of the audio signal that has been detected thus far. Also shown in the user interface 600 is a selectable icon 606 that may be selected to terminate the calibration process. One having ordinary skill in the art will appreciate that the user interface 600 of FIG. 6 is for illustration purposes and that other examples are also possible.

b. As a Subset of the Audio Data is Received, Identify Based on at Least the Subset of Audio Data, an Error Condition At block 504, the implementation 500 involves as a subset of the audio data is received, identifying based on at least the subset of audio data, an error condition. In one example, the subset of the audio data may be a single audio data sample. In another example, the subset of the audio data may be a plurality of audio data samples. In one case, identifying the error condition based on at least the subset of the audio data may involve identifying the error condition based on the subset of the audio data and one or more preceding subsets of the audio data in the stream of audio data.

In some cases, an error condition may be statistically insignificant. For instance, if a noise impulse occurs during calibration, the audio data indicating the noise impulse may be automatically discarded as an outlier during processing of the audio data. In such a case, the network device may determine that calibration of the one or more playback devices may continue. In other cases, the error condition may be statistically significant and audio data indicating the error condition may not be discarded as an outlier. In such case, the network device may, responsive to identifying the error condition, determine that calibration of the one or more playback devices is to be suspended, and accordingly send to at least one of the one or more playback devices, a message to cause the at least one playback device to stop playing the calibration tone.

In one example, a plurality of predetermined error conditions and corresponding characteristics of the predetermined error conditions may be defined. In such a case, an identification of the error condition at block 504 may involve identifying the error condition from the plurality of predetermined error conditions based on identifying the corresponding characteristics. In one case, only a single error condition is identified based on the at least a subset of the audio data. In another case, multiple error conditions may be identified based on the at least a subset of audio data.

As indicated above, the calibration interface may prompt the user to move the network device within the playback environment while the calibration tone is playing. The calibration interface may further prompt the user to move the network device up and down within the network device. Movement of the network device while the microphone of the network device detects the calibration tone may provide a more comprehensive acoustic characteristic of the playback environment to be captured in the stream of audio data. In addition, movement of the network device across areas in the playback environment where enjoyment of audio playback by the one or more playback devices typically occurs while the microphone of the network device detects the calibration tone may further provide an acoustic characteristic of the playback environment that is more pertinent to how the playback environment is used during audio playback by the one or more playback devices in the playback environment.

During the movement of the network device, a level of the audio signal detected by the microphone of the network device may be expected to have a certain degree of variation and a certain rate of variation. As such, if a determination is made that a level of the audio signal component represented in the subset of audio data is less a minimum threshold, an error condition of insufficient movement of the network device may be identified. Alternatively, if a determination is made that a rate of variation in a level of the audio signal component represented in the subset of audio data is above a maximum threshold, an error condition of overly-fast movement of the network device may be identified.

In one example, the network device may further include a motion sensor, such as an accelerometer, among other examples. In such a case, the processor of the network device may further activate the motion sensor during calibration of the one or more playback device, and in particular, while the calibration tone is being played by the one or more playback device and while the network device is expected to be moved within the playback environment. In this instance, the processor of the network device may further be configured to receive a stream of motion data. The motion data may indicate a range of movement and/or a rate of movement of the network device within the playback environment. The range of movement and rate of movement of the network device may involve both lateral movement of the network device within the playback environment and up and down movement of the network device.

As a subset of the motion data is received by the motion sensor, the processor of the network device may identify one or more error conditions based on at least the subset of motion data. As such, the error conditions of insufficient movement or overly-fast movement may alternatively or additionally be identified based on at least a subset of the motion data from the motion sensor. More specifically, when movement detected by the motion sensor is below a minimum threshold, an error message of insufficient movement is generated, and/or when a rate of movement detected by the motion sensor is above a maximum threshold, an error message of overly fast movement is generated.

In one example, a range of movement that is considered insufficient movement may be determined based on an expected size of the listening environment. In one case, a threshold range of movement of 1.2 meters may be determined for an average listening environment. In this case, if a range of movement detected by the motion sensor is less than 1.2 meters, the error condition of insufficient movement may be identified.

In another example, the expected range of movement may vary depending on an indicated type of listening environment, and accordingly the threshold range of movement may vary based on the indicated type of listening environment. For instance, if a user indicates during the calibration process that the calibration is to be performed for a living room, the threshold range of movement may be 3 meters. The user may indicate that the calibration is performed for a living room by naming the playback zone associated with the playback device(s) being calibrated as "Living Room." On the other hand, if a user indicates during the calibration process that the calibration is to be performed for a bathroom, the threshold range of movement may be 1 meter. Other examples are also possible.

Other examples for determining and/or identifying the threshold range of movement may also be possible. For instance, the network device and/or the playback devices may play an impulse signal and estimate a size of the listening environment based on a detection by the network device and/or playback devices of the reflected signal. Other examples are also possible.

A playback environment may involve one or more playback zones, and accordingly may include one or more playback devices associated with the one or more playback zones. Calibration of the one or more playback devices may be suitably performed within a particular playback zone associated with the one or more playback devices, rather than another playback zone or a playback environment that does not include the particular playback zone. In other words, referring to FIG. 1, playback devices 122 and 124 may be suitably calibrated for the master bedroom, and not the dining room.

In one example, if a determination is made that a level of the audio signal component represented in the subset of audio data has gradually decreased below a minimum threshold, an error condition of exceeding a threshold movement distance may be identified. In other words, the network device may have moved too far from the one or more playback devices, and outside of a suitable playback environment for the one or more playback devices.

Prior to playback of the calibration tone by the one or more playback devices being calibrated and detection of the audio signal by the microphone, the calibration interface may first determine whether a background noise level within the playback environment is suitable for calibration of the one or more playback devices in the playback environment. In one case, the calibration interface may provide a graphical representation of a noise-meter to indicate a noise level in the playback environment. If the noise level is above a suitable level, the calibration interface may prompt the user to attempt to reduce the noise level in the playback environment prior to calibrating the one or more playback devices. If the noise level of the playback environment is within suitable levels, the selectable icon that the user can select to indicate that the user is ready to move the network device within the playback environment may be displayed on the calibration interface. A selection of the selectable icon may then cause the playback of the calibration tone by the one or more playback devices and detection of the audio signal by the microphone of the network device to begin.

During playback of the calibration tone by the one or more playback devices and detection of the audio signal by the microphone of the network device, background noise levels in the playback environment may change. In one example, if a determination is made that a level of the background noise component represented in the subset of audio data is above a maximum threshold level, an error condition of unsuitable background noise may be identified. In one instance, such an error condition may occur if a burst of sound is present in the playback environment during detection of the audio signal by the microphone.

In another example, if a determination is made that a ratio between the audio signal component and the background noise component (signal to noise ratio, or "SNR") represented in the subset of audio data is below a minimum threshold, an error condition of overly high background noise may be identified. In one instance, such an error condition may occur if the background noise in the playback environment has gradually increased beyond a suitable level.

Different network devices may have different microphone configurations. In one example, if the microphone of the network device is on the bottom of the network device (relative to a standard operating orientation of the network device), the calibration interface may, prior to the playback of the calibration tone by the one or more playback device and detection of the audio signal by the microphone, prompt the user to flip the network device upside-down such that the microphone is on the top of the network device. Such an orientation of the network device, and consequently the microphone may cause the microphone of the network device to be suitably oriented for optimal detection of the audio signal that includes at least a portion of the calibration tone played by the one or more playback devices being calibrated.

In one example, if a determination is made that a level of the audio signal component represented in the subset of audio data has substantially (or drastically) decreased below a minimum threshold, an error condition of having an improperly orientated network device (and microphone) may be identified. For instance, a user may have instinctively and/or accidentally flipped the phone back to standard operating orientation of the network device, in which the microphone may not be optimally oriented for detecting the audio signal that includes at least a portion of the calibration tone played by the one or more playback devices being calibrated. In one case, motion data from the motion sensor may also be used to determine an orientation of the network device. Accordingly, the error conditions of an improperly oriented network device may alternatively or additionally be identified based on at least a subset of the motion data from the motion sensor.

In addition to an improperly orientated network device (and microphone), a microphone that is even partially obstructed may also negatively affect the effectiveness of the calibration of the one or more playback devices using the network device. In one case, a protective and/or decorative case for the network device may obstruct a portion of the microphone. In another case, lint from clothing or other debris from regular use of the network device may also obstruct a portion of the microphone.

In one example, if a determination is made that the audio signal component represented in the subset of audio data is substantially different from a reference audio signal, an error condition of an obstructed microphone may be identified. In one case, the reference audio signal may be representative of the calibration tone. For instance, the reference audio signal may be generated by convoluting the calibration tone audio signal with a frequency response of the microphone. In one case, a substantial difference between the subset of the audio data and the reference audio signal may include a substantially attenuated audio signal represented in the audio data, relative to the reference audio signal.

The network device used for calibration of the one or more playback devices may also be used as a communication device, as such, during playback of the calibration tone by the one or more playback devices and while the microphone of the network device is detecting the audio signal, the network device may receive messages over a local area network and/or cellular network and may generate notifications in the form of audio signal and/or vibrations. The audio and/or vibrational notifications may also negatively affect the effectiveness of the calibration of the one or more playback devices. Accordingly, if a determination is made that the network device generated an audible or physical notification during playback of the calibration tone and detection of the audio signal, a corresponding error state may be identified.

As indicated above, one or more error conditions may be determined based on combinations of the received audio data and motion data. In one example, the network device may be configured to suspend calibration if ¼ of the received audio data indicates an SNR that is below an SNR threshold. In one case, as discussed previously, may be that the background noise level is too high.

In another case, however, the motion data corresponding to those ¼ of the received audio data may be further based on to identify the error condition. For instance, if ⅓ of the motion data corresponding to the ¼ of the received audio data indicates movement above a certain threshold, than an error condition of overly fast movement may be determined. In this case, the below-threshold SNR may result from increased noise from the overly fast movement (wind/draft over the microphone from the movement).

In another instance, if ¾ of the ¼ of the received audio data indicates an SNR that is below the SNR threshold despite corresponding motion data indicating an expected, below-threshold rate of movement, an error condition of too much background noise may be determined. Further in this case, if movement of the network device within the playback environment is faster than the threshold rate of movement, but the SNR of the received audio data remains above the SNR threshold, calibration may be allowed to continue and no error conditions may be identified. In other words, in this case, so long as the SNR of the received audio signal is above the SNR threshold, no error condition is identified. However, if the SNR of some of the received audio data (i.e. ¼, as discussed above) is below the SNR threshold, the motion data may be relied upon to determine whether the error condition relates to background noise or overly fast movement. Other examples are also possible.

Descriptions of the error conditions described above are for illustrative purposes and are not meant to be limiting. One having ordinary skill in the art will appreciate that other examples are also possible. For instance, characteristics may be determined for an error condition involving movement of the network device such that a piece of furniture or the user is between the one or more playback devices and the network device, for example, if the audio data falls below a predetermined threshold for a relatively short amount of time during the calibration procedure. Such an error condition may be identified if the determined characteristics are present in the at least a subset of the audio data.

Figure 7:
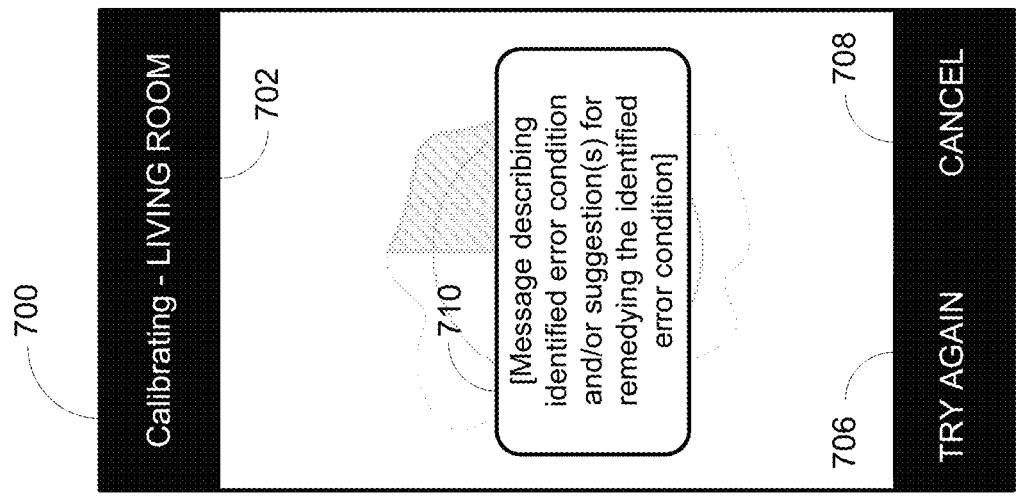
FIG. 7 shows an illustrative playback device calibration error condition user interface.

In addition, while the above examples involve identifying one or more error conditions based on a subset of audio data while the subset of audio data is received, one having ordinary skill in the art will appreciate that an alternative embodiment in which the one or more error conditions is determined after receiving of the audio data is complete, based on all the received audio data, is also possible. Other examples are also possible.

c. Provide for Display on a Graphical Display, a Graphical Representation Associated with the Identified Error Condition At block 506, the implementation 500 involves providing for display on a graphical interface, a graphical representation associated with the identified error condition. FIG. 7 shows an illustrative playback device calibration error condition user interface 700 that may be displayed on the graphical interface when an error condition has been identified. As shown, the user interface 700 includes a graphical representation 702 indicating that the displayed content on the interface 700 corresponds to the one or more playback devices in the LIVING ROOM zone.

The user interface 700 further includes a graphical representation 710 that may include a textual message describing an identified error condition and/or suggestions for remedying the error condition. The user interface 700 further includes selectable icons 706 and 708. Selectable icon 706 may be selected to try the calibration process again, and selectable icon 708 may be selected to terminate the calibration process. As shown, the graphical representation 710 may overlay a grayed or dimmed version of some or all of the graphical representation 604 of the user interface 600 of FIG. 6.

In one example, each error condition (i.e. in the plurality of predetermined error conditions) may have a corresponding textual message to be provided in the graphical representation 710. For instance, if the identified error condition relates to insufficient movement, an example textual message may be "To get a good measurement, make sure you're slowly moving your device up and down and walking all throughout your room. Please try again with more movement." In another instance, if the identified error condition relates to overly-fast movement, an example textual message may be "You were moving a little too fast to get a good measurement for tuning. Please try again, but move slower this time."

In one instance, if the identified error condition relates to background noise being above a threshold level, the example textual message may be "We couldn't get a good measurement for tuning. Please reduce background noise and try again." In such a case, the graphical representation 710 may also include a representation of a noise meter, allowing the user to see if the user sufficiently reduced the background noise level in the playback environment below the threshold level, before selecting the icon 706 to try again.

In another instance, if the identified error condition involves an obstructed microphone, the example textual message may be "If your device has a case, please remove it. Please also make sure your microphone is unobstructed and try again."

The example textual messages discussed herein are for illustrative purposes only and are not meant to be limiting. Further, one having ordinary skill in the art will appreciate that other examples are also possible.

In one example, multiple error conditions may be identified based on the at least a subset of the audio data. In one case, a most severe error condition from the multiple error conditions may be identified and a textual message corresponding to the most severe error condition may be displayed in the graphical representation 710. In another case, a subset of the multiple error conditions may be identified (i.e. top 3 most severe error conditions), and textual messages corresponding to the subset of the multiple error conditions may be displayed in the graphical representation 710. In yet another case, textual messages corresponding to each of the multiple error conditions may be displayed in the graphical representation 710. Other examples are also possible.

IV. Example Techniques to Validate Motion of a Microphone During Calibration As indicated previously, one or more error conditions may negatively affect the effectiveness of the calibration of the one or more playback devices. Such error conditions include improper motion of the microphone during calibration. Improper motion may include insufficient translation in one or more dimensions, as well as excessive or insufficient speed of translation.

In one example, the one or more error conditions may be detected during the calibration period (i.e., during playback of the calibration tone by the one or more playback device and detection of the audio signal by the microphone of the recording device. In one case, calibration of the one or more playback devices may be suspended and/or terminated when an error condition is identified, rather than after completing playback of the calibration tone and detecting of the audio signal for the entire calibration duration.

Figure 8:
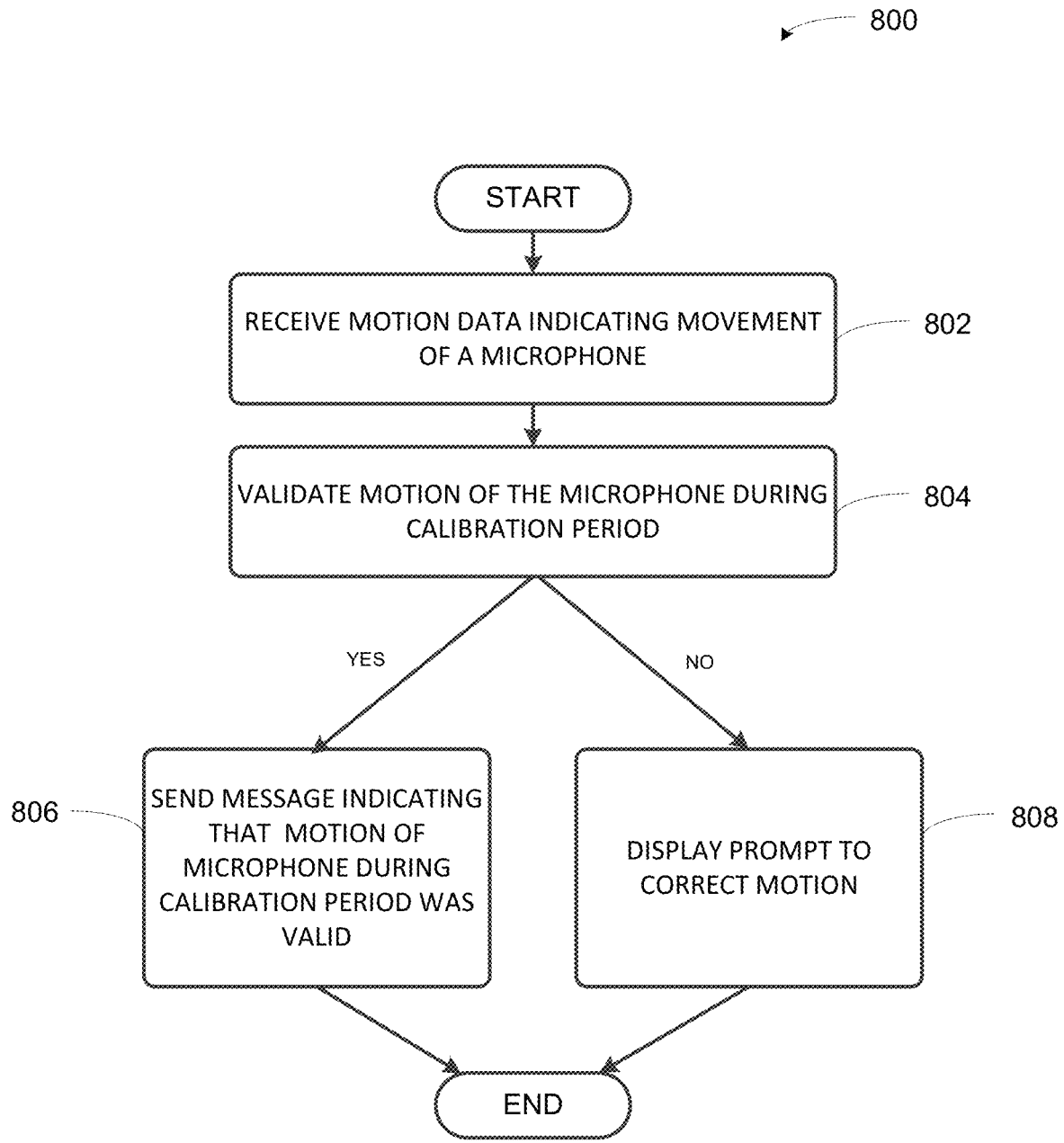
FIG. 8 shows a flow diagram of an example technique for validating motion of a microphone during calibration.

FIG. 8 shows a flow diagram of example implementation 800 to facilitate detection of certain error conditions. Implementation 800 presents example techniques that can be implemented within an operating environment involving, for example, the media playback system 100 of FIG. 1, one or more of the playback device 200 of FIG. 2, and one or more of the control device 300. In one example, the implementation 800 may be performed in whole or in part by a computing device in communication with a media playback system. For instance, the implementation 800 may be performed by one or more of the control devices 126 and 128 of FIG. 1. In such cases, one or more of the control devices 126 and 128 may have installed thereon a software application that includes instructions executable by a processor of a respective control device to cause the respective control device to perform the functions of implementation 800.

Implementation 800 may include one or more operations, functions, or actions as illustrated by one or more of blocks 802-808. Although the respective blocks are illustrated in sequential order, these blocks may also be performed in parallel, and/or in a different order than those described herein. Also, the various blocks may be combined into fewer blocks, divided into additional blocks, and/or removed based upon the desired implementation. In addition, for the implementation 800 and other processes and methods disclosed herein, the flowcharts show functionality and operation of only a few possible implementations of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive.

The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the implementation 800 and other processes and methods disclosed herein, each block may represent circuitry that is wired to perform the specific logical functions in the process.

a. Receive Motion Data Indicating Movement of a Microphone

At block 802, implementation 800 involves receiving motion data indicating movement of a microphone. For instance, a recording device may include a microphone and one or more sensors that generate date indicating movement of the recording device (e.g., an accelerometer, gyroscope, or inertial measurement unit). The recording device may receive motion data from these sensors. Alternatively, a processing device, such as a control device or playback device, may receive motion data from the recording device. In some cases, the recording device may be implemented as a control device (e.g., control device 300), which may also be the processing device. Yet further, in some cases, sensors on devices that are remote from the recording device (e.g., playback devices) may include remote tracking systems, such as vision (camera), infrared, or laser tracking systems that track motion of the recording device.

To illustrate, in an example calibration procedure, a recording device may receive an indication that one or more playback devices are emitting a calibration sound. Such an indication may be received by way of a selectable control that initiates calibration (possibly displayed on a calibration interface) or by way of a message from a playback device indicating that the playback device will begin emitting the calibration sound, among other examples. During emission of the calibration sound, the recording device may detect the calibration sound via a microphone and record microphone data representing the calibration sound to data storage.

Also during emission of the calibration sound, the recording device may also cause one or more sensors (e.g., an accelerometer, gyroscope, or inertial measurement unit) to generate motion data indicating movement of a microphone while the microphone is detecting the calibration sound. As noted above, a recording device that includes a microphone may be a part of a network device providing a calibration interface to guide a user through the process of calibrating one or more playback devices. In another example, the microphone may be a microphone external to a recording device and communicatively coupled to the recording device. Sensors may be mounted within the same device (e.g., the recording/network device) or housing (e.g., a microphone housing that is coupled to the recording device) as the microphone, such that motion detected by the sensors substantially represents motion of the microphone. In discussions herein, physical movement of the recording/network device may involve concurrent physical movement of the microphone.

Different sensors may generate different types of motion data. For example, accelerometers, gyroscopes, or inertial measurement units may generate data representing acceleration. Such acceleration data may include acceleration in three dimensions. In some examples, the acceleration data may indicate user acceleration relative to the recording device, as well as gravity acceleration relative to the calibration device, among other possible examples.

The microphone may also produce motion data. For example, propagation delay of audio from the one or more playback devices under calibration (and possibly other playback devices that are not under calibration but within range of the recording device) may indicate radial distance from each playback device to the microphone. Such radial distances may change over the calibration period as the microphone (and perhaps the recording device itself) is moved during the calibration period.

To illustrate, in one example, a calibration sound emitted by a given playback device may include a chirp that repeats at regular intervals. To determine distance between the microphone and a given playback device, a recording device may detect changes in the interval at which the chirp repeats, as small changes in the interval may represent changing propagation delay between the microphone and the playback device. As, in some cases, the microphone may detect both the emitted calibration sound and one or more reflections of that calibration sound, the recording device may identify the instance of the calibration sound that was detected as having the most sound intensity (i.e., the loudest), as the calibration sound will lose sound intensity as it reflects within the listening area.

Within the motion data, the processing device may identify one or more components that indicate motion in particular dimensions. For instance, within the motion data, the processing device may identify a component that indicates movement of the recording device in a vertical direction, possibly from the acceleration data relative to gravity, among other possible motion data. Such a component may ultimately be used to validate motion in the vertical direction, and perhaps in one or more additional dimensions. As another example, within the motion data, the processing device may identify a component that indicates movement of the recording device in a radial direction from the one or more playback devices, possibly from audio and timing data indicating changing propagation delays (and changing radius') between the microphone and each of the one or more playback devices.

Identifying a component may involve integrating the received motion data to determine other types of motion data. For instance, acceleration data relative to gravity may be integrated to determine velocity relative to gravity (e.g., upwards and downwards) and integrated around to determine distance. Given that an example calibration procedure suggests moving the microphone upwards and downwards during the calibration period, such a movement may be approximately sinusoidal relative to gravity (i.e. vertical) provided the microphone is moved per the calibration procedure. Conversely, if the microphone is not moved during the calibration procedure, the movement data may indicate a flat curve, which represents little change in the vertical direction over the calibration period.

Figure 9:
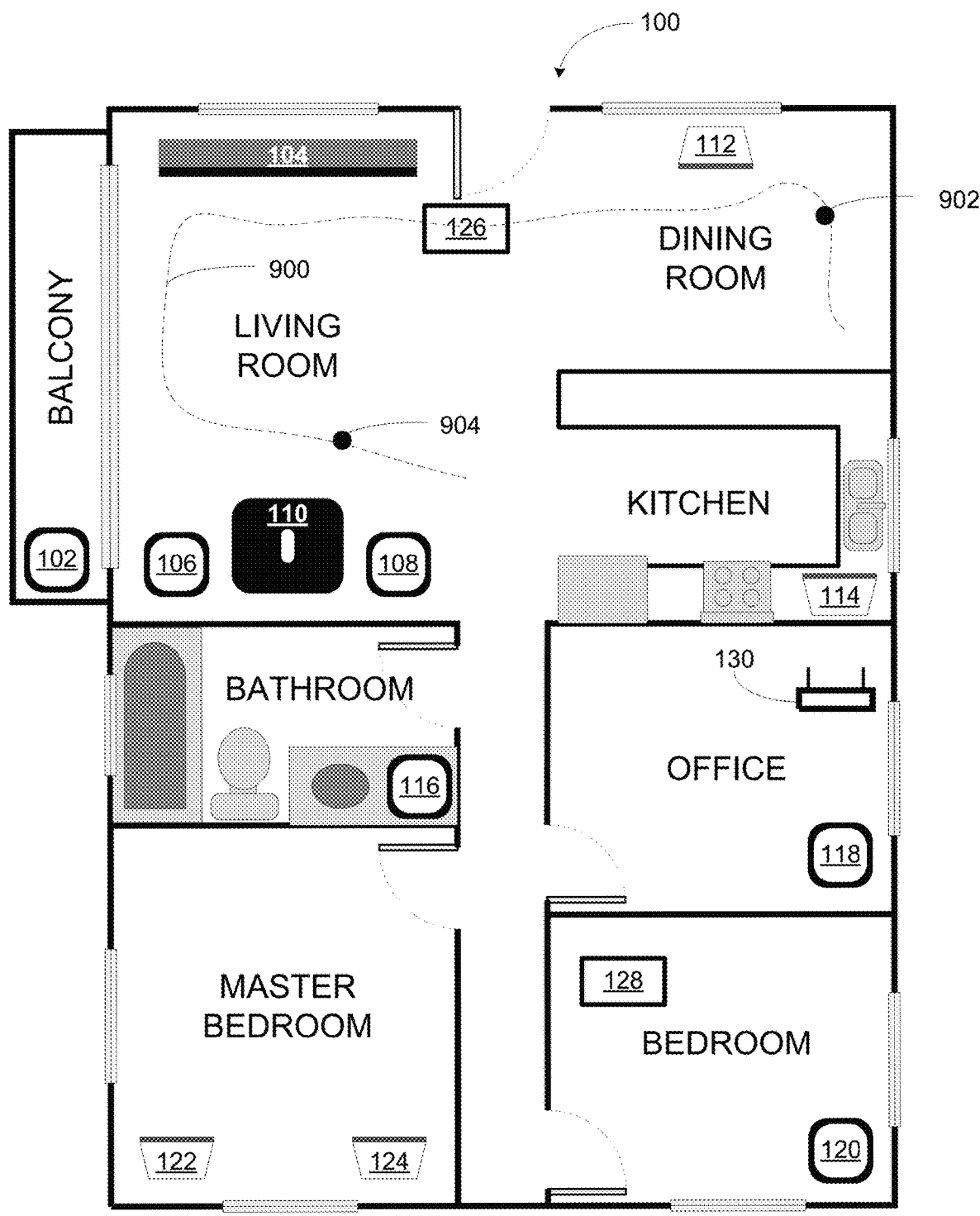
FIG. 9 illustrates example motion of a device through a listening area.

To illustrate movement of the recording device during calibration, FIG. 9 shows media playback system 100 of FIG. 1. FIG. 9 shows a path 900 along which a recording device (e.g., control device 126) might be moved during calibration. As noted above, the control device may indicate how to perform such a movement in various ways, such as by way of a video or animation, among other examples. While the path shows movement in a horizontal plane, the movement contemplated by some example calibration procedures may include vertical motion (e.g., by a user moving his arm up and down while holding the microphone).

In some embodiments, control device 126 may detect calibration signals emitted by a playback device (e.g., playback device 108) at various points along the path (e.g., point 902 and/or point 904, among others). Alternatively, the control device may record the calibration signal along the path. In some embodiments, the playback device may play a periodic calibration signal (or perhaps repeat the same calibration signal) such that the playback device records an instance of the calibration signal at different points along the paths. Comparison of such recordings may indicate how the acoustic characteristics change from one physical location in the environment to another, which influences the calibration settings chosen for the playback device in that environment.

Figure 10:
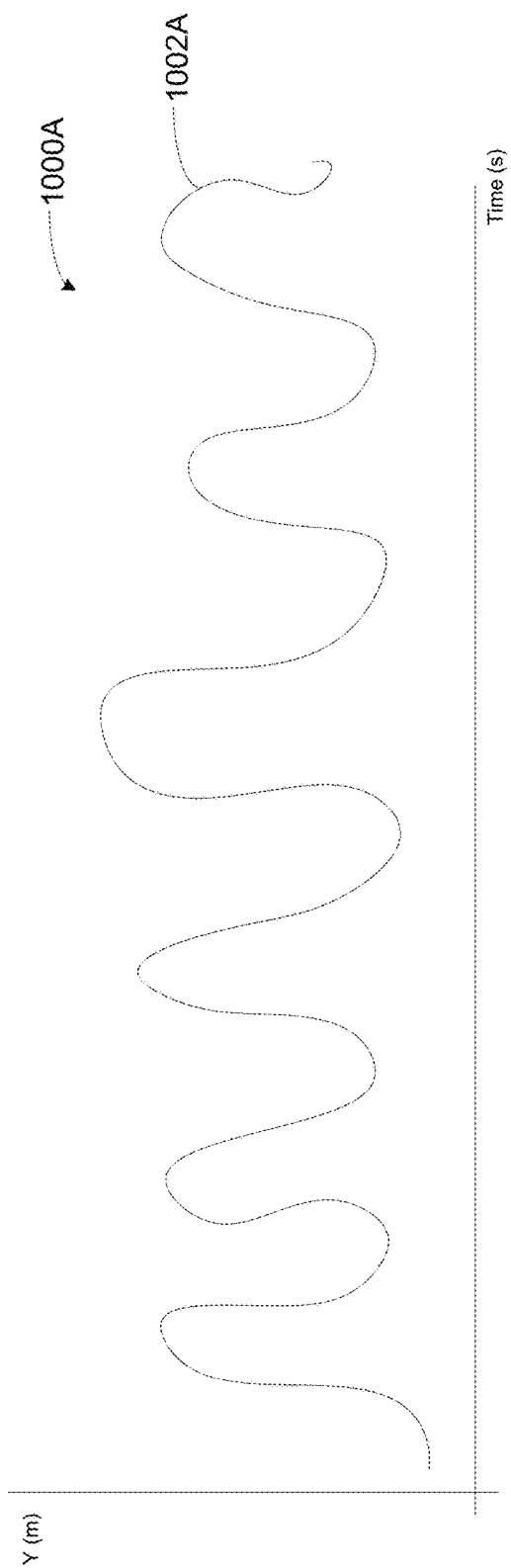
FIGS. 10A and 10B illustrate example motion data.

FIG. 10A shows a graph 1000A that includes a plot 1002A representing example vertical motion data in a first instance of an example calibration procedure. As shown, the vertical height of the microphone approximately varies sinusoidally over time, which would be consistent with a user moving the microphone upward and downwards during the first instance of the calibration procedure.

FIG. 10B shows a graph 1000B that includes a plot 1002B representing example vertical motion data in a first instance of an example calibration procedure. As shown, the vertical height of the microphone is roughly the same over time, which would be consistent with a user keeping the microphone at a consistent height during the second instance of the calibration procedure.

In some examples, the calibration sound emitted by the playback devices is periodic. For instance, a given playback device may repeatedly emit a calibration tone. Each period, or repetition, of the calibration tone may correspond to a sample representing the response of the listening area from a different position (given that the microphone is moving). In some examples, the recording device may receive samples in groups, which may be referred to as frames. Each frame may correspond to a period, or repetition, of the calibration tone such that each frame represents motion of the microphone while a given repetition of the calibration tone was detected by the microphone.

Figure 11:
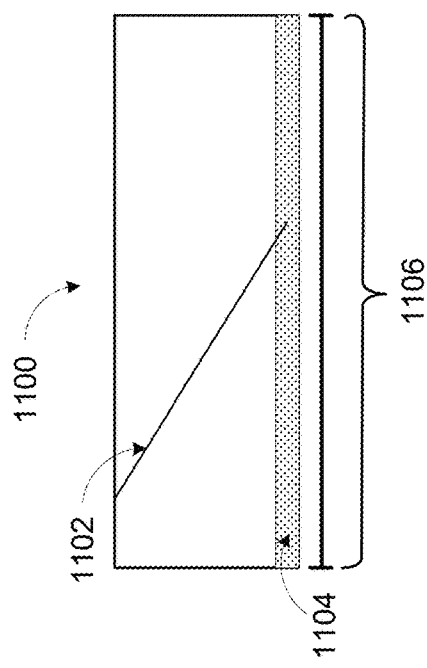
FIG. 11 shows a frame illustrating an iteration of an example periodic calibration sound.

To illustrate example repetitions of a calibration sound, FIG. 11 shows one example iteration (e.g., a period or cycle) of an example calibration sound. This iteration is represented as a frame 1100. The frame 1100 includes a swept signal component 1102 and noise component 1104. The swept signal component 1102 is shown as a downward sloping line to illustrate a swept signal that descends through frequencies of a calibration range (e.g., a range of frequencies over which the playback device is to be calibrated). The noise component 1104 is shown as a region to illustrate low-frequency noise throughout the frame 1100. As shown, the swept signal component 1102 and the noise component overlap in a transition frequency range, which may prevent unpleasant sounds caused by a sharp transition between the components. The period 1106 of the calibration sound is approximately ⅜ths of a second (e.g., in a range of ¼ to ½ second), which in some implementation is sufficient time to cover the calibration frequency range of a single channel. As the calibration sound in frame 1100 includes multiple components, it may be referred to as a hybrid calibration sound. Hybrid calibration sounds may have various advantages in covering a range of calibration frequencies.

Figure 12:
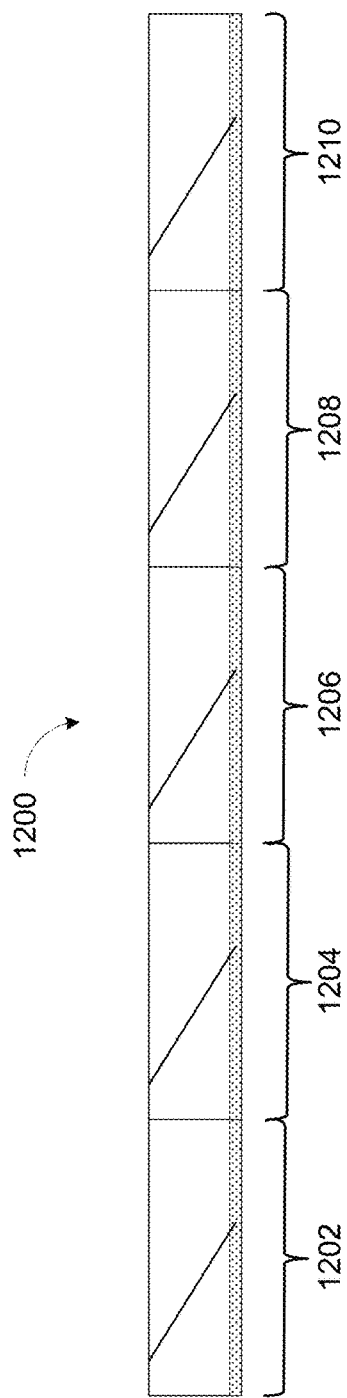
FIG. 12 shows a series of frames illustrating iterations of an example periodic calibration sound.

FIG. 12 illustrates an example periodic calibration sound 1200. Five iterations (e.g., periods) of hybrid calibration sound 1100 are represented as a frames 1202, 1204, 1206, 1208, and 1210. In each iteration, or frame, the periodic calibration sound 1200 covers a calibration frequency range using two components (e.g., a noise component and a swept signal component). During a calibration period, a recording device may record these frames of the calibration and also receive respective frames of motion data that correspond to motion occurring while frames 1202, 1204, 1206, 1208, and 1210 are emitted by the playback device and detected by the microphone. In some examples, the recording device may receive these frames of motion data as they are generated by the sensor(s). Alternatively, a device may receive a data stream of samples from a sensor, or receive the motion data after the calibration period, among other examples.

b. Validate Motion of the Microphone During Calibration Period

At block 804, the implementation 800 involves validating motion of the microphone during the calibration period. Validating motion of the microphone may involve determining whether sufficient translation of the microphone occurred during the calibration period while the playback device(s) were emitting the calibration sound. In examples, the processing device may validate translation in one or more directions (e.g., vertical, horizontal, or radial directions). The processing device may also validate motion by determining whether speed of the microphone was between threshold limits as well. Other types of motion validation are contemplated as well.

To validate vertical motion by determining that the microphone experienced sufficient vertical motion, the processing device may determine one or more vertical motion parameters that represent motion of the microphone during the calibration period. As noted above, the processing device may identify a component of the motion data in the vertical direction (e.g., the example motion data represented by plots 1002A and 1002B. Such a component may identify vertical oscillations of the microphone or perhaps linear motion in the vertical direction. The processing device may infer a constant (i.e., a vertical motion parameter) from the identified component. Such a parameter may include a mean of the motion data in a vertical direction (e.g., a root mean square (RMS) value for vertical oscillations) or a time-average for linear oscillations in the vertical direction, among other examples.

The processing device may determine that sufficient vertical translation of the control device occurred during the calibration period by determining that the vertical motion parameter exceeds a vertical-motion threshold. The vertical-motion threshold may be set to a value that corresponds to certain amount of vertical motion (i.e., motion that is determined to be sufficient for quality audio calibration data). For instance, such a threshold may be set to correspond to movement, on average, of the microphone upwards and downwards in a range of a few feet (consistent with typical human arm length) for a significant portion of the calibration period (e.g., 75% or greater). As another example, the threshold may correspond to a certain number of vertical oscillations during the calibration period. In some embodiments, the vertical-motion threshold is characteristic of vertical motion for a majority of the calibration period. The processing device may determine such a parameter for motion in other dimensions as well, such as in radial or horizontal directions.

In operation, motion parameters may be determined, and perhaps re-determined, at any of one or more points during the calibration period or after the calibration period. For example, a vertical motion parameter may be updated continuously or discretely through the calibration period. In some examples, the processing device may repeatedly update the parameter upon receiving one or more additional frames of motion data.

In some circumstances, the processing device may consider less than the entire calibration period in determining the vertical-motion parameter (and/or other parameters representing motion in other directs). For example, the processing device may begin validating the vertical motion parameter at some point partway through the calibration period (e.g., after one quarter of the calibration period has elapsed), as a user might not immediately start microphone might not immediately start moving when the playback devices begin emitting the calibration sound(s). As another example, if the processing device determines that the microphone has experienced sufficient motion in a given direction at a point partway through the calibration period, the processing device might not consider additional motion data in determining the motion parameters. As yet a further example, if a processing device determines partway through the calibration that that the motion cannot be valid, the processing device may abort the measurement.

As noted above, a processing device may determine motion parameters for motion in a radial direction, which the processing device may use to validate radial motion of a microphone relative to the playback device. Within examples, the processing device may determine a motion parameter indicating total or average change in radial distance from the microphone during the calibration period. Given that this parameter exceeds a threshold, the processing device may determine that sufficient radial motion of the microphone occurred. As indicated above, motion data indicating radial distance between the microphone and a playback device may be generated by measuring propagation delay between the playback device and the microphone.

In some examples, the processing device may validate motion in another direction (e.g., horizontal motion across the listening area) without necessarily using motion data that directly represents motion in that measurement plane. For instance, a processing device may determine motion of the recording device in a horizontal direction through the listening area using motion data indicating movement of the recording device in a vertical and radial directions. In some cases, such data may be relatively easier to obtain than motion data in the horizontal direction. However, a calibration with sufficient motion in the horizontal plane across the listening area may be relatively more useful than calibrations without such motion.

To determine one or more horizontal-motion parameters representing motion of the recording device in a horizontal direction, a processing device my cross-correlate a first component of the motion data indicating movement of the control device in a vertical direction with a second component of the motion data indicating movement of the control device in a radial direction from the one or more playback devices. Given significant motion in two directions, motion data indicating motion in the respective directions is not likely to be closely correlated. However, if there is significant motion in only one direction (or no directions at all), the motion data indicating motion in the respective directions is more likely to be closely correlated. Accordingly, relatively correlated vertical and radial motion may indicate relatively little horizontal translation. Conversely, relatively uncorrelated vertical and radial motion may indicate relatively more horizontal translation.

To validate horizontal translation by cross-correlating motion data in other dimensions, the processing device may obtain motion data suitable for cross-correlation. To illustrate, in one example, the processing device receive a continuous radial motion measurement over the calibration period (e.g., discrete samples indicating respective distances between the microphone and a playback device) and a continuous motion measurement over the calibration period (e.g., discrete samples indicating vertical movement). Alternatively, the processing device may receive measurements which overlap for at least a portion of the calibration period.

In some examples, the measurements may be prepared to facilitate cross-correlation. For instance, the measurements may be trimmed to represent the same period of time (i.e., the same motion, but in different directions). Further, the measurements may be up-sampled or down-sampled such that the number of samples in each measurement matches. Also, to further facilitate cross-correlation, the processing device may center the measurement data sets around the same value (e.g., 0), perhaps by subtracting the mean of each data set from all values in the data set. Yet further, the processing device may normalize the measurement data sets relative to one another by scaling to a particular maximum value (e.g., 1) for each data set. To account for sensor error (e.g., spikes) and other non-measurement artifacts, the data may be filtered to remove such artifacts. Alternative or additional processing may further facilitate cross-correlation.

After obtaining measurements in two dimensions (e.g., vertical and radial), the processing device may cross-correlate the two data sets to determine a correlation constant (i.e., a horizontal-motion parameter). Cross-correlation is a measure of similarity of two series (e.g., measurements) as a function of the lag of one relative to the other. A relatively high correlation constant indicates that the data sets are closely correlated. Where the data sets are motion data in respective directions, a relatively high correlation constant indicates relatively little motion in a third dimension. Conversely, a relatively low correlation constant indicates that relatively more motion in a third dimension occurred, as the data sets are not well correlated. To validate horizontal motion, the processing device may determine whether the horizontal-motion parameter exceeds a correlation threshold. The correlation threshold may be set to a value indicative of sufficient horizontal translation through the listening environment (e.g., horizontal translation for a threshold distance and/or for a threshold duration of time).

To illustrate cross-correlation, FIGS. 13A and 13B show example correlation graphs. FIG. 13A includes a plot 1300A that illustrates closely-correlated example vertical motion data 1302A and example radial motion data 1304A. In this example, a user performing the calibration process would have been standing still (or with little movement) while moving the recording device up and down vertically—thus yielding a radial displacement that varies closely with vertical motion of the recording device.

FIG. 13B includes a plot 1300B that illustrates closely-correlated example vertical motion data 1302B and example radial motion data 1304B. In this example, a user would have been walking around the listening area while moving the recording device upwards and downwards, thereby yielding a more loose correlation between vertical motion and radial displacement. In this plot, the slope of the moving average of the radial motion data 1304B is directly correlated with the horizontal translation that occurred over the calibration period.

In some cases, the processing device may receive multiple measurement measurements in one or more dimensions. In one example, multiple playback devices may be undergoing concurrent calibration which may produce multiple measurement data sets in the radial direction (e.g., one data set for each playback device relative to the microphone). The processing device may determine respective horizontal-motion parameters (e.g., correlation constants) for the multiple data sets by cross-correlating data in a first measurement plane (e.g., vertical) with the multiple data sets in the second measurement plane (e.g., radial). To determine whether sufficient horizontal translation across the listening area occurred, The processing device may compare the horizontal-motion parameters to the threshold, the processing device may compare the horizontal-motion parameters to a horizontal-motion correlation threshold.

Validating motion of the microphone may involve validating speed of the microphone during the calibration period. Excessive speed may interfere with the calibration possibly by creating Doppler-shift in the detected calibration sounds, which may cause overlap between respective iterations of a calibration tone. To validate speed, the processing device may determine that the motion data indicates that speed of the control device during the calibration period did not exceed a speed threshold (e.g., a particular meters per second limit). Further, movement that is too slow may also lead to a less than ideal calibration, as such slow speed may contribute to insufficient translation and/or lead to samples that represent the same physical location.

To illustrate, as noted above, a processing device may receive motion data indicating acceleration of the microphone during the calibration period. Given that the acceleration indicates movement relative to the environment, the processing device may integrate that acceleration to determine velocity, which may then be converted to scalar speed. However, given that certain sensors are coupled to the microphone, the acceleration detected by such sensors might not indicate motion through the environment directly. But, such acceleration data may be used to determine speed through the listening area.

In one example, the processing device may receive sensor data that includes multiple data streams indicating acceleration. For instance, the processing device may receive a first data stream indicating user acceleration relative to the control device and a second data stream indicating gravity acceleration relative to the control device. To determine user acceleration relative to gravity, the processing device may determine a product (e.g., a dot product) of the first data stream and the second data stream. Such a computation produces a third data stream indicating user acceleration relative to gravity. To facilitate determining speed of the microphone during the calibration, the processing device may determine the integral of the third data stream to produce a fourth data stream indicating the three-dimensional velocity of the microphone.

To validate speed, the processing device may convert the fourth data stream to the speed scalar. Such conversion may involve the processing device computing respective magnitudes of the samples indicating the three-dimensional velocity of the microphone to yield a fifth data stream indicating the scalar speed of the microphone during the calibration period. The processing device may then validate speed during the calibration period by determining that the speed data points do not exceed a speed threshold (or did not exceed the speed threshold for more than a threshold duration of time).

c. Send Message Indicating that Motion of Microphone During Calibration Period was Valid In FIG. 8, at block 806, implementation 800 involves sending a message indicating that motion of the microphone during the calibration period was valid. For instance, the recording device may send a message to the one or more playback devices under calibration indicating that the calibration was valid. Such a message may indicate that sufficient translation of the control device occurred during the calibration period, that sufficient vertical translation of the control device occurred during the calibration period, that sufficient radial translation of the control device occurred during the calibration period, and/or that the sufficient translation of the control device did not exceed the speed threshold, among other examples.

After the playback device emits the calibration sound during the calibration interval, the recordings of the calibration sounds may be analyzed to determine calibration settings for the playback device. In some embodiments, the recording device may analyze the calibration sounds itself. Alternatively, the recording device may transmit the recordings (or a portion thereof) to another computing system (perhaps a computing system with more processing power, such as a personal computer or server (e.g., a server involved in providing a cloud computing service)). During the analysis, the recording device (or the other computing system) may determine a calibration profile for the playback device. When applied to a playback device, such a calibration profile may offset certain acoustic characteristics of the environment to calibrate the playback device to a desired equalization (e.g., a flat response) or perhaps the flat response adjusted by a desired equalization (e.g., an equalization for a certain type of music).

Some examples techniques for analyzing such recordings are described in U.S. patent application Ser. No. 13/536,493 filed Jun. 28, 2012, entitled "System and Method for Device Playback Calibration," U.S. patent application Ser. No. 14/216,306 filed Mar. 17, 2014, entitled "Audio Settings Based On Environment," and U.S. patent application Ser. No. 14/481,511 filed Sep. 9, 2014, entitled "Playback Device Calibration," which are incorporated herein in their entirety. In some examples, sending the message indicating that sufficient translation of the control device occurred during the calibration period may involve sending a message instructing a playback device to calibrate using the determined calibration profile. By sending such a calibration profile, the device may indicate that the calibration was successful (and that the motion used to determine the calibration was valid as well). In some cases, wherein motion was not validated, a calibration might not be sent to the playback device.

Figure 14:
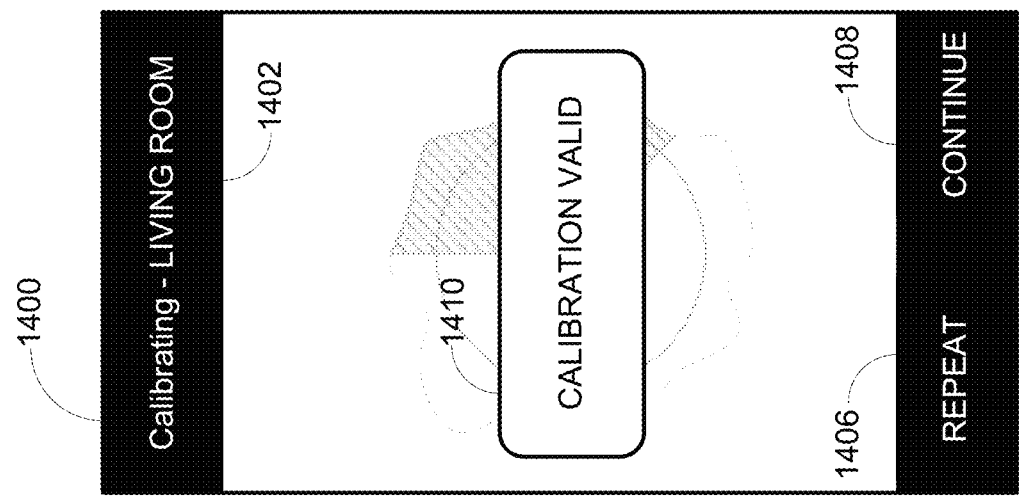
FIG. 14 shows an illustrative playback device calibration user interface.

In some case, a device (e.g., the recording device) may indicate the status of motion validation on a graphical interface. FIG. 14 shows an illustrative playback device calibration user interface 1400 that might be displayed on the graphical interface when motion of the microphone has been validated. As shown, the user interface 1400 includes a graphical representation 1402 indicating that the displayed content on the interface 1400 corresponds to one or more playback devices in a LIVING ROOM zone (e.g., the Living Room zone of media playback system 100).

The user interface 1400 further includes a graphical representation 1410 that may include a message describing an identified error condition and/or suggestions for remedying the error condition. The user interface 1400 further includes selectable icons 1406 and 1408. Selectable icon 1406 may be selected to repeat the calibration process again, and selectable icon 1408 may be selected to continue operation of the one or more playback devices. As shown, the graphical representation 1410 may overlay a grayed or dimmed version of some or all of the graphical representation 604 of the user interface 600 of FIG. 6.

D. Display Prompt to Correct Motion

Returning to FIG. 8, at block 808, the implementation 800 involves displaying a prompt to correct motion. For instance, the recording device may display a prompt to repeat all or part of the calibration. The recording device may also indicate how the motion was insufficient and perhaps how motion can be corrected (e.g., by moving more in a given plane or at a different speed). Such a prompt may indicate that sufficient translation of the control device did not occur during the calibration period, that sufficient vertical translation of the control device did not occur during the calibration period, that sufficient radial translation of the control device did not occur during the calibration period, and/or that the sufficient translation of the control device exceeded the speed threshold, among other examples.

Figure 15:
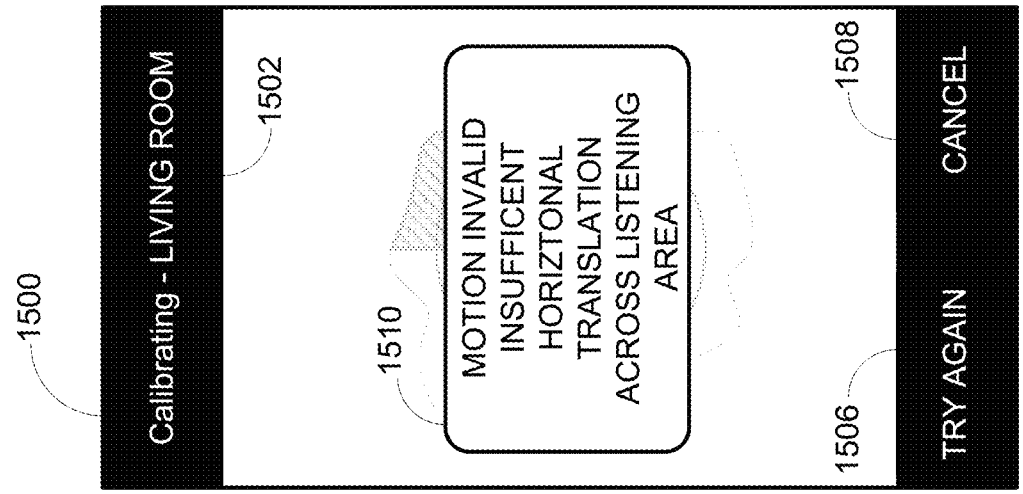
FIG. 15 shows another illustrative playback device calibration user interface.

FIG. 15 shows an illustrative playback device calibration error condition user interface 1500 that may be displayed on the graphical interface when motion has not been validated. As shown, the user interface 1500 includes a graphical representation 1502 indicating that the displayed content on the interface 1500 corresponds to the one or more playback devices in the LIVING ROOM zone.

The user interface 1500 further includes a graphical representation 1510 that may include a message describing an identified error condition and/or a prompt to remedy the error condition. The user interface 1500 further includes selectable icons 1506 and 1508. Selectable icon 1506 may be selected to try the calibration process again, and selectable icon 1508 may be selected to terminate the calibration process. As shown, the graphical representation 1510 may overlay a grayed or dimmed version of some or all of the graphical representation 604 of the user interface 600 of FIG. 6.

In one example, each type of motion (e.g. motion and or speed in various directions) may have a corresponding textual message to be provided in the graphical representation 1510. For instance, if the identified error condition relates to movement in the horizontal plane, an example textual message may be "To get a good measurement, make sure you're slowly moving your device up and down and walking all throughout your room. Please try again with more movement across your listening area." In another instance, if the identified error condition relates to excessively fast movement, an example textual message may be "You were moving a little too quickly to get a good measurement for tuning. Please try again, but move more slowly this time."

The example textual messages discussed herein are for illustrative purposes only and are not meant to be limiting. Further, one having ordinary skill in the art will appreciate that other examples are also possible.

VI. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

(Feature 1) A network device including a microphone configured for receiving an indication that one or more playback devices are emitting a calibration sound in a given environment during a calibration period, recording the emitted calibration sound and receiving motion data indicating movement of the network device during emission of the calibration sound, identifying a first component of the motion data that indicates movement of the network device in a vertical direction and one or more second components of the motion data that indicates movement of the network device in respective radial directions from the one or more playback devices, determining one or more horizontal-motion parameters representing motion of the network device in a horizontal direction through the environment by cross-correlating the first component of the motion data indicating movement of the network device in a vertical direction with the one or more second components of the motion data indicating movement of the network device in respective radial directions from the one or more playback devices, determining that sufficient horizontal translation of the network device occurred during the calibration period by determining that at least one of the horizontal motion parameters representing motion in the horizontal direction through the environment exceeds a correlation threshold, and sending a message indicating that sufficient translation of the network device occurred during the calibration period.

(Feature 2) The network device of feature 1, further configured for determining a vertical motion parameter representing a mean of the motion data in a vertical direction; and determining that sufficient vertical translation of the network device occurred during the calibration period by determining that the vertical motion parameter exceeds a vertical-motion threshold.

(Feature 3) The network device of feature 1 in combination with feature 2, wherein sending the message indicating that sufficient translation of the network device occurred during the calibration period comprising sending a message indicating that sufficient horizontal translation and sufficient vertical translation of the network device occurred during the calibration period.

(Feature 4) The network device of feature 1 or feature 3 in combination with feature 2, wherein determining the vertical motion parameter representing the mean of the motion data in the vertical direction comprises, repeatedly updating the vertical motion parameter representing the mean of the motion data in the vertical direction based on the accrued motion data as frames of motion data indicating movement of the network device during the calibration period are received.

(Feature 5) The network device of any of features 1-4, wherein receiving motion data indicating movement of the network device during the calibration period comprises receiving sensor data indicating acceleration of the network device, and receiving microphone data indicating respective radial distances from the one or more playback devices to the network device based on respective propagation delays between the one or more playback devices and a microphone coupled to the network device.

(Feature 6) The network device of any of features 1-5, further configured for determining respective calibration profiles for at least one of the one or more playback devices based on the recorded calibration sound, and wherein sending the message indicating that sufficient translation of the network device occurred during the calibration period comprises sending a message instructing the at least one playback device to calibrate using the determined calibration profile.

(Feature 7) The network device of any of features 1-5 in combination with FIG. 6, wherein determining respective calibration profiles for at least one of the one or more playback devices based on the recorded calibration sound comprises determining respective calibration profiles that offset acoustic characteristics of the given environment to calibrate the playback devices to a calibration equalization.

(Feature 8) The network device of any of features 1-7, further configured for determining that speed of the network device during the calibration period did not exceed a speed threshold, and wherein sending the message indicating that sufficient translation of the network device occurred during the calibration period comprises sending a message indicating that the sufficient translation of the network device did not exceed the speed threshold.

(Feature 9) The network device of any of features 1-7 in combination with feature 8, wherein receiving motion data indicating movement of the network device during the calibration period comprises receiving sensor data including a first data stream indicating user acceleration relative to the network device and a second data stream indicating gravity acceleration relative to the network device, and wherein determining that speed of the network device during the calibration period did not exceed a speed threshold comprises determining a third data stream indicating user acceleration relative to gravity based on the first data stream indicating user acceleration relative to the network device and the second data streaming indicating gravity acceleration relative to the network device, determining a fourth data stream indicating speed of the network device during the calibration period by determining a magnitude of an integral of the third data stream indicating user acceleration relative to gravity, and determining that the fourth data stream indicates that speed of the network device during the calibration period did not exceed the speed threshold.

(Feature 10) A method comprising receiving, by a computing device, motion data indicating movement of a recording device while the recording device was recording a calibration sound emitted by one or more playback devices in a given environment during a calibration period, determining, by the computing device, that sufficient vertical translation of the recording device occurred during the calibration period, determining, by the computing device, that sufficient horizontal translation of the recording device occurred during the calibration period, and sending, by the computing device to one or more playback devices, a message indicating that sufficient translation of the recording device occurred during the calibration period in vertical and horizontal directions.

(Feature 11) The method of feature 10, wherein determining that sufficient horizontal translation of the recording device occurred during the calibration period comprises identifying a first component of the motion data that indicates movement of the recording device in a vertical direction and one or more second components of the motion data that indicates movement of the recording device in respective radial directions from the one or more playback devices, determining one or more horizontal-motion parameters representing motion of the recording device in a horizontal direction through the environment by cross-correlating the first component of the motion data indicating movement of the recording device in a vertical direction with the one or more second components of the motion data indicating movement of the recording device in respective radial directions from the one or more playback devices, and determining that sufficient horizontal translation of the recording device occurred during the calibration period by determining that at least one of the horizontal motion parameters representing motion in the horizontal direction through the environment exceeds a correlation threshold.

(Feature 12) The method of feature 10 or 11, wherein determining that sufficient vertical translation of the recording device occurred during the calibration period comprises determining a vertical motion parameter representing a mean of the motion data in a vertical direction, and determining that sufficient vertical translation of the recording device occurred during the calibration period by determining the vertical motion parameter exceeds a vertical-motion threshold.

(Feature 13) The method of feature 10 or 11 in combination with feature 12, wherein determining the vertical motion parameter representing the mean of the motion data in the vertical direction comprises repeatedly updating the vertical motion parameter representing the mean of the motion data in the vertical direction based on the accrued motion data as motion data indicating movement of the recording device during the calibration period is received.

(Feature 14) The method of any of features 10-14, further comprising determining that speed of the recording device during the calibration period did not exceed a speed threshold, wherein sending the message indicating that sufficient translation of the recording device occurred during the calibration period comprises sending a message indicating that the sufficient translation of the recording device did not exceed the speed threshold.

(Feature 15) The method of any of features 10-13 in combination with feature 14, wherein receiving motion data indicating movement of a recording device while the recording device detected a calibration sound emitted by one or more playback devices in a given environment during a calibration period comprises receiving sensor data including a first data stream indicating user acceleration relative to the recording device and a second data stream indicating gravity acceleration relative to the recording device, and wherein determining that speed of the recording device during the calibration period did not exceed a speed threshold comprises determining a third data stream indicating user acceleration relative to gravity based on the first data stream indicating user acceleration relative to the recording device and the second data streaming indicating gravity acceleration relative to the recording device, determining a fourth data stream indicating speed of the recording device during the calibration period by determining a magnitude of an integral of the third data stream indicating user acceleration relative to gravity, and determining that the fourth data stream indicates that speed of the recording device during the calibration period did not exceed the speed threshold.

(Feature 16) The method of any of features 10-15, further comprising determining respective calibration profiles for at least one of the one or more playback devices based on the recorded calibration sound, and wherein sending the message indicating that sufficient translation of the recording device occurred during the calibration period comprises sending a message instructing the at least one playback device to calibrate using the determined calibration profile.

(Feature 17) The method of any of features 10-16, wherein the computing device comprises the recording device.

(Feature 18) A computer readable medium configured for performing the method of any of features 10 to 17.

We claim:

1. A tangible, non-transitory, computer-readable medium having stored therein instructions executable by one or more processors of a mobile device to perform functions comprising:
    detecting, via one or more microphones of the mobile device, audio signals emitted from one or more playback devices as part of a calibration process of one or more playback devices;
    after the one or more playback devices emit the audio signals as part of the calibration process of the one or more playback devices, determining whether the detected audio signals indicate that sufficient horizontal translation of the mobile device occurred while the one or more playback devices emitted the audio signals during the calibration process;
    when the detected audio signals indicate that insufficient horizontal translation of the mobile device occurred during the calibration process, displaying, via a graphical display, a prompt to move the mobile device more while the one or more playback devices emit one or more additional audio signals as part of the calibration process of the one or more playback devices; and
    when the detected audio signals indicate that sufficient horizontal translation of the mobile device occurred during the calibration process, calibrating the one or more playback devices with a calibration based on the detected audio signals emitted from the one or more playback devices.

2. The tangible, non-transitory, computer-readable medium of claim 1, wherein detecting the audio signals emitted from one or more playback devices as part of the calibration process of the one or more playback devices comprises detecting multiple iterations of the audio signals emitted from one or more playback devices as part of the calibration process of the one or more playback devices, and wherein determining whether the detected audio signals indicate that sufficient horizontal translation of the mobile device occurred during the calibration process comprises determining whether variation between the multiple iterations of the audio signals indicates that sufficient horizontal translation of the mobile device occurred during the calibration process.

3. The tangible, non-transitory, computer-readable medium of claim 2, wherein the functions further comprise:
    determining respective radial distances from the one or more playback devices to the mobile device based on respective propagation delays between the one or more playback devices and the one or more microphones in the multiple iterations of the audio signals, and wherein determining whether variation between the multiple iterations of the audio signals indicates that sufficient horizontal translation of the mobile device occurred during the calibration process comprises determining whether variation among the respective propagation delays indicates that sufficient horizontal translation of the mobile device occurred during the calibration process.

4. The tangible, non-transitory, computer-readable medium of claim 1, wherein the functions further comprise:
    while the one or more playback devices emit the audio signals as part of the calibration process of the one or more playback devices: (i) receiving, via one or more sensors, one or more streams of motion data indicating movement of the mobile device, and (ii) determining whether the received streamed of motion data indicates that sufficient translation of the mobile device occurred during the calibration process;
    when the one or more received streams of motion data indicate that insufficient translation of the mobile device occurred during the calibration process, (i) causing the one or more playback devices to stop emitting the audio signals as part of the calibration process and (ii) displaying, via the graphical display, a prompt to repeat at least a portion of the calibration process; and
    when the one or more received streams of motion data indicate that sufficient translation of the mobile device occurred during the calibration process, continuing to detect, via the one or more microphones of the mobile device, the audio signals emitted from one or more playback devices as part of the calibration process of the one or more playback devices.

5. The tangible, non-transitory, computer-readable medium of claim 4, wherein receiving the one or more streams of motion data indicating movement of the mobile device comprises:
    receiving, via at least one sensor of the one or more sensors, a stream of sensor data indicating acceleration of the mobile device.

6. The tangible, non-transitory, computer-readable medium of claim 1, wherein the one or more additional audio signals are substantially similar to the one or more audio signals.

7. The tangible, non-transitory, computer-readable medium of claim 1, wherein calibrating the one or more playback devices with the calibration based on the detected audio signals emitted from the one or more playback devices comprises:
    determining a response curve based the detected audio signals emitted from the one or more playback devices, the response curve representing acoustic characteristics of a system comprising the one or more playback devices and surrounding environment;
    determining one or more calibration parameters based on a difference between the determined response curve and a target response curve; and
    applying the determined calibration parameters during playback of audio content by the one or more playback devices, wherein the applied calibration parameters at least partially offset acoustic characteristics of the surrounding environment.

8. A method to be performed by a mobile device, the method comprising:
    detecting, via one or more microphones of the mobile device, audio signals emitted from one or more playback devices as part of a calibration process of one or more playback devices;
    after the one or more playback devices emit the audio signals as part of the calibration process of the one or more playback devices, determining whether the detected audio signals indicate that sufficient horizontal translation of the mobile device occurred while the one or more playback devices emitted the audio signals during the calibration process;

when the detected audio signals indicate that insufficient horizontal translation of the mobile device occurred during the calibration process, displaying, via a graphical display, a prompt to move the mobile device more while the one or more playback devices emit one or more additional audio signals as part of the calibration process of the one or more playback devices; and when the detected audio signals indicate that sufficient horizontal translation of the mobile device occurred during the calibration process, calibrating the one or more playback devices with a calibration based on the detected audio signals emitted from the one or more playback devices.

9. The method of claim 8, wherein detecting the audio signals emitted from one or more playback devices as part of the calibration process of the one or more playback devices comprises detecting multiple iterations of the audio signals emitted from one or more playback devices as part of the calibration process of the one or more playback devices, and wherein determining whether the detected audio signals indicate that sufficient horizontal translation of the mobile device occurred during the calibration process comprises determining whether variation between the multiple iterations of the audio signals indicates that sufficient horizontal translation of the mobile device occurred during the calibration process.

10. The method of claim 9, wherein the method further comprises:

determining respective radial distances from the one or more playback devices to the mobile device based on respective propagation delays between the one or more playback devices and the one or more microphones in the multiple iterations of the audio signals, and wherein determining whether variation between the multiple iterations of the audio signals indicates that sufficient horizontal translation of the mobile device occurred during the calibration process comprises determining whether variation among the respective propagation delays indicates that sufficient horizontal translation of the mobile device occurred during the calibration process.

11. The method of claim 8, wherein the method further comprises:

while the one or more playback devices emit the audio signals as part of the calibration process of the one or more playback devices: (i) receiving, via one or more sensors, one or more streams of motion data indicating movement of the mobile device, and (ii) determining whether the received streamed of motion data indicates that sufficient translation of the mobile device occurred during the calibration process;

when the one or more received streams of motion data indicate that insufficient translation of the mobile device occurred during the calibration process, (i) causing the one or more playback devices to stop emitting the audio signals as part of the calibration process and (ii) displaying, via the graphical display, a prompt to repeat at least a portion of the calibration process; and when the one or more received streams of motion data indicate that sufficient translation of the mobile device occurred during the calibration process, continuing to detect, via the one or more microphones of the mobile device, the audio signals emitted from one or more playback devices as part of the calibration process of the one or more playback devices.

12. The method of claim 11, wherein receiving the one or more streams of motion data indicating movement of the mobile device comprises:

receiving, via at least one sensor of the one or more sensors, a stream of sensor data indicating acceleration of the mobile device.

13. The method of claim 8, wherein the one or more additional audio signals are substantially similar to the one or more audio signals.

14. The method of claim 8, wherein calibrating the one or more playback devices with the calibration based on the detected audio signals emitted from the one or more playback devices comprises:

determining a response curve based the detected audio signals emitted from the one or more playback devices, the response curve representing acoustic characteristics of a system comprising the one or more playback devices and surrounding environment;

determining one or more calibration parameters based on a difference between the determined response curve and a target response curve; and applying the determined calibration parameters during playback of audio content by the one or more playback devices, wherein the applied calibration parameters at least partially offset acoustic characteristics of the surrounding environment.

15. A mobile device comprising:

one or more microphones;

one or more processors; and data storage having stored therein instructions executable by the one or more processors to cause the mobile device to perform functions comprising:

detecting, via the one or more microphones, audio signals emitted from one or more playback devices as part of a calibration process of one or more playback devices;

after the one or more playback devices emit the audio signals as part of the calibration process of the one or more playback devices, determining whether the detected audio signals indicate that sufficient horizontal translation of the mobile device occurred while the one or more playback devices emitted the audio signals during the calibration process;

when the detected audio signals indicate that insufficient horizontal translation of the mobile device occurred during the calibration process, displaying, via a graphical display, a prompt to move the mobile device more while the one or more playback devices emit one or more additional audio signals as part of the calibration process of the one or more playback devices; and when the detected audio signals indicate that sufficient horizontal translation of the mobile device occurred during the calibration process, calibrating the one or more playback devices with a calibration based on the detected audio signals emitted from the one or more playback devices.

16. The mobile device of claim 15, wherein detecting the audio signals emitted from one or more playback devices as part of the calibration process of the one or more playback devices comprises detecting multiple iterations of the audio signals emitted from one or more playback devices as part of the calibration process of the one or more playback devices, and wherein determining whether the detected audio signals indicate that sufficient horizontal translation of the mobile device occurred during the calibration process comprises determining whether variation between the multiple iterations of the audio signals indicates that sufficient horizontal translation of the mobile device occurred during the calibration process.

17. The mobile device of claim 16, wherein the functions further comprise:
   determining respective radial distances from the one or more playback devices to the mobile device based on respective propagation delays between the one or more playback devices and the one or more microphones in the multiple iterations of the audio signals, and wherein determining whether variation between the multiple iterations of the audio signals indicates that sufficient horizontal translation of the mobile device occurred during the calibration process comprises determining whether variation among the respective propagation delays indicates that sufficient horizontal translation of the mobile device occurred during the calibration process.

18. The mobile device of claim 15, wherein the functions further comprise:
   while the one or more playback devices emit the audio signals as part of the calibration process of the one or more playback devices: (i) receiving, via one or more sensors, one or more streams of motion data indicating movement of the mobile device, and (ii) determining whether the received streamed of motion data indicates that sufficient translation of the mobile device occurred during the calibration process;
   when the one or more received streams of motion data indicate that insufficient translation of the mobile device occurred during the calibration process, (i) causing the one or more playback devices to stop emitting the audio signals as part of the calibration process and (ii) displaying, via the graphical display, a prompt to repeat at least a portion of the calibration process; and
   when the one or more received streams of motion data indicate that sufficient translation of the mobile device occurred during the calibration process, continuing to detect, via the one or more microphones of the mobile device, the audio signals emitted from one or more playback devices as part of the calibration process of the one or more playback devices.

19. The mobile device of claim 18, wherein receiving the one or more streams of motion data indicating movement of the mobile device comprises:
   receiving, via at least one sensor of the one or more sensors, a stream of sensor data indicating acceleration of the mobile device.

20. The mobile device of claim 15, wherein the one or more additional audio signals are substantially similar to the one or more audio signals.

* * * * *

UNITED STATES PATENT AND TRADEMARK OFFICE
CERTIFICATE OF CORRECTION

PATENT NO. : 11,197,112 B2
APPLICATION NO. : 16/570679
DATED : December 7, 2021
INVENTOR(S) : Jonathan Downing, Timothy Sheen and Daniel Valente It is certified that error appears in the above-identified patent and that said Letters Patent is hereby corrected as shown below:

On the Title Page

Item (63) "Related U.S. Application Data," please replace the text "Continuation of application No. 15/480,265, filed on Apr. 5, 2017, now Pat. No. 9,992,597" with "Continuation of application No. 15/996,878, filed on June 4, 2018, now Pat. No. 10,419,864"

Signed and Sealed this
Twenty-second Day of November, 2022

Katherine Kelly Vidal
*Director of the United States Patent and Trademark Office*